United States Patent [19]
Behrens et al.

[11] Patent Number: 5,892,632
[45] Date of Patent: Apr. 6, 1999

[54] SAMPLED AMPLITUDE READ CHANNEL EMPLOYING A RESIDUE NUMBER SYSTEM FIR FILTER IN AN ADAPTIVE EQUALIZER AND IN INTERPOLATED TIMING RECOVERY

[75] Inventors: Richard T. Behrens, Louisville, Colo.; David R. Welland, Austin, Tex.; Trent O. Dudley, Littleton; Mark S. Spurbeck, Louisville, both of Colo.

[73] Assignee: Cirrus Logic, Inc., Fremont, Calif.

[21] Appl. No.: 751,883

[22] Filed: Nov. 18, 1996

[51] Int. Cl.$^6$ .................................................. G11B 5/09
[52] U.S. Cl. ........................... 360/51; 364/746; 360/5.1
[58] Field of Search ..................... 360/51, 65; 364/746, 364/746.1

[56] References Cited

U.S. PATENT DOCUMENTS

| | | |
|---|---|---|
| 4,598,266 | 7/1986 | Bernardson . |
| 4,816,805 | 3/1989 | Vojir et al. . |
| 4,862,402 | 8/1989 | Shah et al. . |
| 4,949,294 | 8/1990 | Wambergue . |
| 5,008,668 | 4/1991 | Takayama et al. . |
| 5,050,120 | 9/1991 | Houk . |
| 5,060,088 | 10/1991 | Dolivo et al. . |
| 5,107,451 | 4/1992 | Houk . |
| 5,117,383 | 5/1992 | Fujita et al. ........................... 364/746 |
| 5,150,379 | 9/1992 | Baugh et al. . |
| 5,189,420 | 2/1993 | Eddy et al. . |
| 5,313,412 | 5/1994 | Nukui . |
| 5,319,674 | 6/1994 | Cherubini . |
| 5,361,221 | 11/1994 | Fujita . |
| 5,481,568 | 1/1996 | Yada . |
| 5,487,085 | 1/1996 | Wong-Lam et al. . |
| 5,590,154 | 12/1996 | Forni et al. . |
| 5,617,573 | 4/1997 | Huang et al. ........................... 395/376 |
| 5,696,639 | 12/1997 | Spurbeck et al. ........................ 360/5.1 |

OTHER PUBLICATIONS

U.S. application No. 08/640,410, Behrens et al., filed Apr. 30, 1996.

Simon Haykin—Adaptive Filter Theory, Prentice–Hall, pp. 383–385, 1986.

Jenkins, Leon, "The Use of Residue Number System in the Design of Finite Impulse Response Digital Filters," IEEE Transactions on Circuits and Systems, vol. CAS–24, No. 4, pp. 191–201, Apr. 1977.

Soderstrand, Escott, "VLSI Implementation in Multiple-Valued Logic of an FIR Digital Filter Using Residue Number System Arithmetic," IEEE Transactions on Circuits and Systems, vol. CAS–33, No. 1, pp. 5–25, Jan. 1986.

*Primary Examiner*—Aristotelis M. Psitos
*Assistant Examiner*—Joseph M Vann
*Attorney, Agent, or Firm*—Howard H. Sheerin; Dan A. Shifrin

[57] ABSTRACT

A sampled amplitude read channel is disclosed for disk storage systems which asynchronously samples an analog read signal, adaptively equalizes the resulting discrete time sample values according to a target partial response, extracts synchronous sample values through interpolated timing recovery, and detects digital data from the synchronous sample values using a Viterbi sequence detector. To increase the speed of the read channel, the FIR filters in the equalizer and interpolator are implemented according to a residue number system. Further, the residue number system implementation of the FIR filters uses "one-hot" encoding to decrease power dissipation.

16 Claims, 39 Drawing Sheets

$$Y(x) = \sum_{i=1}^{L} f(i, \tau) \sum_{n=1}^{N} G_i(n) \cdot U(x-n)$$

$X_3$ ADDITION $X_3$ SUBTRACTION

ADD THE NATURAL NUMBER 10

SUBTRACT THE NATURAL NUMBER 10

BINARY TO RNS

BINARY TO RNS
FOR $X_3$ AND $X_5$

BINARY TO RNS

SAMPLED AMPLITUDE READ CHANNEL EMPLOYING A RESIDUE NUMBER SYSTEM FIR FILTER IN AN ADAPTIVE EQUALIZER AND IN INTERPOLATED TIMING RECOVERY

FIELD OF INVENTION

The present invention relates to the control of disc storage systems for digital computers, particularly to a sampled amplitude read channel that employs residue number system (RNS) FIR filters to significantly increase speed and power efficiency.

CROSS REFERENCE TO RELATED APPLICATIONS AND PATENTS

This application is related to other co-pending U.S. patent applications, namely application Ser. No. 08/640,351 entitled "Adaptive Equalization and Interpolated Timing Recovery in a Sampled Amplitude Read Channel for Magnetic Recording."

BACKGROUND OF THE INVENTION

Computer storage systems (such as optical, magnetic, and the like) record digital data onto the surface of a storage medium, which is typically in the form of a rotating magnetic or optical disc, by altering a surface characteristic of the disc. The digital data serves to modulate the operation of a write transducer (write head) which records binary sequences onto the disc in radially concentric or spiral tracks. In magnetic recording systems, for example, the digital data modulates the current in a write coil in order to record a series of magnetic flux transitions onto the surface of a magnetizable disc. And in optical recording systems, for example, the digital data may modulate the intensity of a laser beam in order to record a series of "pits" onto the surface of an optical disc. When reading this recorded data, a read transducer (read head), positioned in close proximity to the rotating disc, detects the alterations on the medium and generates a sequence of corresponding pulses in an analog read signal. These pulses are then detected and decoded by read channel circuitry in order to reproduce the digital sequence.

Detecting and decoding the pulses into a digital sequence can be performed by a simple peak detector in a conventional analog read channel or, as in more recent designs, by a discrete time sequence detector in a sampled amplitude read channel. Discrete time sequence detectors are preferred over simple analog pulse detectors because they compensate for intersymbol interference (ISI) and are less susceptible to channel noise. Consequently, discrete time sequence detectors increase the capacity and reliability of the storage system. There are several well known discrete time sequence detection methods including discrete time pulse detection (DPD), partial response (PR) with Viterbi detection, maximum likelihood sequence detection (MLSD), decision-feedback equalization (DFE), enhanced decision-feedback equalization (EDFE), and fixed-delay tree-search with decision-feedback (FDTS/DF).

In conventional peak detection schemes, analog circuitry, responsive to threshold crossing or derivative information, detects peaks in the continuous time analog signal generated by the read head. The analog read signal is "segmented" into bit cell periods and interpreted during these segments of time. The presence of a peak during the bit cell period is detected as a "1" bit, whereas the absence of a peak is detected as a "0" bit. The most common errors in detection occur when the bit cells are not correctly aligned with the analog pulse data. Timing recovery, then, adjusts the bit cell periods so that the peaks occur in the center of the bit cells on average in order to minimize detection errors. Since timing information is derived only when peaks are detected, the input data stream is normally run length limited (RLL) to limit the number of consecutive "0" bits.

As the pulses are packed closer together on the concentric data tracks in the effort to increase data density, detection errors can also occur due to intersymbol interference, a distortion in the read signal caused by closely spaced overlapping pulses. This interference can cause a peak to shift out of its bit cell, or its magnitude to decrease, resulting in a detection error. The ISI effect is reduced by decreasing the data density or by employing an encoding scheme that ensures a minimum number of "0" bits occur between "1" bits. For example, a (d,k) run length limited (RLL) code constrains to d the minimum number of "0" bits between "1" bits, and to k the maximum number of consecutive "0" bits. A typical (1,7) RLL 2/3 rate code encodes 8 bit data words into 12 bit codewords to satisfy the (1,7) constraint.

Sampled amplitude detection, such as partial response (PR) with Viterbi detection, allows for increased data density by compensating for intersymbol interference and the effect of channel noise. Unlike conventional peak detection systems, sampled amplitude recording detects digital data by interpreting, at discrete time instances, the actual value of the pulse data. To this end, the read channel comprises a sampling device for sampling the analog read signal, and a timing recovery circuit for synchronizing the samples to the baud rate (code bit rate). Before sampling the pulses, a variable gain amplifier adjusts the read signal's amplitude to a nominal value, and a low pass analog filter filters the read signal to attenuate aliasing noise. After sampling, a digital equalizer filter equalizes the sample values according to a desired partial response, and a discrete time sequence detector, such as a Viterbi detector, interprets the equalized sample values in context to determine a most likely sequence for the digital data (i.e., maximum likelihood sequence detection (MLSD)). MLSD takes into account the effect of ISI and channel noise in the detection algorithm, thereby decreasing the probability of a detection error. This increases the effective signal to noise ratio and, for a given (d,k) constraint, allows for significantly higher data density as compared to conventional analog peak detection read channels.

The application of sampled amplitude techniques to digital communication channels is well documented. See Y. Kabal and S. Pasupathy, "Partial Response Signaling", *IEEE Trans. Commun. Tech.*, Vol. COM-23, pp.921–934, September 1975; and Edward A. Lee and David G. Messerschmitt, "Digital Communication", Kluwer Academic Publishers, Boston, 1990; and G. D. Forney, Jr., "The Viterbi Algorithm", *Proc. IEEE*, Vol. 61, pp. 268–278, March 1973.

Applying sampled amplitude techniques to magnetic storage systems is also well documented. See Roy D. Cideciyan, Francois Dolivo, Walter Hirt, and Wolfgang Schott, "A PRML System for Digital Magnetic Recording", *IEEE Journal on Selected Areas in Communications*, Vol. 10 No. 1, January 1992, pp.38–56; and Wood et al, "Viterbi Detection of Class IV Partial Response on a Magnetic Recording Channel", *IEEE Trans. Commun.*, Vol. Com-34, No. 5, pp. 454–461, May 1986; and Coker Et al, "Implementation of PRML in a Rigid disc Drive", *IEEE Trans. on Magnetics*, Vol. 27, No. 6, November 1991; and Carley et al, "Adaptive Continous-Time Equalization Followed By FDTS/DF Sequence Detection", *Digest of The Magnetic Recording Conference*, August 15–17, 1994, pp. C3; and Moon et al, "Constrained-Complexity Equalizer Design for Fixed Delay Tree Search with Decision Feedback", *IEEE Trans. on Magnetics*, Vol. 30, No. 5, September 1994; and Abbott et al, "Timing Recovery For Adaptive Decision Feedback Equalization of The Magnetic Storage Channel", *Globecom'90* IEEE Global Telecommunications Conference 1990, San Diego, Calif., November 1990, pp.1794–1799; and Abbott et al, "Performance of Digital Magnetic Recording with Equalization and Offtrack Interference", *IEEE Transactions on Magnetics*, Vol. 27, No. 1, January 1991; and Cioffi et al, "Adaptive Equalization in Magnetic-disc Storage Channels", *IEEE Communication Magazine*, February 1990; and Roger Wood, "Enhanced Decision Feedback Equalization", *Intermag'90*.

Similar to conventional peak detection systems, sampled amplitude detection requires timing recovery in order to correctly extract the digital sequence. Rather than process the continuous signal to align peaks to the center of bit cell periods as in peak detection systems, sampled amplitude systems synchronize the pulse samples to the baud rate. In conventional sampled amplitude read channels, timing recovery synchronizes a sampling clock by minimizing an error between the signal sample values and estimated sample values. A pulse detector or slicer determines the estimated sample values from the read signal samples. Even in the presence of ISI the sample values can be estimated and, together with the signal sample values, used to synchronize the sampling of the analog pulses in a decision-directed feedback system.

A phase-locked-loop (PLL) normally implements the timing recovery decision-directed feedback system. The PLL comprises a phase detector for generating a phase error based on the difference between the estimated samples and the read signal samples. A PLL loop filter filters the phase error, and the filtered phase error operates to synchronize the channel samples to the baud rate. Conventionally, the phase error adjusts the frequency of a sampling clock which is typically the output of a variable frequency oscillator (VFO). The output of the VFO controls a sampling device, such as an analog-to-digital (A/D) converter, to synchronize the sampling to the baud rate.

As mentioned above, sampled amplitude read channels also commonly employ a discrete time equalizer filter to equalize the sample values into a desired partial response (PR4, EPR4, EEPR4, etc.) before sequence detection. To this end, adaptive algorithms have been applied to compensate in real time for parameter variations in the recording system and across the disc radius. For example, U.S. Pat. No. 5,381,359 entitled "Adaptation and Training of Digital Finite Impulse Response Filter Within PRML Sampling Data Detection Channel", discloses an adaptive equalizer filter that operates according to a well known least mean square (LMS) algorithm, $$W_{k+1} = W_k - \mu \cdot e_k \cdot X_k,$$

where: $W_k$ represents a vector of filter coefficients; $\mu$ is a programmable gain; $e_k$ represents a sample error between the filter's actual output and a desired output; and $X_k$ represents a vector of sample values from the filter input. In other words, the LMS adaptive equalizer filter is a closed loop feedback system that attempts to minimize the mean squared error between an actual output of the filter and a desired output by continuously adjusting the filter's coefficients to achieve an optimum frequency response.

A problem associated with adaptive equalizer filters in sampled amplitude read channels is that the timing recovery and gain control loops can interfere with the adaptive feedback loop, thereby preventing the adaptive equalizer filter from converging to an optimal state. This non-convergence is manifested by the filter's phase and gain response drifting as it competes with the timing and gain control loops. An article by J. D. Coker et al. entitled "Implementation of PRML in a Rigid disc Drive", published in IEEE Transactions on Magnetics, vol. 27, No. 6, November 1991, suggests a three tap transversal filter comprising a fixed center tap and symmetric side taps in order to constrain the phase response of the equalizer filter except in terms of a fixed group delay. Constraining the phase response of the adaptive equalizer in this manner, however, is a very suboptimal method for attenuating interference from the timing recovery and gain control loops. Furthermore, it significantly reduces control over the adaptive filter's phase response, thereby placing the burden of phase compensation on the analog equalizer.

Yet another problem associated with conventional equalizer filters is an inherent limitation on its order (i.e., the number of coefficients): because the adaptive equalizer is inside the timing recovery feedback loop, its order must be limited to minimize the associated transport delay. Compensating for the deficiencies of the discrete time equalizer requires filtering the analog read signal with a higher order analog equalizer prior to the timing recovery loop, which is undesirable.

Still another aspect of prior art sampled amplitude read channels addressed by the present invention is the overall computation speed and power dissipation of the components therein, particularly the FIR filters. Conventional FIR filters that operate according to a binary number system require more time and power to perform the compute intense multiplication and add operations necessary to filter a signal in discrete time. Minimizing power dissipation while maximizing throughput are significant design considerations, especially in portable applications and/or applications that require a high data transfer rate.

Thus, there is a need for a faster, more power efficient sampled amplitude read channel that overcomes the above problems associated with adaptive equalization and timing recovery.

SUMMARY OF THE INVENTION

A sampled amplitude read channel is disclosed for disc storage systems which asynchronously samples an analog read signal, adaptively equalizes the resulting discrete time sample values according to a target partial response, extracts synchronous sample values through interpolated timing recovery, and detects digital data from the synchronous sample values using a Viterbi sequence detector. To increase the speed of read channel, the FIR filters in the equalizer and interpolator are implemented according to a residue number system. Further, the residue number system implementation of the FIR filters uses "one-hot" encoding to decrease power dissipation.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

Conventional Sampled Amplitude Read Channel

Figure 1:
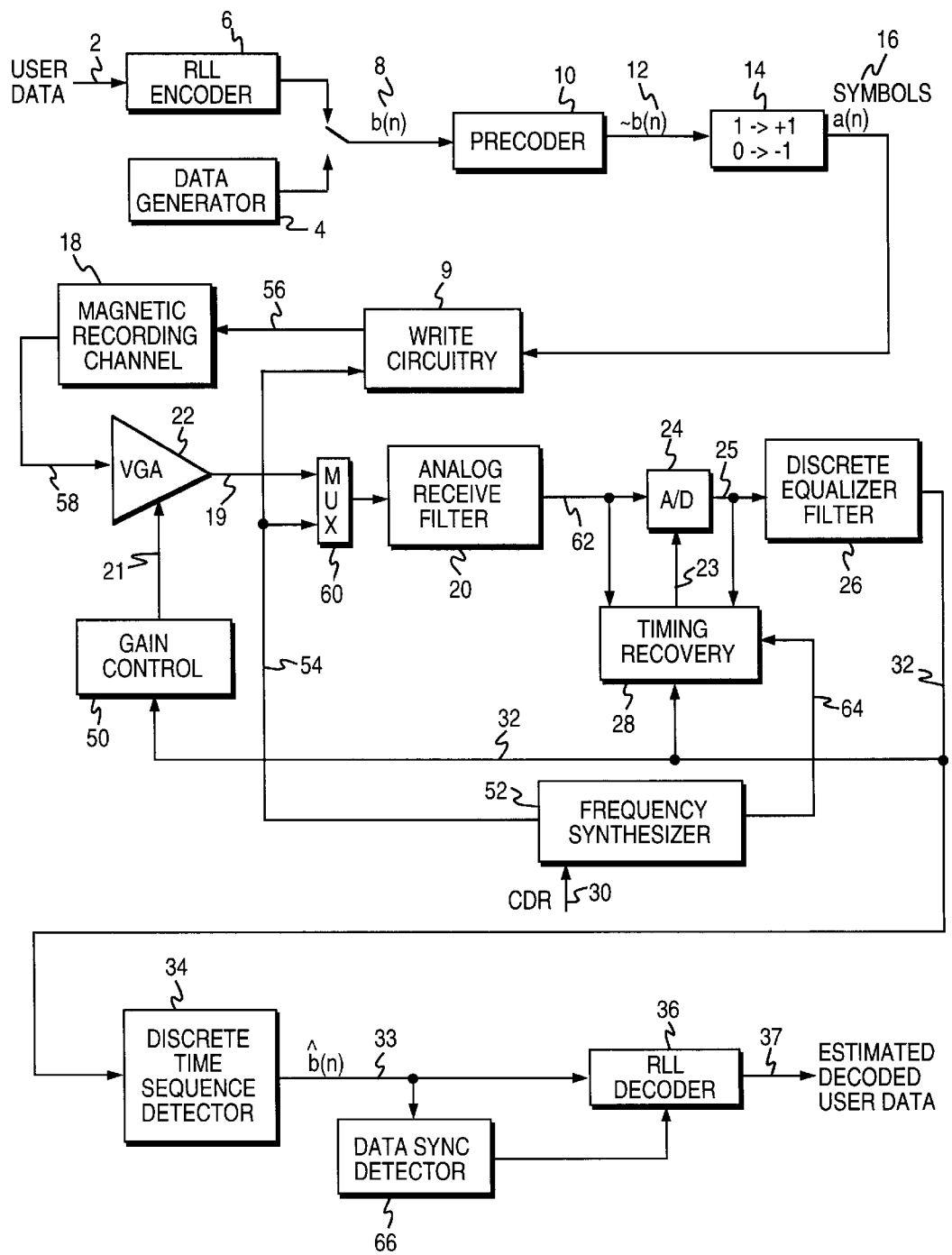
FIG. 1 is a block diagram of a conventional sampled amplitude recording channel.

Referring now to FIG. 1, shown is a detailed block diagram of a conventional sampled amplitude read channel. During a write operation, either user data 2 or preamble data from a data generator 4 (for example 2T preamble data) is written onto the media. An RLL encoder 6 encodes the user data 2 into a binary sequence b(n) 8 according to an RLL constraint. A precoder 10 precodes the binary sequence b(n)

8 in order to compensate for the transfer function of the recording channel 18 and equalizer filters to form a precoded sequence ~b(n) 12. The precoded sequence ~b(n) 12 is converted into symbols a(n) 16 by translating 14 ~b(N)=0 into a(N)=−1, and ~b(N)=1 into a(N)=+1. Write circuitry 9, responsive to the symbols a(n) 16, modulates the current in the recording head coil at the baud rate 1/T to record the binary sequence onto the media. A frequency synthesizer 52 provides a baud rate write clock 54 to the write circuitry 9 and is adjusted by a channel data rate signal (CDR) 30 according to the zone the recording head is over.

When reading the recorded binary sequence from the media, timing recovery 28 first locks to the write frequency by selecting, as the input to the read channel, the write clock 54 through a multiplexor 60. Once locked to the write frequency, the multiplexor 60 selects the signal 19 from the read head as the input to the read channel in order to acquire an acquisition preamble recorded on the disc preceding the recorded user data. A variable gain amplifier 22 adjusts the amplitude of the analog read signal 58, and an analog filter 20 provides initial equalization toward the desired response as well as attenuating aliasing noise. A sampling device 24 samples the analog read signal 62 from the analog filter 20, and a discrete time equalizer filter 26 provides further equalization of the sample values 25 toward the desired response. In partial response recording, for example, the desired response is often selected from Table 1:

TABLE 1

| Channel | Transfer Function | Dipulse Response |
|---|---|---|
| PR4 | (1 − D)(1 + D) | 0, 1, 0, −1, 0, 0, 0, ... |
| EPR4 | (1 − D)(1 + D)$^2$ | 0, 1, 1, −1, −1, 0, 0, ... |
| EEPR4 | (1 − D)(1 + D)$^3$ | 0, 1, 2, 0, −2, −1, 0, ... |

The discrete equalizer filter 26 may be implemented as a real-time adaptive filter which compensates for parameter variations over the disc radius (i.e., zones), disc angle, and environmental conditions such as temperature drift. To this end, the filter 26 receives estimated sample values generated by the timing recovery circuit 28; the estimated samples being input into an adaptive feedback loop and used to generate sample errors. The adaptive feedback loop conventionally employs a least mean square (LMS) algorithm to adapt the filter coefficients (i.e., it adapts the frequency and phase response of the filter) until a minimum sample error is achieved. Operation of a conventional adaptive equalizer filter is discussed in greater detail below.

After equalization, the equalized sample values 32 are applied to a decision directed gain control 50 and timing recovery 28 circuit for adjusting the amplitude of the read signal 58 and the frequency and phase of the sampling device 24, respectively. Timing recovery adjusts the frequency of sampling device 24 over line 23 in order to synchronize the equalized samples 32 to the baud rate. Frequency synthesizer 52 provides a course center frequency setting to the timing recovery circuit 28 over line 64 in order to center the timing recovery frequency over temperature, voltage, and process variations. A channel data rate (CDR) 30 signal adjusts a frequency range of the synthesizer 52 according to the data rate for the current zone. Gain control 50 adjusts the gain of variable gain amplifier 22 over line 21 in order to match the magnitude of the channel's frequency response to the desired partial response.

The equalized samples Y(n) 32 are also sent to a discrete time sequence detector 34, such as a maximum likelihood (ML) Viterbi sequence detector, which detects an estimated binary sequence ^b(n) 33 from the sample values. An RLL decoder 36 decodes the estimated binary sequence ^b(n) 33 from the sequence detector 34 into estimated user data 37. A data sync detector 66 detects the sync mark 70 (shown in FIG. 2B) in the data sector 15 in order to frame operation of the RLL decoder 36. In the absence of errors, the estimated binary sequence ^b(n) 33 matches the recorded binary sequence b(n) 8, and the decoded user data 37 matches the recorded user data 2.

Data Format

Figure 2A:
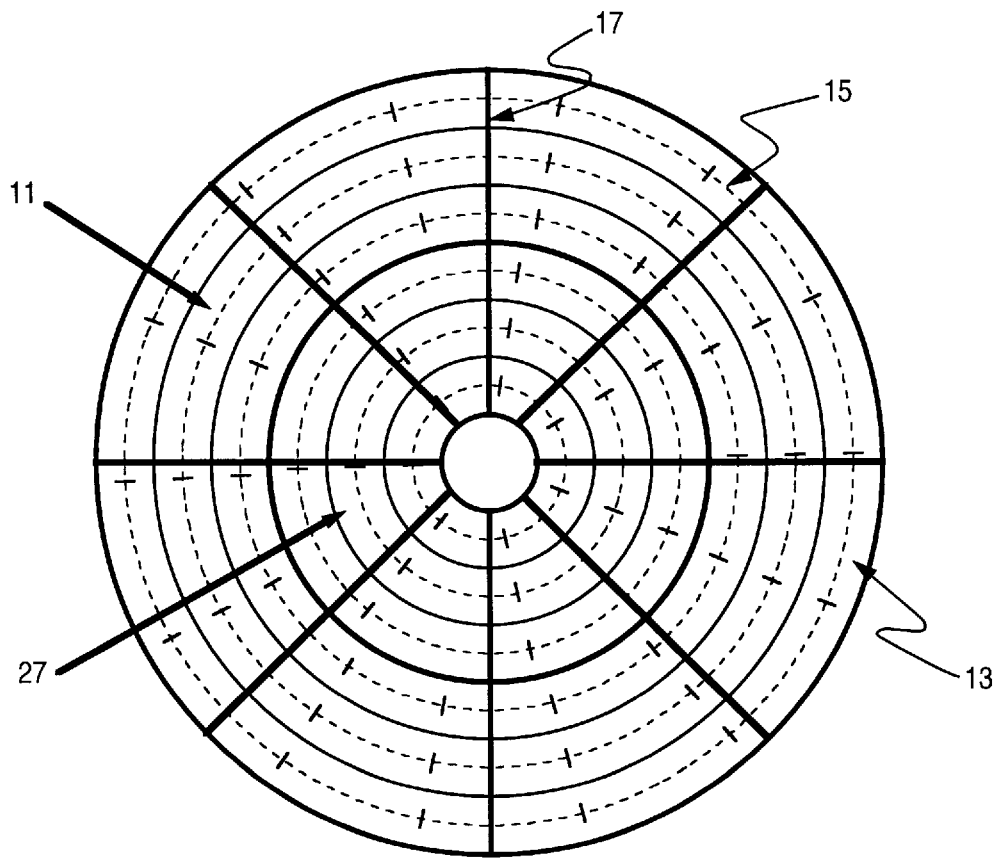
FIG. 2A shows an exemplary data format of a magnetic disc having a plurality of concentric tracks comprised of a plurality of user data sectors and embedded servo data wedges.

FIG. 2A shows an exemplary data format of a magnetic media comprising a series of concentric data tracks 13 wherein each data track 13 comprises a plurality of sectors 15 with embedded servo wedges 17. A servo controller (not shown) processes the servo data in the servo wedges 17 and, in response thereto, positions the read/write head over a desired track. Additionally, the servo controller processes servo bursts within the servo wedges 17 to keep the head aligned over a centerline of the desired track while writing and reading data. The servo wedges 17 may be detected by a simple discrete time pulse detector or by the discrete time sequence detector 34. The format of the servo wedges 17 includes a preamble and a sync mark, similar to the user data sectors 15.

Figure 2B:
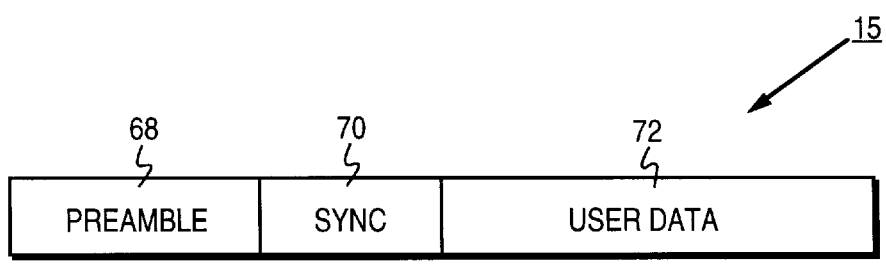
FIG. 2B shows an exemplary format of a user data sector.

FIG. 2B shows the format of a user data sector 15 comprising an acquisition preamble 68, a sync mark 70, and user data 72. Timing recovery uses the acquisition preamble 68 to acquire the correct sampling frequency and phase before reading the user data 72, and the sync mark 70 demarks the beginning of the user data 72 (see co-pending U.S. patent application Ser. No. 08/313,491 entitled "Improved Timing Recovery For Synchronous Partial Response Recording").

To increase the overall storage density, the disc is partitioned into an outer zone 11 comprising fourteen data sectors per track, and an inner zone 27 comprising seven data sectors per track. In practice, the disc is actually partitioned into several zones with a different number of sectors in each zone, and the data recorded and detected at a different data rate in each zone.

Improved Sampled Amplitude Read Channel

Figure 3:
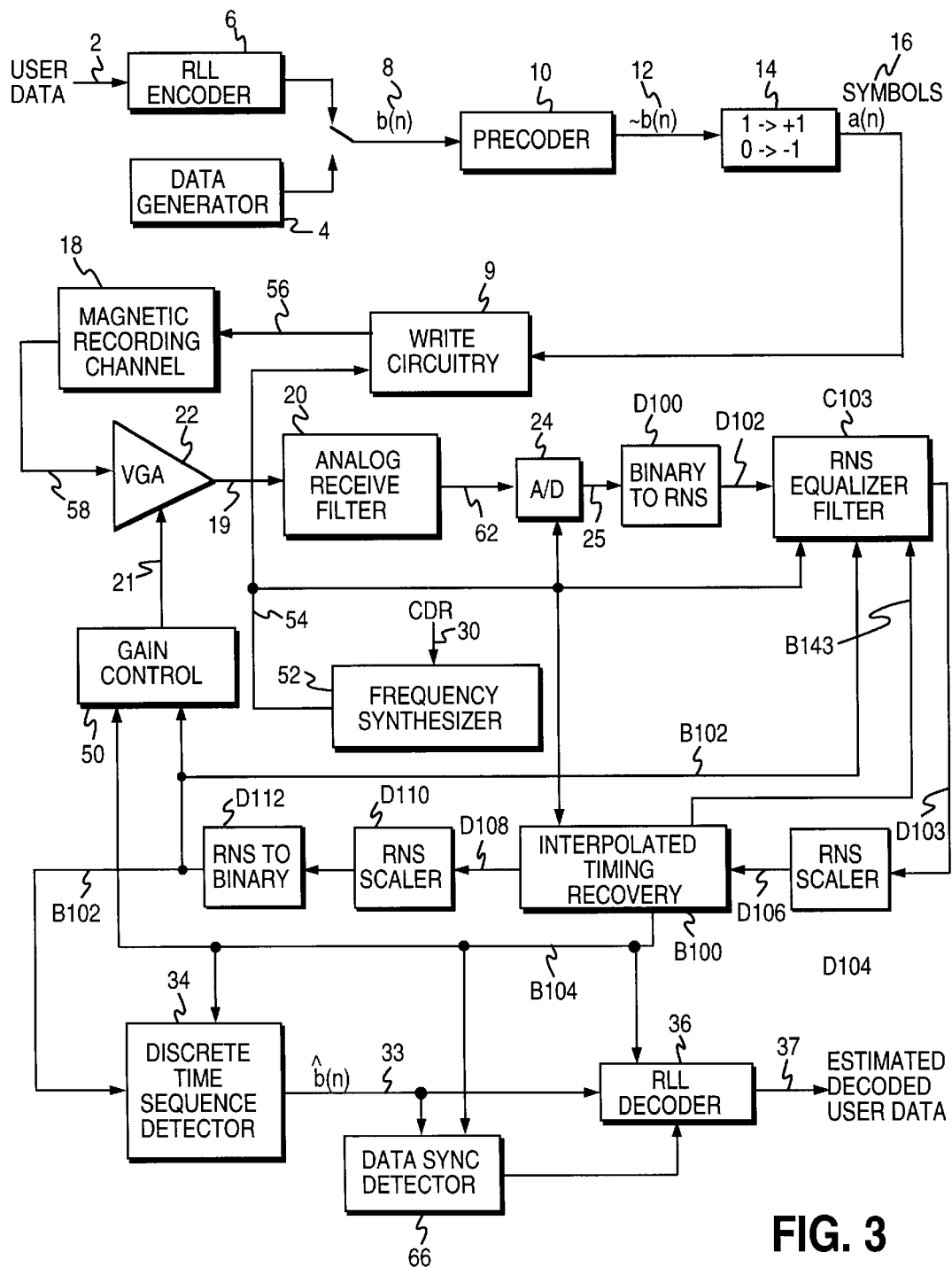
FIG. 3 is a block diagram of the improved sampled amplitude read channel of the present invention comprising interpolated timing recovery and an adaptive equalizer both comprising an RNS FIR filter.

FIG. 3 shows the improved sampled amplitude read channel of the present invention wherein the conventional sampled timing recovery 28 of FIG. 1 has been replaced by interpolated timing recovery (ITR) B100, and the conventional discrete equalizer filter 26 of FIG. 1 has been replaced by a residue number system (RNS) equalizer filter C103 in order to increase its speed and power efficiency significantly. The RNS equalizer filter C103 is also real time adaptive, receiving interpolated sample values B102 and estimated sample values B143 from ITR B100, for use in a modified least mean square (LMS) algorithm which constrains the filter's gain and phase response according to the present invention, the details of which are set forth below.

In addition, the write frequency synthesizer 52 generates a baud rate write clock 54 applied to the write circuitry 9, and an asynchronous read clock 54 for clocking the sampling device 24, the RNS equalizer filter C103, and the ITR B100 at a frequency relative to the current zone (CDR 30). In an alternative embodiment, a first frequency synthesizer generates the write clock, and a second frequency synthesizer generates the read clock.

To facilitate the RNS design, the sample values 25 output by the A/D 24 are converted D100 from a binary representation into an RNS representation. The RNS sample values D102 are filtered by RNS equalizer filter C103, and RNS scaler D104 rescales the RNS sample values D103 to prevent overflow. The rescaled RNS sample values D106 are input into ITR B100 which generates interpolated RNS sample values D108 substantially synchronized to the baud rate of the current zone. Similar to the RNS equalizer C103, ITR B100 comprises an FIR filter also implemented in RNS to increase its speed and power efficiency. The interpolated sample values D108 are rescaled D110 and converted D112 back into a binary representation B102 for further processing by the read channel.

A discrete time sequence detector 34 detects an estimated binary sequence 33 representing the user data from the interpolated sample values B102. The ITR B100 circuit generates a synchronous data clock B104 for clocking operation of the gain control 50, discrete time sequence detector 34, sync mark detector 66 and RLL decoder 36.

Conventional Timing Recovery

Figure 4A:
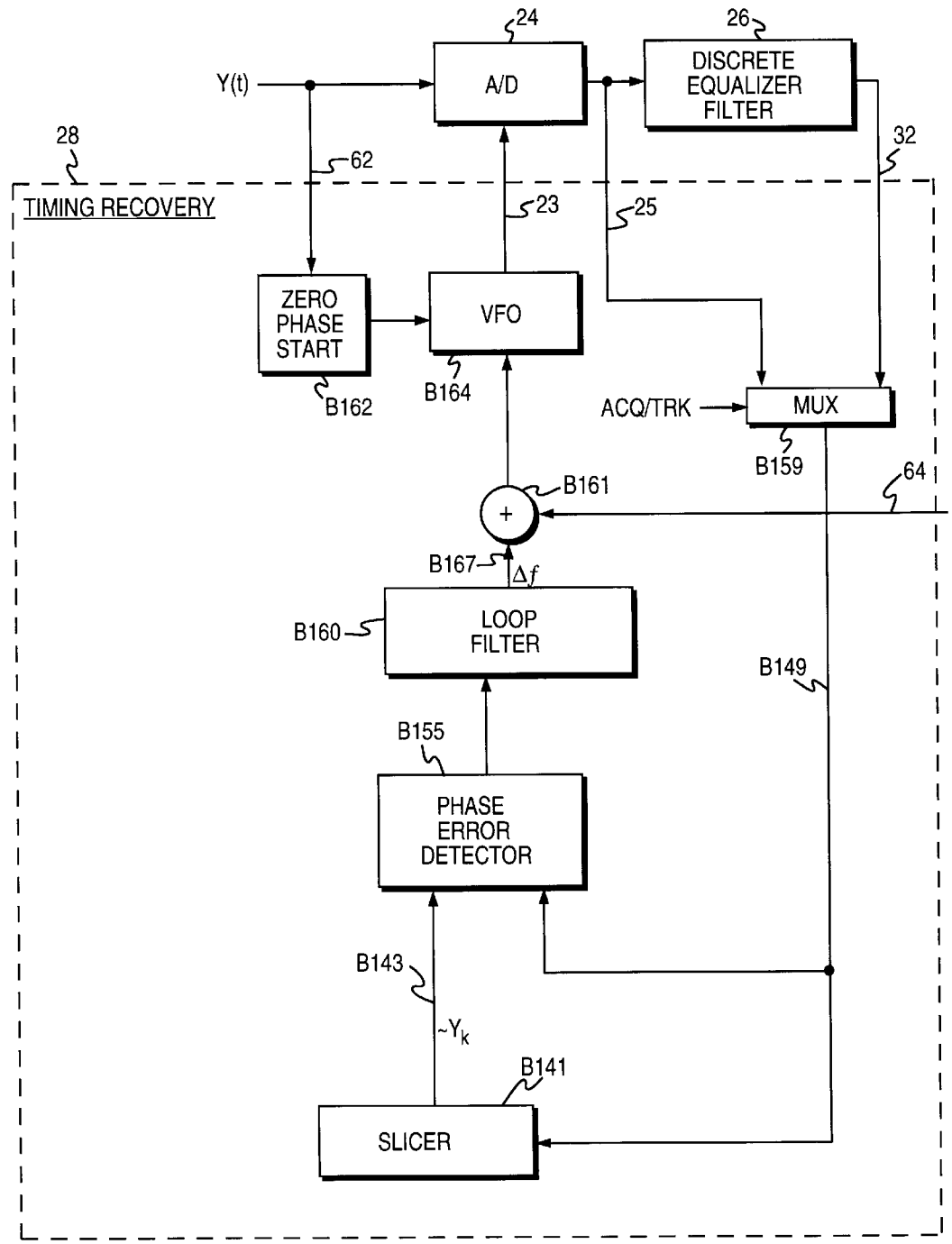
FIG. 4A is a detailed block diagram of the prior art sampling timing recovery comprising a sampling VFO synchronized to the baud rate.

An overview of the conventional sampling timing recovery circuit 28 of FIG. 1 is shown in FIG. 4A. The output 23 of a variable frequency oscillator (VFO) B164 controls the sampling clock of a sampling device 24 which is typically an analog-to-digital converter (A/D) in digital read channels. A multiplexor B159 selects the unequalized sample values 25 during acquisition and the equalized sample values 32 during tracking, thereby removing the discrete equalizer filter 26 from the timing loop during acquisition in order to avoid its associated latency. A phase error detector B155 generates a phase error in response to the sample values received over line B149 and estimated sample values $\sim Y_k$ from a sample value estimator B141, such as a slicer in a d=0 PR4 read channel, over line B143. A loop filter B160 filters the phase error to generate a frequency offset $\Delta f$ B167 that settles to a value proportional to a frequency difference between the sampling clock 23 and the baud rate. The frequency offset $\Delta f$ B167, together with the center frequency control signal 64 from the frequency synthesizer 52, adjust the sampling clock 23 at the output of the VFO B164 in order to synchronize the sampling to the baud rate.

A zero phase restart (ZPR) B162 circuit suspends operation of the VFO B164 at the beginning of acquisition in order to minimize the initial phase error between the sampling clock 23 and the read signal 62. This is achieved by disabling the VFO B164, detecting a zero crossing in the analog read signal 62, and re-enabling the VFO B164 after a predetermined delay between the detected zero crossing and the first baud rate sample.

The estimated sample values B143 at The output of the slicer B141 are also input into the discrete time equalizer filter 26 of FIG. 1 for use in a conventional least mean square (LMS) adaptation algorithm as is described in more detail below.

Interpolated Timing Recovery

Figure 4B:
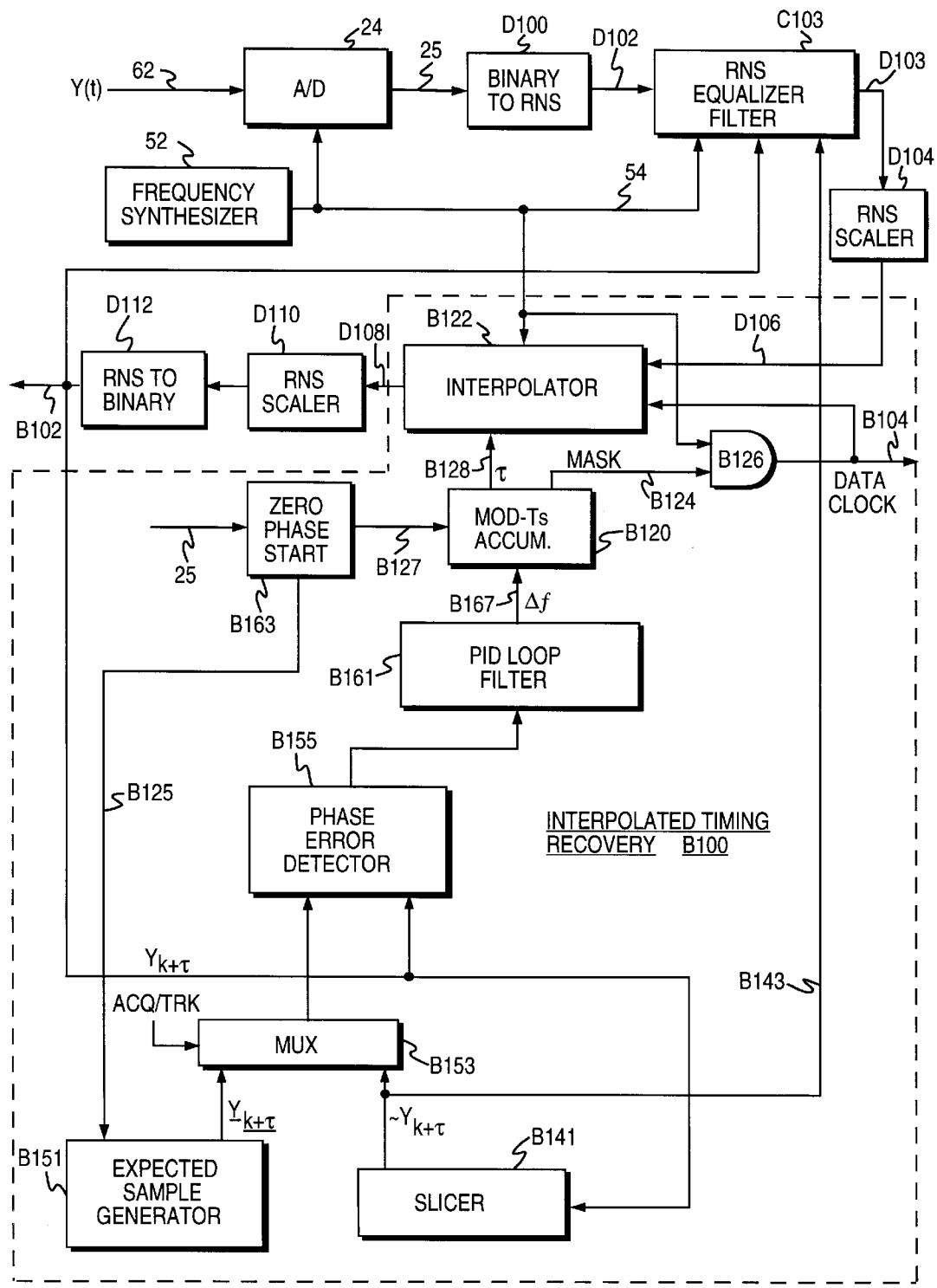
FIG. 4B is a detailed block diagram of the interpolated timing recovery of the present invention comprising an interpolator for computing interpolated sample values substantially synchronized to the baud rate.

The interpolated timing recovery B100 of the present invention is shown in FIG. 4B. The VFO B164 in the conventional timing recovery of FIG. 4A is replaced with a modulo-Ts accumulator B120 and an interpolator B122. In addition, an expected sample value generator B151 generates expected samples $Y_{k+\tau}$ used by the phase error detector B155 to compute the phase error during acquisition. A multiplexor B153 selects the estimated sample values $\sim Y_{k+\tau}$ from the slicer B141 for use by the phase error detector B155 during tracking. The data clock B104 is generated at the output of an AND gate B126 in response to the sampling clock 54 and a mask signal B124 from the modulo-Ts accumulator B120 as discussed in further detail below. The phase error detector B155 and the slicer B141 process interpolated sample values B102 at the output of the interpolator B122 rather than the channel sample values 32 at the output of the discrete equalizer filter 26 as in FIG. 4A. A PID loop filter B161 controls the closed loop frequency response, similar to the loop filter B160 of FIG. 4A, and generates a frequency offset signal B167. The frequency offset is accumulated by the modulo-Ts accumulator B120 to generate an interpolation interval $\tau$ B128 for use by the interpolator B122 in computing the interpolated RNS sample values D108. The interpolated RNS sample values D108 are rescaled D110 and converted D112 back into a binary representation $Y_{k+\tau}$ B102.

The binary interpolated sample values $Y_{k+\tau}$ B102 and the estimated sample values $\sim Y_{k+\tau}$ from the slicer B141 are input into the adaptive, discrete equalizer filter C103 of FIG. 3 for use by a modified least mean square (LMS) algorithm, the details of which are set forth below.

In the interpolated timing recovery of the present invention, locking a VFO to a reference frequency before acquiring the preamble is no longer necessary; multiplexing 60 the write clock 54 into the analog receive filter 20 (as in FIG. 1) is not necessary. Further, the sampling device 24 and the discrete equalizer filter 26, together with their associated delays, have been removed from the timing recovery loop; it is not necessary to multiplex B159 around the equalizer filter 26 between acquisition and tracking. However, it is still necessary to acquire a preamble 68 before tracking the user data 72. To this end, a zero phase restart (ZPR) B163 minimizes the initial phase error between the interpolated sample values and the baud rate at the beginning of acquisition similar to the ZPR B162 of FIG. 4A. However, rather than suspend operation of a sampling VFO B164, the ZPR B163 for interpolated timing recovery computes an initial phase error $\tau$ from the A/D 24 sample values 25 and loads this initial phase error into the modulo-Ts accumulator B120 over line B127. The ZPR B163 also generates a signal B125 for initializing the starting state of the expected sample generator B151.

The interpolator B122, as described in detail below, comprises a time varying FIR filter responsive to the interpolation interval $\tau$ B128 for computing the interpolated sample values. For more details concerning the PID loop filter B161, phase error detector B155, expected sample generator B151, and slicer B141, refer to U.S. patent application Ser. No. 08/341,251 entitled "Sampled Amplitude Read Channel Comprising Sample Estimation Equalization, Defect Scanning, Channel Quality, Digital Servo Demodulation, PID Filter for Timing Recovery, and DC Offset Control" and U.S. Ser. No. 08/313,491 entitled "Improved Timing Recovery For Synchronous Partial Response Recording." A detailed description of the modulo-Ts accumulator B120, data clock B104, and interpolator B122 is provided in the following discussion.

Interpolator

Figure 5:
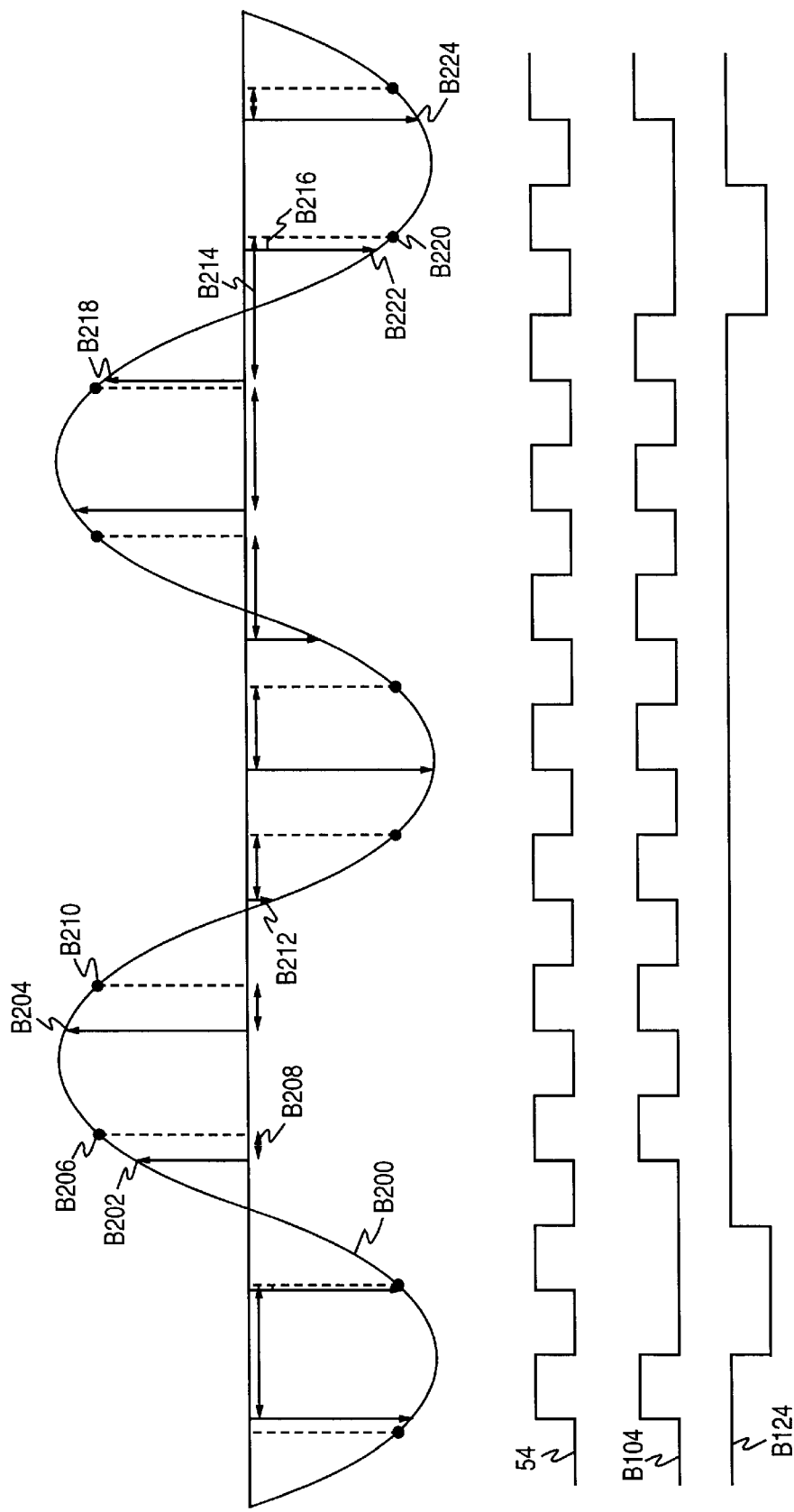
FIG. 5 illustrates the channels samples in relation to the interpolated baud rate samples for the acquisition preamble.

The interpolator B122 of FIG. 4B is understood with reference to FIG. 5 which shows a sampled 2T acquisition preamble signal B200. The target synchronous sample values B102 are shown as black circles and the asynchronous channel sample values D106 as vertical arrows. Beneath the sampled preamble signal is a timing diagram depicting the corresponding timing signals for the sampling clock 54, the data clock B104 and the mask signal B124. As can be seen in FIG. 5, the preamble signal B200 is sampled slightly faster than the baud rate (the rate of the target values).

The function of the interpolator is to estimate the target sample value by interpolating the channel sample values. For illustrative purposes, consider a simple estimation algorithm, linear interpolation:

$$Y(N-1)=x(N-1)+\tau \cdot (x(N)-x(N-1)); \tag{1}$$

where:

x(N−1) and x(N) are the channel samples surrounding the target sample; and τ is an interpolation interval proportional to a time difference between the channel sample value x(N−1) and the target sample value. The interpolation interval τ is generated at the output of modulo-Ts accumulator B120 which accumulates the frequency offset signal Δf B167 at the output of the PID loop filter B161:

$$\tau=(\Sigma \Delta f) \text{ MOD TS}; \tag{2}$$

where:

Ts is the sampling period of the sampling clock 54. Since the sampling clock 54 samples the analog read signal 62 slightly faster than the baud rate, it is necessary to mask the data clock every time the accumulated frequency offset Δf, integer divided by Ts, increments by 1. Operation of the data clock B104 and the mask signal B124 generated by the modulo-Ts accumulator B120 is understood with reference to the timing diagram of FIG. 5.

Assuming the interpolator implements the simple linear equation (1) above, then channel sample values B202 and B204 are used to generate the interpolated sample value corresponding to target sample value B206. The interpolation interval τ B208 is generated according to equation (2) above. The next interpolated sample value corresponding to the next target value B210 is computed from channel sample values B204 and B212. This process continues until the interpolation interval τ B214 would be greater than Ts except that it "wraps" around and is actually τ B216 (i.e., the accumulated frequency offset Δf, integer divided by TS, increments by 1 causing the mask signal B124 to activate). At this point, the data clock B104 is masked by mask signal B124 so that the interpolated sample value corresponding to the target sample value B220 is computed from channel sample values B222 and B224 rather than channel sample values B218 and B222.

The simple linear interpolation of equation (1) will only work if the analog read signal is sampled at a much higher frequency than the baud rate. This is not desirable since operating the channel at higher frequencies increases its complexity and cost. Therefore, in the preferred embodiment the interpolator B122 is implemented as a filter responsive to more than two channel samples to compute the interpolated sample value.

The ideal discrete time phase interpolation filter has a flat magnitude response and a constant group delay of τ:

$$C_\tau(e^{j\omega})=e^{j\omega\tau} \tag{3}$$

which has an ideal impulse response:

$$\sin c(\pi \cdot (n-\tau/T_s)). \tag{4}$$

Unfortunately, the above non-causal infinite impulse response (4) cannot be realized. Therefore, the impulse response of the interpolation filter is designed to be a best fit approximation of the ideal impulse response (4). This can be accomplished by minimizing a mean squared error between the frequency response of the actual interpolation filter and the frequency response of the ideal interpolation filter (3). This approximation can be improved by taking into account the spectrum of the input signal, that is, by minimizing the mean squared error between the input spectrum multiplied by the actual interpolation spectrum and the input spectrum multiplied by the ideal interpolation spectrum:

$$\overline{C}_{96}(e^{j\omega})X(e^{j\omega})-C_\tau(e^{j\omega})X(e^{j\omega}); \tag{5}$$

where:

$\overline{C}_\tau(e^{j\omega})$ is the spectrum of the actual interpolation filter; and $X(e^{j\omega})$ is the spectrum of the input signal. From equation (5), the mean squared error is represented by:

$$E_\tau^2 = \frac{1}{2\pi} \int_{-\pi}^{\pi} |\overline{C}_\tau(e^{j\omega}) - e^{j\omega\tau}|^2 |X(e^{j\omega})|^2 \, d\omega; \text{ where:} \tag{6}$$

$X(e^{j\omega})$ is the spectrum of the read channel (e.g., PR4, EPR4, EEPR4 of Table 1 or some other partial response spectrum).

In practice, the above mean squared error equation (6) is modified by specifying that the spectrum of the input signal is bandlimited to some predetermined constant $0 \leq \omega \leq \alpha\pi$ where $0<\alpha<1$; that is:

$$|X(e^{j\omega})|=0, \text{ for } |\omega| \leq \alpha\pi.$$

Then equation (6) can be expressed as:

$$E_{\tau,\alpha}^2 = \frac{1}{2\pi} \int_{-\alpha\pi}^{\alpha\pi} |\overline{C}_\tau(e^{j\omega}) - e^{j\omega\tau}|^2 |X(e^{j\omega})|^2 \, d\omega. \tag{7}$$

The solution to the minimization problem of equation (7) involves expressing the actual interpolation filter in terms of its coefficients and then solving for the coefficients that minimize the error in a classical mean-square sense.

The actual interpolation filter can be expressed as the FIR polynomial:

$$\overline{C}_\tau(e^{j\omega}) = \sum_{n=-R}^{n=R-1} C_\tau(n)e^{-j\omega n}; \text{ where:} \tag{8}$$

2R is the number of taps in each interpolation filter and the sample period Ts has been normalized to 1. A mathematical derivation for an interpolation filter having an even number of coefficients is provided below. It is within the ability of those skilled in the art to modify the mathematics to derive an interpolation filter having an odd number of coefficients.

Substituting equation (8) into equation (7) leads to the desired expression in terms of the coefficients $C_\tau(n)$:

$$E_{\tau,\alpha}^2 = \frac{1}{2\pi} \int_{-\alpha\pi}^{\alpha\pi} |\sum_{n=-R}^{n=R-1} C_\tau(n)e^{-j\omega n} - e^{j\omega\tau}|^2 |X(e^{j\omega})|^2 \, d\omega. \tag{9}$$

The next step is to take the derivatives of equation (9) with respect to the coefficients $C_\tau(n)$ and set them to zero:

$$\frac{\partial E_{\tau,\alpha}^2}{\partial c_\tau(n_o)} = 0 \text{ for } n_o = -R, \ldots, 0, 1, \ldots, R-1. \tag{10}$$

After careful manipulation, equation (10) leads to:

$$\int_{-\alpha\pi}^{\alpha\pi} \left[ \left( \sum_{n=-R}^{n=R-1} C_\tau(n)\cos(\omega(n_o - n)) \right) - \cos(\omega(n_o + \tau)) \right] |X(e^{j\omega})|^2 d\omega = 0 \tag{11}$$

Defining $\phi(r)$ as:

$$\phi(r) = \int_{-\alpha\pi}^{\alpha\pi} |X(e^{j\omega})|^2 \cos(\omega r) d\omega \tag{12}$$

and substituting equation (12) into equation (11) gives:

$$\sum_{n=-R}^{n=R-1} C_\tau(n)\phi(n - n_o) = \phi(n_o + \tau) \quad (13)$$

$$\text{for } n_o = -R, \ldots, 0, 1, \ldots, R - 1.$$

Equation (13) defines a set of 2R linear equations in terms of the coefficients $c_\tau(n)$. Equation (13) can be expressed more compactly in matrix form:

$$\Phi_T C_\tau = \Phi_\tau;$$

where:

$C_\tau$ is a column vector of the form:

$$C_\tau = [c_\tau(-R), \ldots, c_\tau(0), \ldots, c_\tau(R-1)]^t$$

$\Phi_T$ is a Toeplitz matrix of the form:

$$\Phi_T = \begin{bmatrix} \phi(0) & \phi(1) & \ldots & \phi(2R-1) \\ \phi(1) & \phi(0) & & \\ \vdots & & & \vdots \\ \vdots & & & \vdots \\ \phi(2R-1) & & \ldots & \phi(0) \end{bmatrix}$$

and $\Phi_\tau$ is a column vector of the form:

$$\Phi_\tau[\phi(-R+\tau), \ldots, \phi(\tau), \phi(1+\tau), \ldots, \phi(R-1+\tau)]^t. \quad (14)$$

The solution to equation (14) is:

$$C_\tau = \Phi_T^{-1} \Phi_\tau; \quad (15)$$

where:

$\Phi_T^{-1}$ is an inverse matrix that can be solved using well known methods.

Table B2 shows example coefficients $C_\tau(n)$ calculated from equation (15) with 2R=6, $\alpha$=0.8 and $X(e^{j\omega})$=PR4:

TABLE B2

| $\tau \cdot$ 32/Ts | C(-2) | C(-1) | C(0) | C(1) | C(2) | C(3) |
|---|---|---|---|---|---|---|
| 0 | 0.0000 | -0.0000 | 1.0000 | 0.0000 | -0.0000 | 0.0000 |
| 1 | 0.0090 | -0.0231 | 0.9965 | 0.0337 | -0.0120 | 0.0068 |
| 2 | 0.0176 | -0.0445 | 0.9901 | 0.0690 | -0.0241 | 0.0135 |
| 3 | 0.0258 | -0.0641 | 0.9808 | 0.1058 | -0.0364 | 0.0202 |
| 4 | 0.0335 | -0.0819 | 0.9686 | 0.1438 | -0.0487 | 0.0268 |
| 5 | 0.0407 | -0.0979 | 0.9536 | 0.1829 | -0.0608 | 0.0331 |
| 6 | 0.0473 | -0.1120 | 0.9359 | 0.2230 | -0.0728 | 0.0393 |
| 7 | 0.0533 | -0.1243 | 0.9155 | 0.2638 | -0.0844 | 0.0451 |
| 8 | 0.0587 | -0.1348 | 0.8926 | 0.3052 | -0.0957 | 0.0506 |
| 9 | 0.0634 | -0.1434 | 0.8674 | 0.3471 | -0.1063 | 0.0556 |
| 10 | 0.0674 | -0.1503 | 0.8398 | 0.3891 | -0.1164 | 0.0603 |
| 11 | 0.0707 | -0.1555 | 0.8101 | 0.4311 | -0.1257 | 0.0644 |
| 12 | 0.0732 | -0.1589 | 0.7784 | 0.4730 | -0.1341 | 0.0680 |
| 13 | 0.0751 | -0.1608 | 0.7448 | 0.5145 | -0.1415 | 0.0710 |
| 14 | 0.0761 | -0.1611 | 0.7096 | 0.5554 | -0.1480 | 0.0734 |
| 15 | 0.0765 | -0.1598 | 0.6728 | 0.5956 | -0.1532 | 0.0751 |
| 16 | 0.0761 | -0.1572 | 0.6348 | 0.6348 | -0.1572 | 0.0761 |
| 17 | 0.0751 | -0.1532 | 0.5956 | 0.6728 | -0.1598 | 0.0765 |
| 18 | 0.0734 | -0.1480 | 0.5554 | 0.7096 | -0.1611 | 0.0761 |
| 19 | 0.0710 | -0.1415 | 0.5145 | 0.7448 | -0.1608 | 0.0751 |
| 20 | 0.0680 | -0.1341 | 0.4730 | 0.7784 | -0.1589 | 0.0732 |
| 21 | 0.0644 | -0.1257 | 0.4311 | 0.8101 | -0.1555 | 0.0707 |
| 22 | 0.0603 | -0.1164 | 0.3891 | 0.8398 | -0.1503 | 0.0674 |
| 23 | 0.0556 | -0.1063 | 0.3471 | 0.8674 | -0.1434 | 0.0634 |
| 24 | 0.0506 | -0.0957 | 0.3052 | 0.8926 | -0.1348 | 0.0587 |
| 25 | 0.0451 | -0.0844 | 0.2638 | 0.9155 | -0.1243 | 0.0533 |
| 26 | 0.0393 | -0.0728 | 0.2230 | 0.9359 | -0.1120 | 0.0473 |

TABLE B2-continued

| $\tau \cdot$ 32/Ts | C(-2) | C(-1) | C(0) | C(1) | C(2) | C(3) |
|---|---|---|---|---|---|---|
| 27 | 0.0331 | -0.0608 | 0.1829 | 0.9536 | -0.0979 | 0.0407 |
| 28 | 0.0268 | -0.0487 | 0.1438 | 0.9686 | -0.0819 | 0.0335 |
| 29 | 0.0202 | -0.0364 | 0.1058 | 0.9808 | -0.0641 | 0.0258 |
| 30 | 0.0135 | -0.0241 | 0.0690 | 0.9901 | -0.0445 | 0.0176 |
| 31 | 0.0068 | -0.0120 | 0.0337 | 0.9965 | -0.0231 | 0.0090 |

Figure 6:
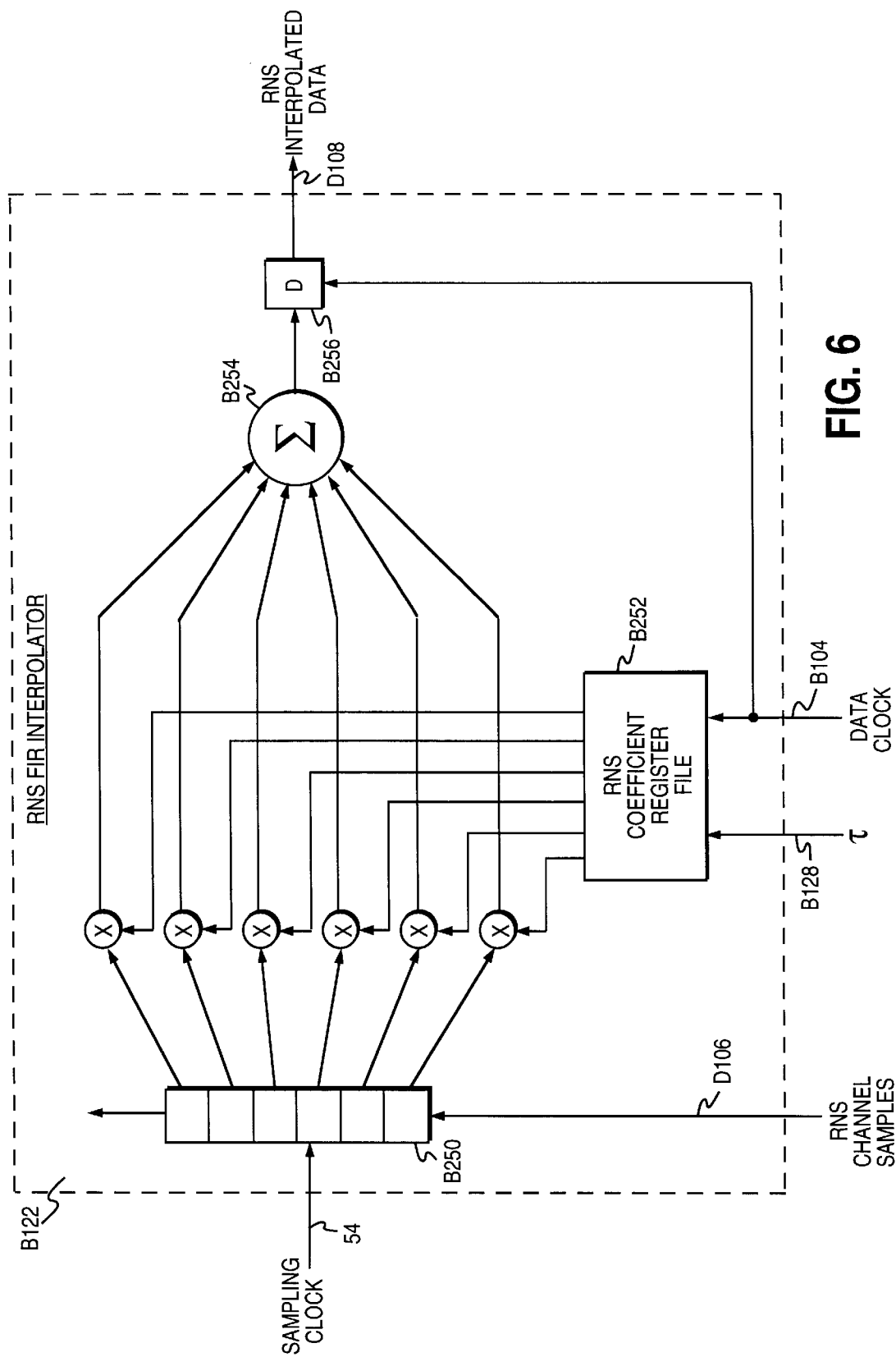
FIG. 6 shows an residue number system FIR filter implementation for the timing recovery interpolator.

The implementation of the six tap FIR filter is shown in FIG. 6. A shift register B250 receives the channel samples D106 at the sampling clock rate 54. The filter coefficients $C_\tau(n)$ are stored in a coefficient register file B252 and applied to corresponding multipliers according to the current value of $\tau$ B128. The coefficients are multiplied by the channel samples D106 stored in the shift register B250. The resulting products are summed B254 and the sum stored in a delay register B256. The RNS coefficient register file B252 and the delay register B256 are clocked by the data clock B104 to implement the masking function described above.

In an alternative embodiment not shown, a plurality of static FIR filters, having coefficients that correspond to the different values of $\tau$, filter the sample values in the shift register B250. Each filter outputs an interpolation value, and the current value of the interpolation interval $\tau$ B128 selects the output of the corresponding filter as the output D108 of the interpolator B122. Since the coefficients of one filter are not constantly updated as in FIG. 6, this multiple filter embodiment increases the speed of the interpolator B122 and the overall throughput of the read channel.

Rather than store all of the coefficients of the interpolation filters in memory, an alternative implementation is to compute the filter coefficients $C_\tau(n)$ in real time as a function of $\tau$. For example, the filter coefficients $C_\tau(n)$ can be computed in real time according to a predetermined polynomial in $\tau$ (see, for example, U.S. Pat. No. 4,866,647 issued to Farrow entitled, "A Continuously Variable Digital Delay Circuit," the disclosure of which is hereby incorporated by reference).

The preferred embodiment, however, for computing the filter coefficients in real time, is to use a reduced rank matrix. Consider that the bank of filter coefficients stored in the coefficient register file B252 can be represented as an MxN matrix $A_{M \times N}$, where N is the depth of the interpolation filter (i.e., the number of coefficients $c_\tau(n)$ in the impulse response computed according to equation (15)) and M is the number of interpolation intervals (i.e., the number of $\tau$ intervals). Rather than store the entire $A_{M \times N}$ matrix in memory, it is possible to store a reduced rank matrix generated using factorization and singular value decomposition (SVD) of the $A_{M \times N}$ matrix.

Consider that the $A_{M \times N}$ matrix can be factored into an $F_{M \times N}$ and $G_{N \times N}$ matrix, $$A_{M \times N} = F_{M \times N} \cdot G_{N \times N}.$$

Then a reduced rank approximation of the $A_{M \times N}$ matrix can be formed by reducing the size of the $F_{M \times N}$ and $G_{N \times N}$ matrices by replacing N with L where L<N and, preferably, L<<N. Stated differently, find the $F_{M \times L}$ and $G_{L \times N}$ matrices whose product best approximates the $A_{M \times N}$ matrix, $$A_{M \times N} \approx F_{M \times L} \cdot G_{L \times N}.$$

Figure 7:
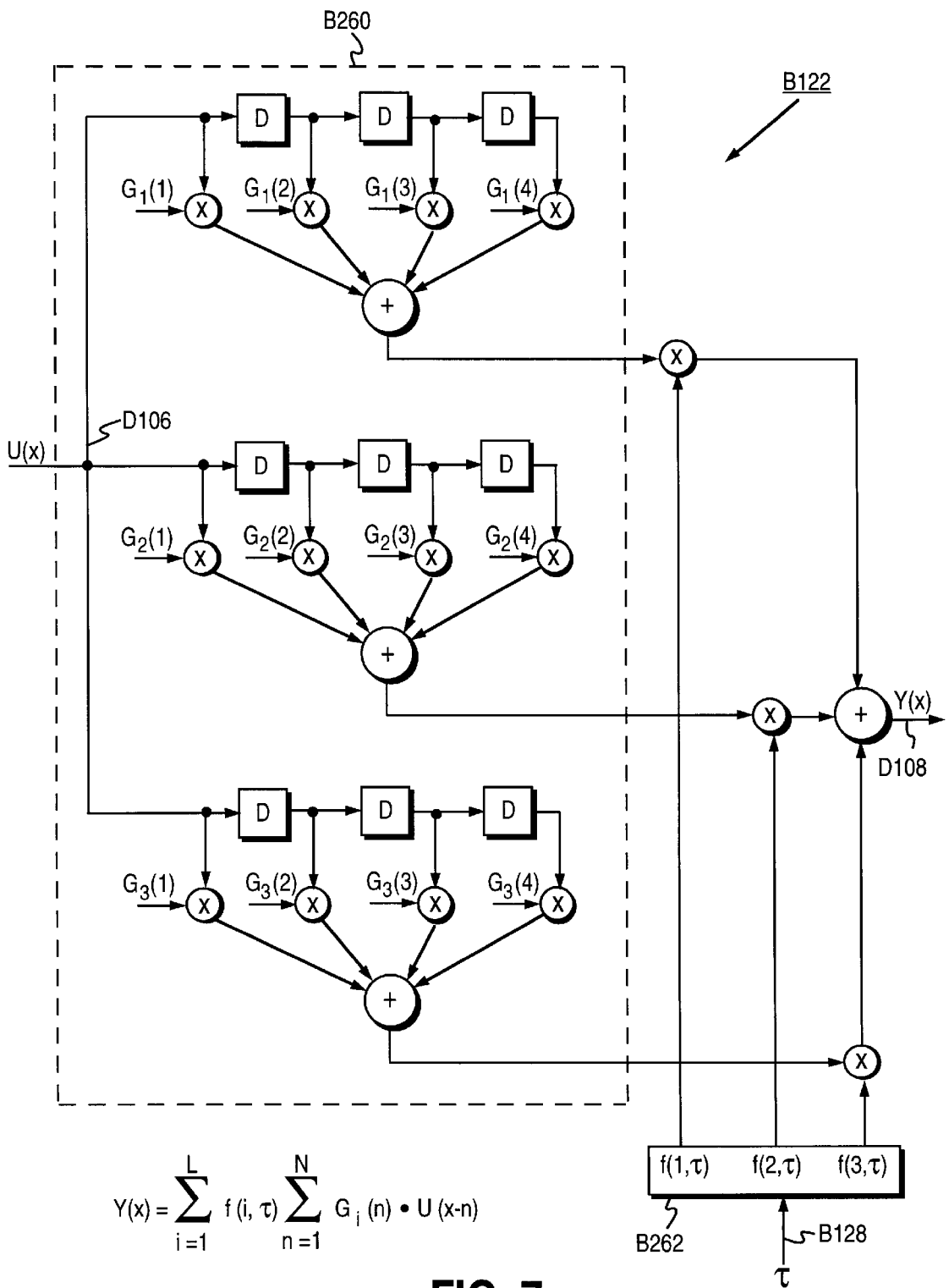
FIG. 7 depicts a cost reduced implementation for the timing recovery interpolator.

The convolution process of the interpolation filter can then be carried out, as shown in FIG. 7, by implementing the $G_{L \times N}$ matrix as a bank of FIR filters B260 connected to receive the channel sample values 32, and the $F_{M \times L}$ matrix implemented as a lookup table B262 indexed by $\tau$ B128 (as will become more apparent in the following discussion). Those skilled in the art will recognize that, in an alternative embodiment, the $A_{M \times N}$ matrix can be factored into more than two matrices (i.e., $A \approx FGH \ldots$).

The preferred method for finding the $F_{M \times L}$ and $G_{L \times N}$ matrices is to minimize the following sum of squared errors:

$$\sum_{j=1}^{M} \sum_{n=1}^{N} (A_{jn} - (F_{M \times L} \cdot G_{L \times N})_{jn})^2 \tag{16}$$

The solution to equation (16) can be derived through a singular value decomposition of the $A_{M \times N}$ matrix, comprising the steps of:

1. performing an SVD on the $A_{M \times N}$ matrix which gives the following unique factorization (assuming $M \geq N$):

$$A_{M \times N} = U_{M \times N} \cdot D_{N \times N} \cdot V_{N \times N}$$

where:

$U_{M \times N}$ is a MxN unitary matrix;
$D_{N \times N}$ is a NxN diagonal matrix $\{\sigma_1, \sigma_2, \ldots, \sigma_N\}$ where $\sigma_i$ are the singular values of $A_{M \times N}$, and $\sigma_1 \geq \sigma_2 \ldots \geq \sigma_N \geq 0$; and
$V_{N \times N}$ is a NxN unitary matrix;

2. selecting a predetermined L number of the largest singular values $\sigma$ to generate a reduced size diagonal matrix $D_{L \times L}$:

$$D_{L \times L} = Diag\{\sigma_1, \sigma_2, \ldots, \sigma_L\} = \begin{bmatrix} \sigma_1 & 0 & \ldots & 0 \\ 0 & \sigma_2 & 0 \ldots & : \\ : & \ldots & . & 0 \\ 0 & \ldots & 0 & \sigma_L \end{bmatrix}$$

3. extracting the first L columns from the $U_{M \times N}$ matrix to form a reduced $U_{M \times L}$ matrix:

$$U_{M \times L} = \left\{ \begin{bmatrix} U_{1,1} & \ldots & U_{1,L} \\ : & \ldots & \ldots \\ : & \ldots & \ldots \\ U_{M,1} & \ldots & U_{M,L} \end{bmatrix} \ldots \begin{matrix} U_{1,N} \\ : \\ : \\ U_{M,N} \end{matrix} \right\}$$

4. extracting the first L rows from the $V_{N \times N}$ matrix to form a reduced $V_{L \times N}$ matrix:

$$V_{L \times N} = \left\{ \begin{bmatrix} V_{1,1} & \ldots & V_{1,N} \\ : & \ldots & : \\ V_{L,1} & \ldots & V_{L,N} \\ : & \ldots & : \\ V_{N,1} & \ldots & V_{N,N} \end{bmatrix} \right.$$

5. defining the $F_{M \times L}$ and $G_{L \times N}$ matrices such that:

$$F_{M \times L} \cdot G_{L \times N} = U_{M \times L} \cdot D_{L \times L} \cdot V_{L \times N} \approx A_{M \times N}$$

(for example, let $F_{M \times L} = U_{M \times L} \cdot D_{L \times L}$ and $G_{L \times N} = V_{L \times N}$).

In the above cost reduced polynomial and reduced rank matrix embodiments, the interpolation filter coefficients $C_\tau(n)$ are computed in real time as a function of $\tau$; that is, the filter's impulse response h(n) is approximated according to:

$$h(n,\tau) = c_\tau(n) = \sum_{i=1}^{L} G_i(n) \cdot f(i,\tau); \text{ where:} \tag{17}$$

f(i,$\tau$) is a predetermined function in $\tau$ (e.g., polynomial in $\tau$ or $\tau$ indexes the above $F_{M \times L}$ matrix); L is a degree which determines the accuracy of the approximation (e.g., the order of the polynomial or the column size of the above $F_{M \times L}$ matrix); and $G_i$ (n) is a predetermined matrix (e.g., the coefficients of the polynomial or the above $G_{L \times N}$ matrix). As L increases, the approximated filter coefficients $C_\tau(n)$ of equation (17) tend toward the ideal coefficients derived from equation (15). It follows from equation (17) that the output of the interpolation filter Y(x) can be represented as:

$$Y(x) = \sum_{n=1}^{N} U(x-n) \sum_{i=1}^{L} G_i(n) \cdot f(i,\tau) \tag{18}$$

where U(x) are the channel sample values D106 and N is the number of interpolation filter coefficients $C_\tau(n)$.

Referring again to FIG. 6, the coefficient register file can compute the interpolation filter coefficients $C_\tau(n)$ according to equation (17) and then convolve the coefficients $C_\tau(n)$ with the channel samples U(x) D106 to generate the interpolated sample values D108 synchronized to the baud rate. However, a more efficient implementation of the interpolation filter can be achieved by rearranging equation (18):

$$Y(x) = \sum_{i=1}^{L} f(i,\tau) \sum_{n=1}^{N} G_i(n) \cdot U(x-n) \tag{19}$$

FIG. 7 shows the preferred embodiment of the interpolation filter according to equation (19). In the polynomial embodiment, the function of $\tau$ is a polynomial in $\tau$, and the matrix $G_i(n)$ are the coefficients of the polynomial. And in the reduced rank matrix embodiment, the function of $\tau$ is to index the above $F_{M \times L}$ matrix B262, and the second summation in equation (19), $$\sum_{n=1}^{N} G_i(n) \cdot U(x-n)$$

is implemented as a bank of FIR filters B260 as shown in FIG. 7. Again, in equation (19) L is the depth of the approximation function f(i,$\tau$) (e.g., the order of the polynomial or the column size of the above $F_{M \times L}$ matrix) and N is the depth of the interpolation filter's impulse response (i.e., the number of coefficients in the impulse response). It has been determined that N=8 and L=3 provides the best performance/cost balance; however, these values may increase as IC technology progresses and the cost per gate decreases.

Conventional Adaptive Equalizer

Figure 8A:
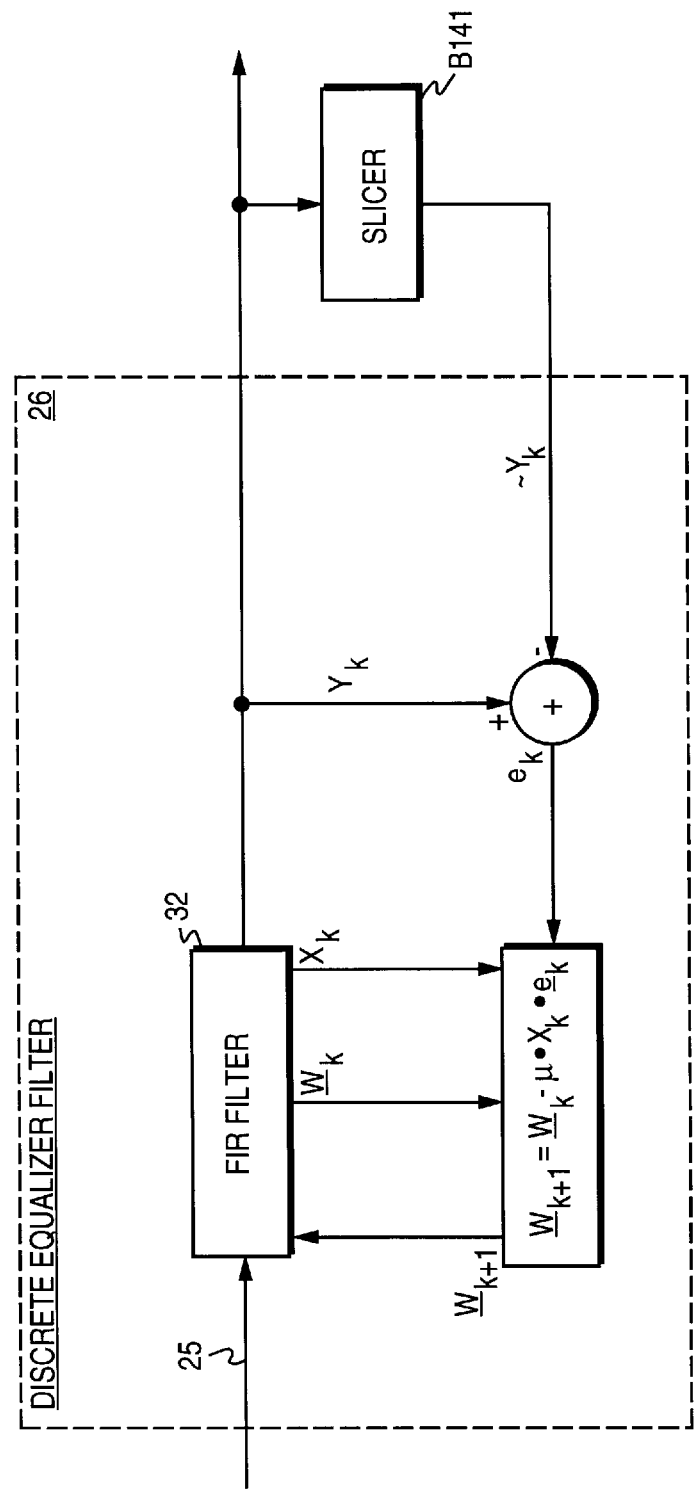
FIG. 8A is a block diagram of a conventional adaptive, discrete time equalizer filter in a sampled amplitude read channel.

FIG. 8A illustrates a prior art adaptive, discrete time equalizer that operates according to the well known least mean square (LMS) algorithm, $$W_{k+1} = W_k - \mu \cdot e_k \cdot X_k,$$

or alternatively, $$W_{k+1} = W_k - \mu \cdot X_k \cdot e_k$$

where $W_k$ represents a vector of FIR filter coefficients; $\mu$ is a programmable gain; $e_k$ represents a sample error (or vector of sample errors $e_k$) between the FIR filter's actual output and a desired output; and $X_k$ represents a vector of samples values (or a scalar $X_k$) from the FIR filter input. To better understand operation of the present invention, the second representation of the LMS algorithm is used throughout this disclosure.

The desired filter output is the estimated sample values $\sim Y_k$ at the output of slicer B141. The estimated sample values $\sim Y_k$ are subtracted from the FIR filter's output $Y_k$ to generate the sample error $e_k$. The LMS algorithm attempts to minimize the sample error in a least mean square sense by adapting the FIR filter coefficients; that is, it adjusts the FIR filter's gain and phase response so that the overall channel response adequately tracks the desired partial response (e.g., PR4, EPR4, EEPR4, etc.).

As previously mentioned, interference from the timing recovery 28 and gain control 50 loops of FIG. 1 can prevent the adaptive, discrete time equalizer 26 from converging to an optimal state. For example, a phase adjustment in the adaptive equalizer 26 can affect the sampling phase error for timing recovery 28. Timing recovery 28 compensates for the filter's phase adjustment by adjusting its sampling phase; this adjustment can result in yet another phase adjustment by the adaptive equalizer 26. Thus, the phase response of the adaptive equalizer may never converge. Similarly, the gain control loop 50 can interfere with the gain response of the adaptive equalizer 26 and prevent it from converging.

Constrained Adaptive Equalizer

Figure 8B:
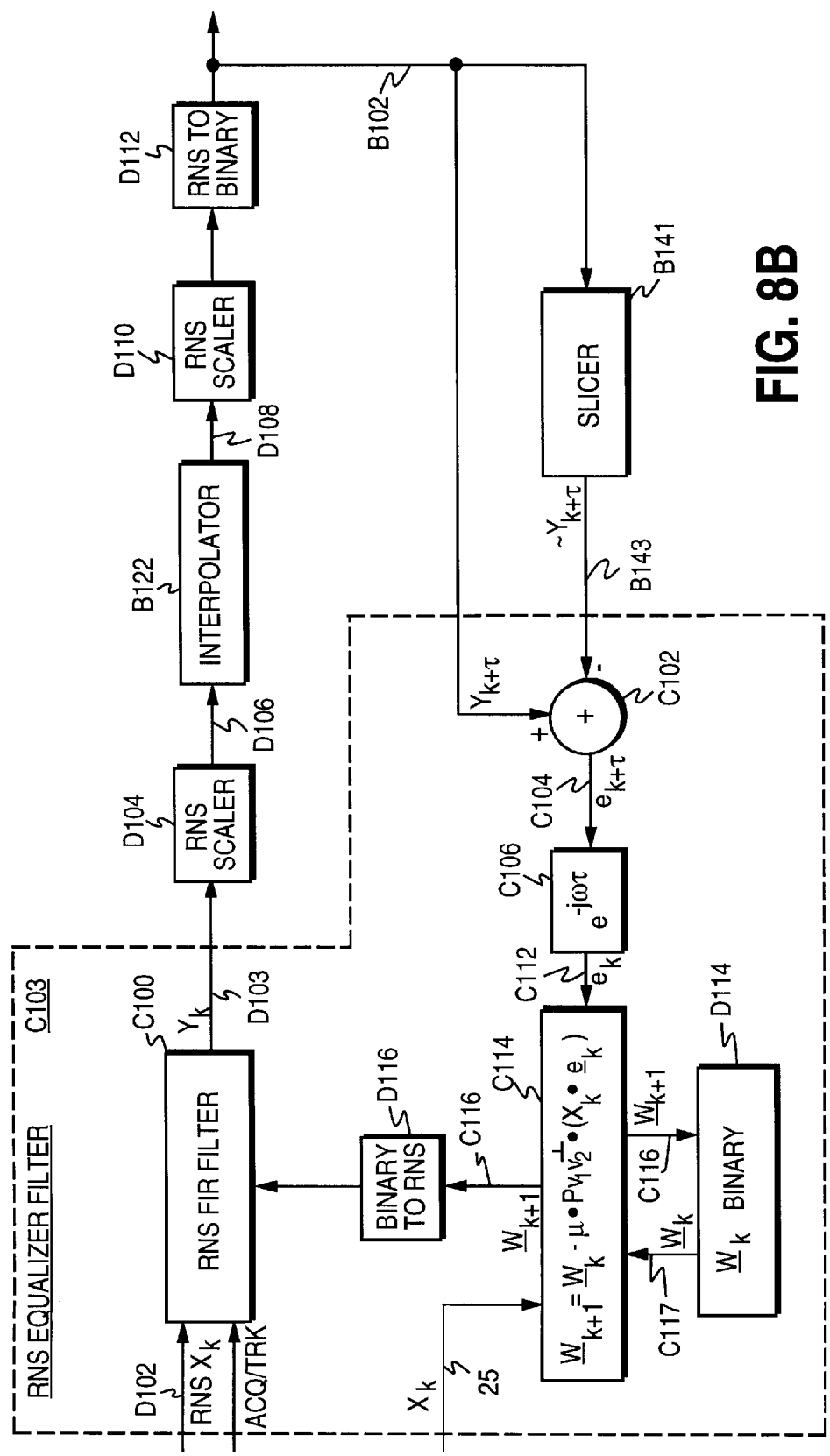
FIG. 8B shows the adaptive, discrete time equalizer of the present invention implemented according to an residue number system representation.

FIG. 8B illustrates operation of an adaptive, residue number system (RNS) equalizer filter C103 (see FIG. 3) according to an aspect of the present invention. Implementation details of the RNS FIR filter C100, RNS converters, and RNS scalers are provided below; operation of the adaptive algorithm is as follows.

The sample values output by the A/D converter 24 are converted into an RNS representation D102 by binary-to-RNS converter D100 (see FIG. 3). The RNS sample values D102 are then input into a discrete time RNS FIR filter C100 comprising a predetermined number of coefficients, the values of which determine the filter's gain and phase response. Because the RNS FIR filter C100 operates on the sample values prior to the interpolated timing recovery loop B100, its order can be increased over the prior art without adversely affecting the latency of timing recovery (i.e., the number of filter coefficients can be increased).

After equalization, the output $Y_k$ D103 of the RNS FIR filter C100 is scaled by RNS scaler D104 to avoid overflow. The scaled RNS sample values D106 are input into the timing recovery interpolator B122 for generating interpolated RNS sample values D108 substantially synchronized to the baud rate. The interpolated RNS sample values D108 are again scaled by RNS scaler D110, and the rescaled RNS samples converted D112 back into a binary representation. The interpolated binary samples B102 are then input into a slicer B141 (FIG. 4B) which generates estimated sample values $\sim Y_{k+\tau}$ B143. The estimated sample values $\sim Y_{k+\tau}$ B143 are subtracted from the interpolated sample values $Y_{k+\tau}$ B102 at adder C102 to generate a sample error value $e_{k+\tau}$ C104 synchronized to the baud rate rather than the sample rate. Because the LMS algorithm operates on sample values $X_k$ at the sample rate, it is necessary to convert the error value $e_{k+\tau}$ C104 into an error value $e_k$ C112 synchronized to the sample rate. This is accomplished by an interpolation circuit C106 which computes an interpolated error value $e_k$ C112 from the baud rate error values $e_{k+\tau}$ C104. Preferably, the error value interpolation circuit C106 is implemented as a first order linear interpolation, but it may be a simple zero order hold, or a more complex interpolation filter as described above.

Figure 8C:
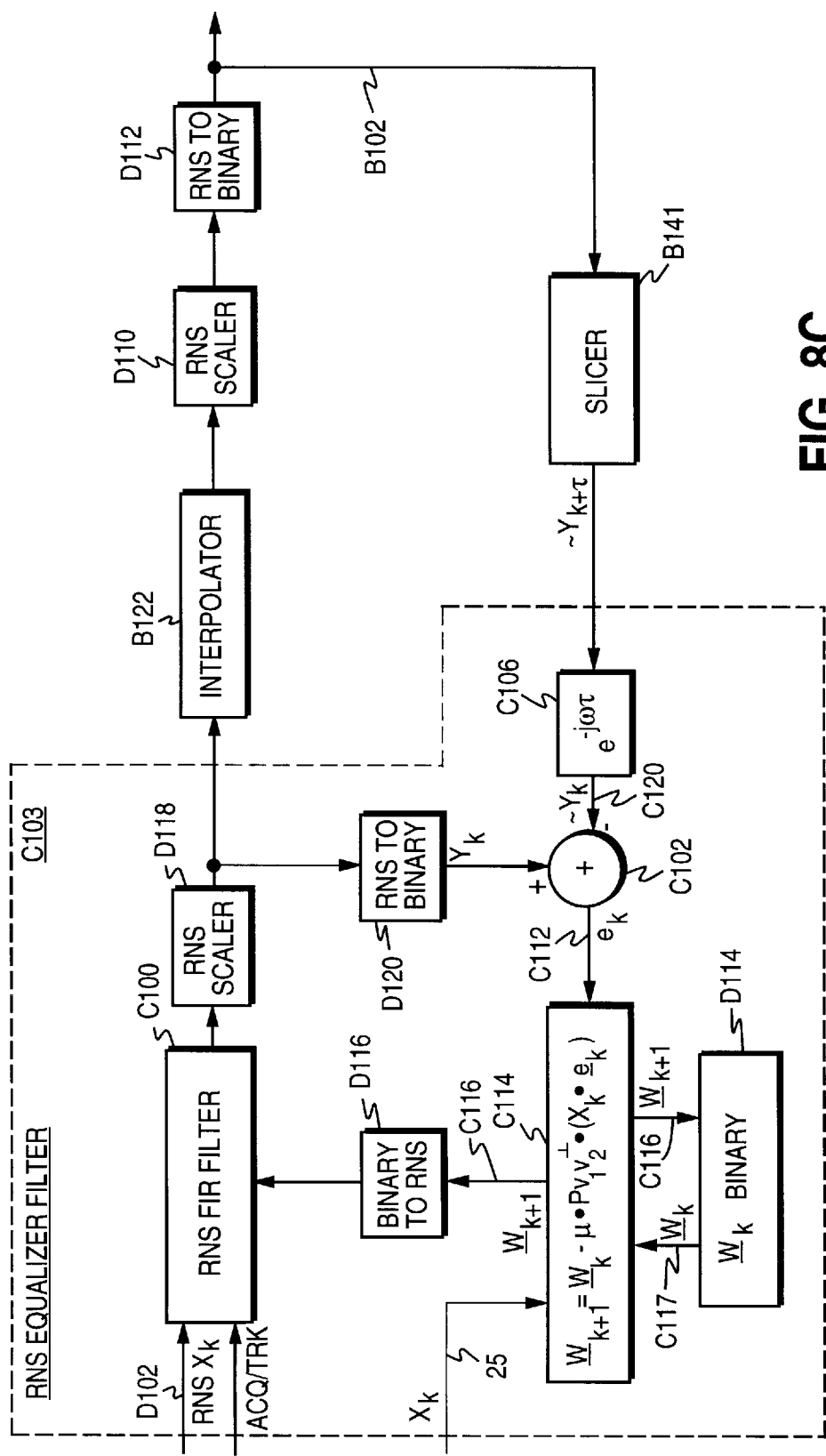
FIG. 8C shows an alternative embodiment for the adaptive, discrete time equalizer of the present invention.

FIG. 8C shows an alternative embodiment for generating the error value $e_k$. As illustrated, the estimated ideal sample values $\sim Y_{k+\tau}$ from the slicer B141 are interpolated by the interpolation circuit C106 to generate estimated ideal sample values $\sim Y_k$ C120 which are subtracted C102 from the equalized sample values $Y_k$ (after scaling D118 and converting D120 the RNS samples to a binary representation) to generate the error value $e_k$.

In both embodiments of FIG. 8B and 8C, the error value $e_k$ C112 is input into a modified LMS circuit C114 which computes updated filter coefficients $W_{k+1}$ C116 according to, $$W_{k+1} = W_k - \mu \cdot Pv_1v_2^\perp \cdot (X_k \cdot e_k)$$

where the operation $Pv_1v_2^\perp$ is an orthogonal projection operation which constrains the gain and phase response of the RNS FIR filter C100 in order to attenuate interference from the gain and timing loops.

The LMS circuit C114 operates according to a binary representation; that is, it uses the binary sample values 25 output by the A/D 24 and a binary error value $e_k$ C112 to computed updated binary coefficients $W_{k+\tau}$ C116. A register D114 retains the current values for binary coefficients $W_k$ C117 which are loaded into the LMS circuit C114 over line C117 during an update operation. The updated binary filter coefficients $W_{k+1}$ C116 are converted D116 into an RNS representation for use by the RNS FIR filter C100, and they are also restored to register D114 for use during the next update operation.

Figure 9A:
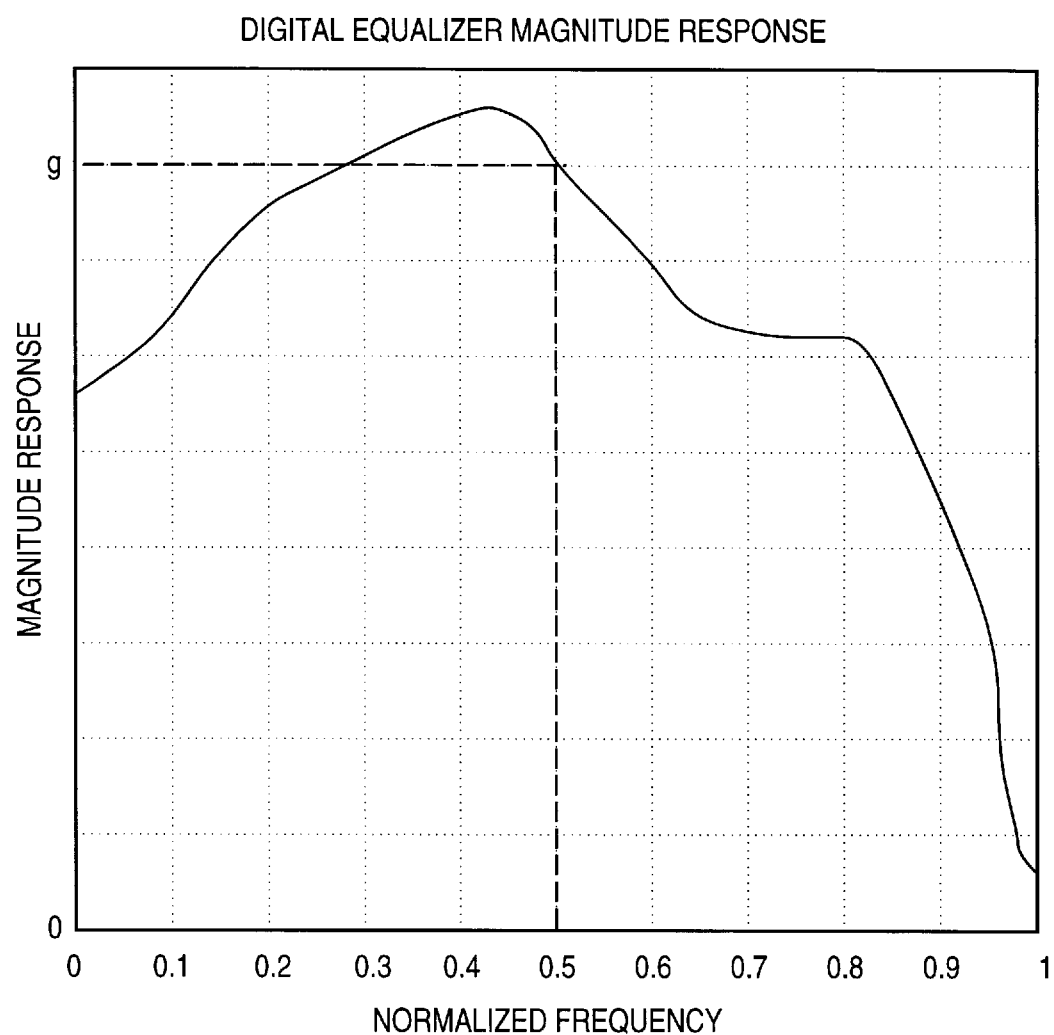
FIG. 9A illustrates the present invention adaptive filter's gain response constrained at a normalized frequency of 1/4T.
Figure 9B:
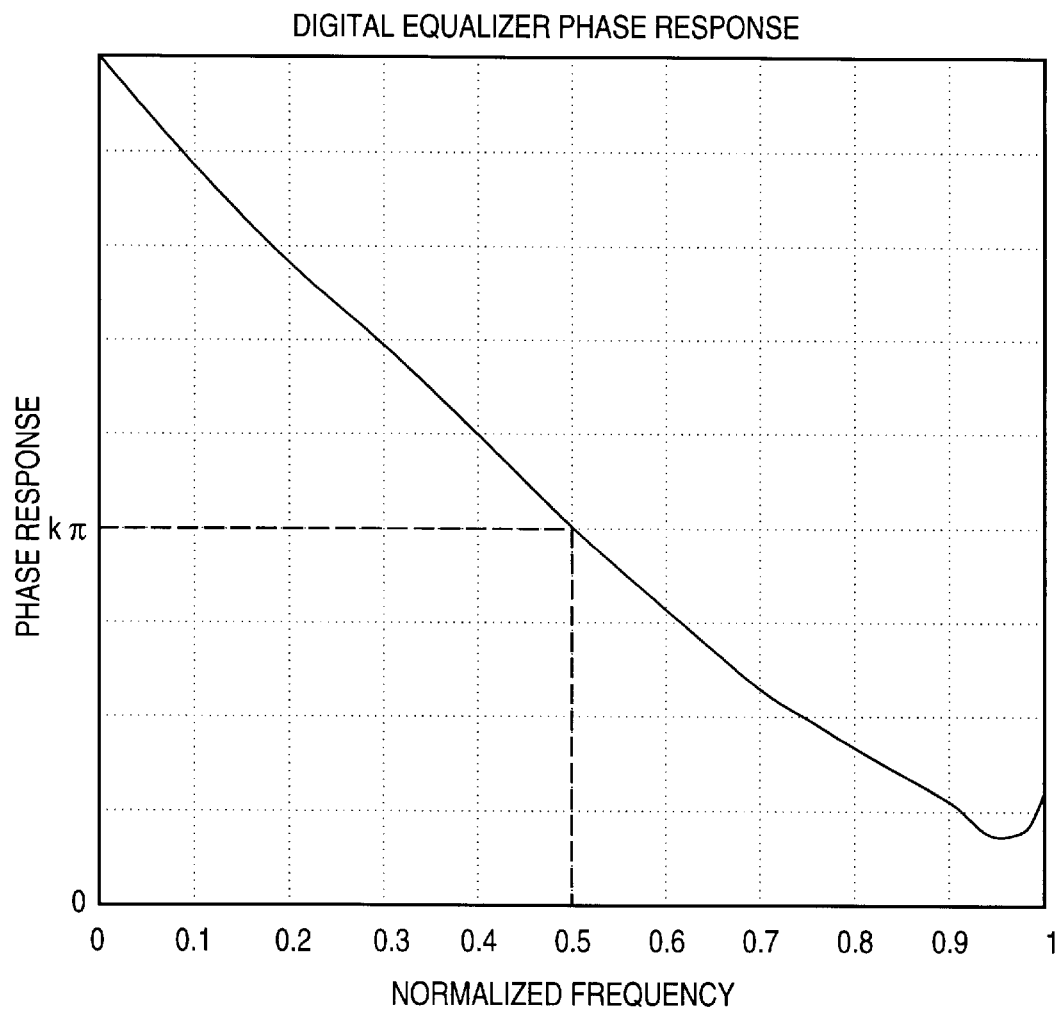
FIG. 9B shows the present invention adaptive filter's phase response constrained at a normalized frequency of 1/4T.

Operation of the orthogonal projection operation $Pv_1v_2^\perp$ will now be described in relation to the gain and phase response of the FIR filter C100. FIGS. 9A and 9B show an example gain and phase response, respectively, for the FIR filter C100 of the present invention. The gain and phase response vary over time as the filter adapts to parameter changes in the recording system; that is, the filter continuously adjusts the channel's overall frequency response so that it matches the desired partial response (PR4, EPR4, EEPR4, etc.) as best possible. In the present invention, interference from the timing recovery and gain control loops is attenuated by constraining the gain and phase response of the FIR filter C100 at a predetermined frequency using an orthogonal projection operation $Pv_1v_2^\perp$.

Referring again to FIG. 9A, the gain (magnitude) response of the FIR filter C100 has been constrained to a predetermined value (denoted by g) at the normalized frequency of 0.5 (1/4Ts). Similarly, the phase response of the FIR filter C100 has been constrained to $k\pi$ at the normalized frequency of 0.5 as shown in FIG. 9B. In effect, these constraints allow the gain and phase to vary (adapt) at all frequencies except at the normalized frequency of 0.5, thereby constraining the filter's frequency response in a manner that attenuates interference from the gain and timing loops. The gain constraint g is relatively arbitrary except that it is selected to optimize the dynamic range of the filter's coefficients. However, constraining the filter's response at the normalized frequency of 0.5 and selecting a phase constraint of $k\pi$ reduces the complexity of the orthogonal projection operation $Pv_1v_2^\perp$, and simplifies implementation of the zero phase start circuit B163 (FIG. 4B) and sync mark detector 66 (FIG. 1).

As mentioned above, the zero phase start circuit B163 (FIG. 4B) minimizes the initial phase error between the interpolated sample values and the baud rate at the beginning of acquisition by computing an initial phase error $\tau$ from the A/D 24 sample values 25 and then loading this initial phase error into the modulo-Ts accumulator B120. To compute the initial phase error $\tau$, the zero phase start circuit B163 must take into account the phase delay of the adaptive equalizer filter C103 since interpolated timing recovery B100 operates on the equalized samples D106, not the A/D 24 samples 25. With the acquisition preamble 68 (FIG. 2B)

having a frequency of 1/4T (i.e., 0.5 normalized), constraining the phase response of the adaptive equalizer C103 at the preamble frequency (1/4Ts) fixes the phase delay of the equalizer C103 during acquisition, thereby allowing the zero phase start circuit B163 to accurately compute the initial phase error τ. Furthermore, since the phase constraint at the preamble frequency is fixed at kπ, the phase delay of the equalizer C103 will either be zero or 180° (i.e., the adjustment to the initial phase error is nothing or a sign change).

Constraining the phase response of the adaptive equalizer C103 to kπ at the preamble frequency also simplifies implementation of the sync mark detector 66 (FIG. 1) in sampled amplitude read channels that use the conventional synchronous sampling timing recovery 28 (FIG. 4A) rather than interpolated timing recovery B100 (FIG. 4B). Operation of the sync mark detector 66 is described in detail in U.S. patent application Ser. No. 08/533,797 entitled "Improved Fault Tolerant Sync Mark Detector For Sampled Amplitude Magnetic Recording." As described therein, the sync mark detector 66 is enabled coherent with the end of the acquisition preamble 68 and relative to the transport delay from the output of the A/D 24 to the sync mark detector 66. With an adaptive equalizer, the transport delay will vary unless the filter's phase response is constrained at the acquisition preamble frequency by, for example, using an orthogonal projection operation $Pv_1v_2^\perp$ of the present invention.

Turning now to the implementation details of the orthogonal projection operation $Pv_1v_2^\perp$, the equalizer's frequency response is $$C(e^{j2\pi f}) = \sum_k C_k e^{-jk2\pi fT}$$

where $C_k$ are the coefficients of the equalizer's impulse response. At the preamble frequency (1/4T), the equalizer's frequency response is $$C(e^{j\frac{\pi}{2}}) = \sum_k C_k e^{-jk\frac{\pi}{2}}$$

where the sampling period has been normalized to T=1. In matrix form, the equalizer's frequency response at the preamble frequency is, $$C(e^{j\frac{\pi}{2}}) = \underline{C}^T \begin{bmatrix} (e^{j\frac{\pi}{2}})^0 \\ (e^{j\frac{\pi}{2}})^{-1} \\ \cdot \\ \cdot \\ \cdot \\ (e^{j\frac{\pi}{2}})^{-(N-1)} \end{bmatrix} = \underline{C}^T \begin{bmatrix} (j)^0 \\ (j)^{-1} \\ \cdot \\ \cdot \\ \cdot \\ (j)^{-(N-1)} \end{bmatrix} = \underline{C}^T \begin{bmatrix} 1 \\ -j \\ -1 \\ j \\ \cdot \\ \cdot \\ \cdot \end{bmatrix}$$

Those skilled in the art will recognize that shifting the time base will lead to four different, but functionally equivalent, frequency responses at the preamble frequency (i.e., [1,-j,-1,j, . . . ]C, [-j,-1,j,1, . . . ]C, [-1,j,1,-j, . . . ]C and [j,1,-j,-1, . . . ]C). Constraining the phase response of the equalizer C103 to an integer multiple of π at the preamble frequency (1/4T) implies that the imaginary component of its frequency response is zero, $$\underline{C}^T \begin{bmatrix} 0 \\ -1 \\ 0 \\ 1 \\ \cdot \\ \cdot \\ \cdot \end{bmatrix} = \underline{C}^T \cdot V_1 = 0$$

If the imaginary component of the frequency response is constrained to zero, as described above, then constraining the magnitude of the equalizer to g at the preamble frequency (1/4T) implies that the real component of the frequency response equals g, $$\underline{C}^T \begin{bmatrix} 1 \\ 0 \\ -1 \\ 0 \\ \cdot \\ \cdot \\ \cdot \end{bmatrix} = \underline{C}^T \cdot V_2 = g$$

Therefore, the equalizer's coefficients $C_k$ must be constrained to satisfy the following two conditions:

$$C^T \cdot V_1 = 0 \text{ and } C^T \cdot V_2 = g.$$

The above constraints are achieved by multiplying the computed gradient $X_k \cdot e_k$ by an orthogonal projection operation $Pv_1v_2^\perp$ as part of a modified LMS algorithm C114.

Figure 10:
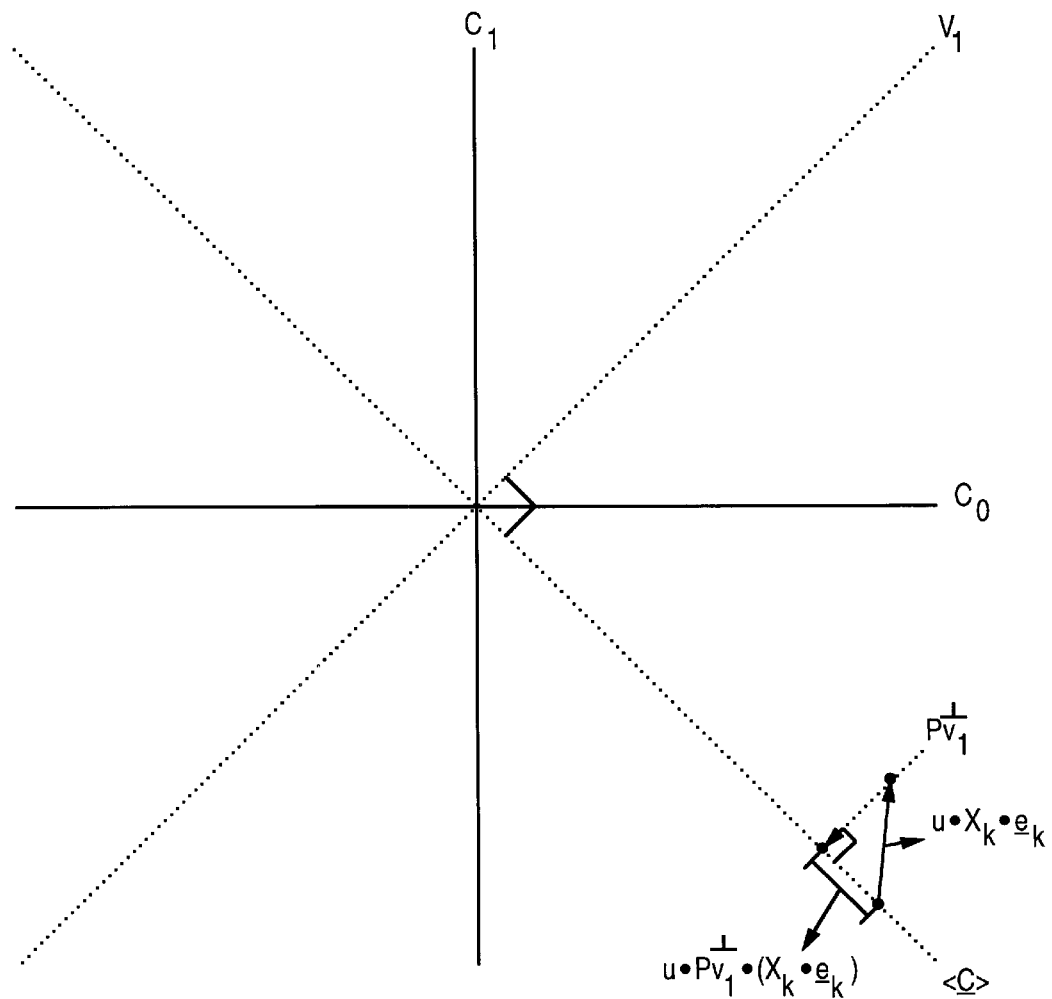
FIG. 10 illustrates operation of an orthogonal projection operation of the present invention for constraining the gain and phase response of the adaptive filter.

To understand the operation of the orthogonal projection operation, consider an equalizer that comprises only two coefficients: $C_0$ and $C_1$ as shown in FIG. 10. The phase constraint condition $C^T \cdot V_1 = 0$ implies that the filter coefficient vector $C^T$ must be orthogonal to $V_1$. When using an unmodified LMS algorithm to update the filter coefficients, the orthogonal constraint is not always satisfied as shown in FIG. 10. The present invention, however, constrains the filter coefficients to a subspace <C> which is orthogonal to $V_1$ by multiplying the gradient values $X_k \cdot e_k$ by a projection operation $Pv_1^\perp$, where the null space of the projection operation $Pv_1^\perp$ is orthogonal to <C>. The updated coefficients correspond to a point on the orthogonal subspace <C> closest to the coefficients derived from the unmodified LMS algorithm as shown in FIG. 10.

Similar to the phase constraint projection operation $Pv_1^\perp$, a second orthogonal projection operation $Pv_2^\perp$ constrains the filter coefficients such that the coefficient vector $C_T$ satisfies the above gain constraint: $C_T \cdot V_2 = g$. The combined orthogonal projection operation $Pv_1v_2^\perp$ eliminates two degrees of freedom in an N-dimensional subspace where N is the number of filter coefficients (i.e., the orthogonal projection operation $Pv_1v_2^\perp$ has a rank of N−2).

An orthogonal projection operation for $V_1$ and $V_2$ can be computed according to $$Pv_x^\perp = I - Pv_x = I - V_x(V_x^T V_x)^{-1} V_x^T \tag{20}$$

where $Pv_1v_2^\perp = Pv_1^\perp \cdot Pv_2^\perp$ since $V_1$ is orthogonal to $V_2$. The orthogonal projection operation $Pv_1v_2^\perp$ computed using the above equation for an equalizer comprising ten filter coefficients is a matrix:

$$Pv_1v_2^\perp = \begin{bmatrix} 4 & 0 & 1 & 0 & -1 & 0 & 1 & 0 & -1 & 0 \\ 0 & 4 & 0 & 1 & 0 & -1 & 0 & 1 & 0 & -1 \\ 1 & 0 & 4 & 0 & 1 & 0 & -1 & 0 & 1 & 0 \\ 0 & 1 & 0 & 4 & 0 & 1 & 0 & -1 & 0 & 1 \\ -1 & 0 & 1 & 0 & 4 & 0 & 1 & 0 & -1 & 0 \\ 0 & -1 & 0 & 1 & 0 & 4 & 0 & 1 & 0 & -1 \\ 1 & 0 & -1 & 0 & 1 & 0 & 4 & 0 & 1 & 0 \\ 0 & 1 & 0 & -1 & 0 & 1 & 0 & 4 & 0 & 1 \\ -1 & 0 & 1 & 0 & -1 & 0 & 1 & 0 & 4 & 0 \\ 0 & -1 & 0 & 1 & 0 & -1 & 0 & 1 & 0 & 4 \end{bmatrix}$$

The above matrix $Pv_1v_2^\perp$ is an orthogonal projection matrix scaled by 5 (multiplied by 5) so that it contains integer valued elements which simplifies multiplying by $X_k \cdot e_k$ in the LMS update equation, $$W_{k+1} = W_k - \mu \cdot Pv_1v_2^\perp \cdot (X_k \cdot e_k). \quad (21)$$

The scaling factor is taken into account in the selection of the gain value $\mu$. Constraining the gain to g and the phase to $k\pi$ at the normalized frequency of 0.5 simplifies implementing the orthogonal projection matrix $Pv_1v_2^\perp$: half of the elements are zero and the other half are either +1, -1, or +4. Thus, multiplying the projection matrix $Pv_1v_2^\perp$ by the gradient values $X_k \cdot e_k$ requires only shift registers and adders.

The ACQ/TRK signal shown in FIG. 8B disables adaptation of the FIR filter during acquisition, that is, while acquiring the acquisition preamble 68 shown in FIG. 2B. Thus, the adaptive equalizer C103 executes the LMS adaptive algorithm only after acquiring the acquisition preamble 68.

Reduced Cost Orthogonal Constraint Matrix

Even though the above orthogonal projection matrix $Pv_1v_2^\perp$ has a simple structure wherein half of the elements are zero, it may not be cost effective to directly implement it due to the significant number of shift and accumulate operations necessary to compute $Pv_1v_2^\perp \cdot (X_k \cdot e_k)$. In order to reduce the cost and complexity, an alternative embodiment of the present invention decimates the modified LMS adaptation algorithm C114 as illustrated in FIGS. 11A, 11B, 11C and 11D.

A mathematical basis for the circuit of FIG. 11A will be discussed before describing the details of operation. Referring again to the above equation (20), $$Pv_x^\perp = I - Pv_x = I - V_x(V_x^T V_x)^{-1} V_x^T$$

by combining the above $V_1$ and $V_2$ vectors into a N×2 matrix $$V = \begin{bmatrix} +1 & 0 \\ 0 & -1 \\ -1 & 0 \\ 0 & +1 \\ \cdot & \cdot \\ \cdot & \cdot \\ \cdot & \cdot \end{bmatrix}$$

(those skilled in the art will recognize that shifting the time base provides four alternatives for the V matrix) then the operation $(V_x^T V_x)^{-1}$ of equation (20) reduces to $$\begin{bmatrix} \frac{1}{5} & 0 \\ 0 & \frac{1}{5} \end{bmatrix} = \frac{1}{5} I$$

Thus, equation (20) reduces to $$Pv^\perp = I - 1/5 \cdot VV^T. \quad (22)$$

Multiplying both sides of equation (22) by 5 provides $$5 \cdot Pv^\perp = 5 \cdot I - VV^T. \quad (23)$$

Referring again to equation (21), $$W_{k+1} = W_k - \mu \cdot Pv_1v_2^\perp \cdot (X_k \cdot e_k)$$

setting $X_k \cdot e_k = g_k$ reduces equation (21) to $$W_{k+1} = W_k - \mu \cdot Pv^\perp \cdot g_k = W_k - \mu \cdot [5 \cdot g_k - vv^T \cdot g_k]. \quad (24)$$

Defining $\delta = v^T \cdot g_k$ $$\begin{bmatrix} +1 & 0 & -1 & 0 & \ldots \\ 0 & -1 & 0 & +1 & \ldots \end{bmatrix} \begin{bmatrix} g_0 \\ g_1 \\ g_2 \\ g_3 \\ \cdot \\ \cdot \\ \cdot \end{bmatrix} = \begin{bmatrix} \delta_0 \\ \delta_1 \end{bmatrix} \quad (25)$$

that is, $\delta_0 = g_0 - g_2 + \ldots$ and $\delta_1 = -g_1 + g_3 - \ldots$, then computing $vv^T \cdot g_k$ $$\begin{bmatrix} +1 & 0 \\ 0 & -1 \\ -1 & 0 \\ 0 & +1 \\ \cdot & \cdot \\ \cdot & \cdot \\ \cdot & \cdot \end{bmatrix} \begin{bmatrix} \delta_0 \\ \delta_1 \end{bmatrix} = \begin{bmatrix} +\delta_0 \\ -\delta_1 \\ -\delta_0 \\ +\delta_1 \\ \cdot \\ \cdot \\ \cdot \end{bmatrix} \quad (26)$$

and computing $5 \cdot g_k - vv^T \cdot g_k$ provides $$5 \cdot g_k - \begin{bmatrix} +\delta_0 \\ -\delta_1 \\ -\delta_0 \\ +\delta_1 \\ \cdot \\ \cdot \\ \cdot \end{bmatrix} = \begin{bmatrix} 5g_0 - \delta_0 \\ 5g_1 + \delta_1 \\ 5g_2 + \delta_0 \\ 5g_3 - \delta_1 \\ \cdot \\ \cdot \\ \cdot \end{bmatrix} \quad (27)$$

Figure 11A:
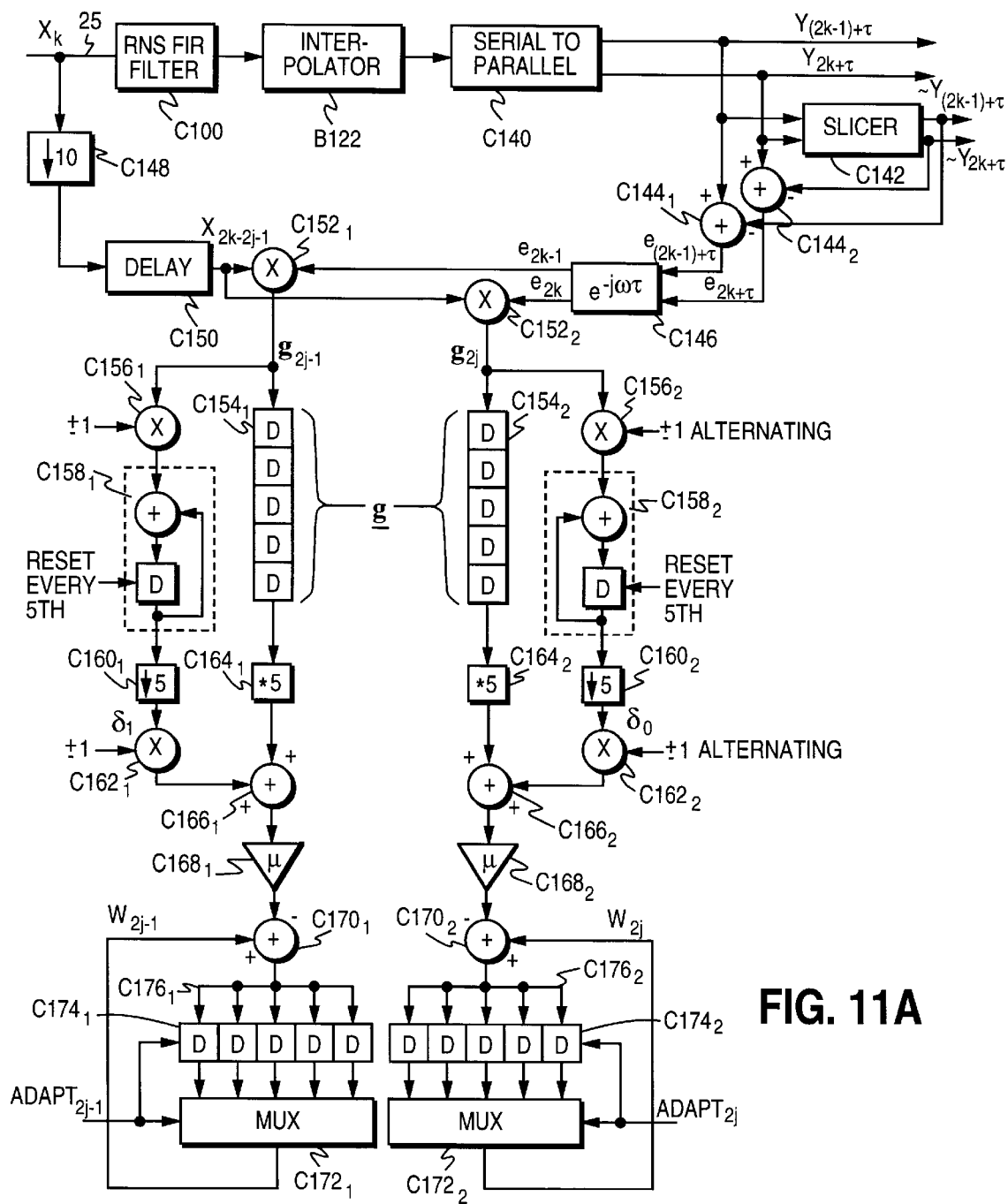
FIG. 11A shows an implementation for a reduced cost orthogonal projection operation.

FIG. 11A implements the above equations (25), (26), (27) and ultimately equation (21) in order to update the coefficients of the equalizer filter C100 according to the modified LMS adaptation algorithm of the present invention. To further reduce the implementation cost, the circuit of FIG. 11A decimates the adaptation algorithm by the number of filter coefficients (10 in the example shown); that is, the adaptation algorithm operates only on every tenth sample value rather than on every sample value and updates only one filter coefficient per clock period. This is illustrated by expanding equation (24)

$$\begin{bmatrix} W_{(k+1)0} \\ W_{(k+2)1} \\ W_{(k+3)2} \\ W_{(k+4)3} \\ \cdot \\ \cdot \\ \cdot \end{bmatrix} = \begin{bmatrix} W_{(k+0)0} \\ W_{(k+1)1} \\ W_{(k+2)2} \\ W_{(k+3)3} \\ \cdot \\ \cdot \\ \cdot \end{bmatrix} - \mu \cdot \begin{bmatrix} 5g_{(k+0)0} - \delta_{(k+0)0} \\ 5g_{(k+1)1} + \delta_{(k+1)1} \\ 5g_{(k+2)2} + \delta_{(k+2)0} \\ 5g_{(k+3)3} - \delta_{(k+3)1} \\ \cdot \\ \cdot \\ \cdot \end{bmatrix} \quad (28)$$

where k+iis the clock period and $g_{(i)j}=X_{i-j} \cdot e_i$. Thus, at each clock period, the next gradient value $g_{(i)j}$ can be computed by multiplying a sample value latched every tenth clock cycle by the next error value $e_i$. The new gradient $g_{(i)j}$ is then used to update the corresponding filter coefficient $W_{(i)j}$ of equation (28).

Referring now to the circuit shown in FIG. 11A, the sample values $X_k$ are input into the discrete time RNS equalizer filter C100 and the equalized sample values input into the interpolator B122 similar to FIG. 8B. A serial-to-parallel circuit C140 converts the interpolated sample values $Y_{k+\tau}$ into even and odd subsequences $Y_{2k-\tau}$ and $Y_{(2k-1)-\tau}$, where the notation 2k indicates that two new interpolated sample values are output from the serial-to-parallel circuit C140 at every other sample period. A slicer C142 generates the corresponding even and odd estimated subsequences $\sim Y_{2k+\tau}$ and $\sim Y_{(2k-1)+\tau}$ which are subtracted from the interpolated sample values at respective adders (C144$_1$,C144$_2$) to form an even and odd sample error sequences $e_{2k+\tau}$ and $e_{(2k-1)+\tau}$. An error value interpolation circuit C146, similar to that of FIG. 8B, generates the even and odd sample error sequences $e_{2k}$ and $e_{(2k-1)}$ which are synchronized to the A/D sample rate.

As mentioned above, the circuit of FIG. 11A decimates the adaptation algorithm of the present invention by the number of coefficients in the equalizer filter C100. For the example shown, the equalizer filter C100 has 10 filter coefficients; accordingly, a decimate by 10 circuit C148 loads a sample value into a delay register C150 every tenth sample period. Thereafter, the output of delay register C150 is represented by $X_{2k-2j-1}$ where: j=1→5 incremented by 2 at every other sample period. The output of the delay register C150 $X_{2k-2j-1}$ is multiplied by the sample errors $e_{2k}$ and $e_{(2k-1)}$ at respective multipliers (C152$_1$,C152$_2$) to form the gradient values $g_{2j}$ and $g_{2j-1}$ used in equation (24).

The gradient values $g_{2j}$ and $g_{2j-1}$ are then shifted into respective shift registers (C154$_1$,C154$_2$). To implement equation (27), the gradient values $g_{2j}$ and $g_{2j-1}$ are multiplied by respective alternating ±1 (C156$_1$,C156$_2$) and accumulated in respective accumulators (C158$_1$,C158$_2$). After accumulating 5 gradient values in each accumulator (C158$_1$, C158$_2$), the outputs of the accumulators (which represent $\delta_0$ and $\delta_1$ of equation (25)) are latched by respective decimate by 5 circuits (C160$_1$,C160$_2$) and the accumulators (C158$_1$, C158$_2$) are reset. The values $\delta_0$ and $\delta_1$ are then multiplied by respective alternating ±1 (C162$_1$,C162$_2$) to implement equation (26). The gradient values $g_{2j}$ and $g_{2j-1}$ at the outputs of the shift register (C154$_1$,C154$_2$) are multiplied by 5 (C164$_1$, C164$_2$) and the values $\delta_0$ and $\delta_1$ are subtracted therefrom at adders (C166$_1$,C166$_2$) in order to implement equation (27).

To finish the adaptive update algorithm (i.e., to implement equation (28)), the output of adders (C166$_1$,C166$_2$) are scaled by a gain factor $\mu$ (C168$_1$,C168$_2$) which is reduced by a factor of 5 to account for the scaled up projection operator. The output of the gain factor $\mu$ (C168$_1$,C168$_2$) is subtracted at adders (C170$_1$,C170$_2$) from the corresponding filter coefficient (W$_{2j-1}$,W$_{2j}$) selected by a multiplexor (C172$_1$,C172$_2$) from a bank of registers (C174$_1$,C174$_2$). The ADAPT$_{2j}$ signal selects the 2j$^{th}$ coefficient from the bank of registers (C174$_1$,C174$_2$) for updating. After subtracting the update value, the updated filter coefficient (C176$_1$,C176$_2$) is restored to the bank of registers (C174$_1$,C174$_2$) and used by the equalizer filter C100 during the next clock period to equalize the sample values according to its updated spectrum.

Figure 11B:
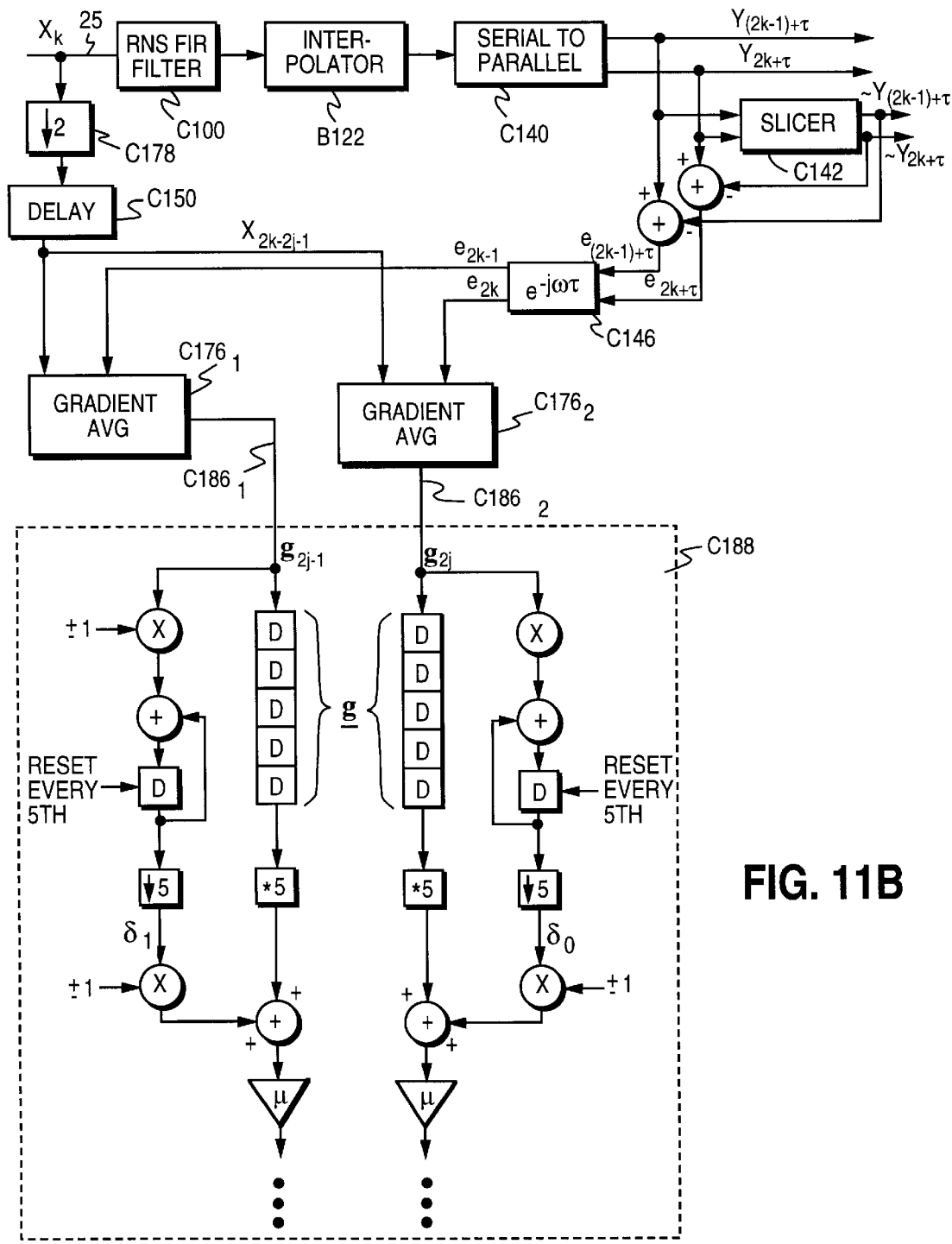
FIG. 11B shows an alternative embodiment for the reduced cost orthogonal projection operation.
Figure 11C:
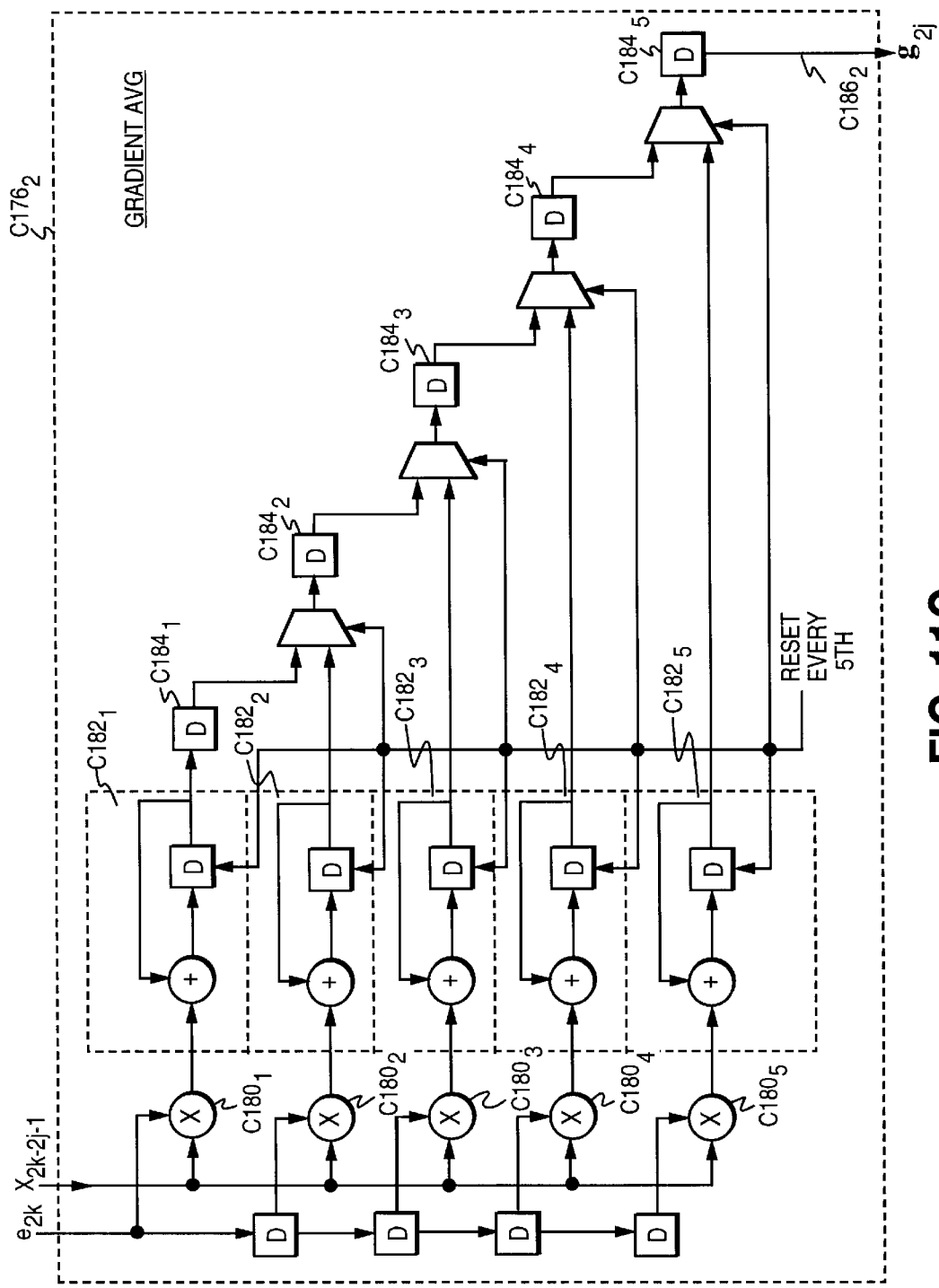
FIG. 11C illustrates an implementation for a gradient averaging circuit used in the reduced cost orthogonal projection operation of FIG. 11B.

Decimating the update algorithm by the number of filter coefficients, as in FIG. 11A, decreases the implementation complexity but at the cost of slowing convergence of the equalizer filter C100 toward an optimum setting. This is because the decimated update algorithm does not use all of the sample values to compute the gradients $g_j$. FIGS. 11B and 11C show an alternative embodiment of the decimated update algorithm of the present invention wherein more of the sample values are used to compute the gradients $g_j$, which adds complexity but improves performance because the equalizer filter C100 converges faster.

The circuit in FIG. 11B operates similar to the circuit in FIG. 11A described above except for the addition of respective gradient averaging circuits (C176$_1$,C176$_2$) which compute an averaged gradient $g_{2j-1}$ and $g_{2j}$ over several sample values, $$g_{2kj} = \frac{1}{N} \sum_{n=0}^{N-1} e_{2k-n} \cdot X_{2k-2j-n} \quad (29)$$

where N is a predetermined number of sample values out of the number of equalizer filter taps. In one embodiment, all of the sample values could be used (i.e., a number of sample values equal to the number filter taps), or in an alternative embodiment, a decimated number of sample values could be used in order to reduce the complexity and cost.

FIG. 11C shows an embodiment of the gradient averaging circuits (C176$_1$,C176$_2$) wherein the number of sample values is decimated by 2; that is, 5 out of the 10 sample values corresponding to the 10 equalizer filter taps are used to compute the averaged gradients $g_{2j-1}$ and $g_{2j}$.

In operation, a decimate by 2 circuit C178 of FIG. 11B stores every other sample value in the delay register C150. The output of the delay register C150 is multiplied (C180$_1$–180$_5$) by the error value $e_{2k}$ and delayed versions of the error value $e_{2k-n}$, and the results are accumulated in accumulators (C182$_1$–182$_5$). After accumulating five gradients, the contents of the accumulators (C182$_1$–182$_5$) are transferred to registers (C184$_1$–184$_5$), and the accumulators (C182$_1$–182$_5$) are cleared. Then, at every other sample period, the contents of registers (C184$_1$–184$_5$) are shifted from left to right (i.e., C184$_5$=C184$_4$; C184$_4$=C184$_3$; etc.) and the output of register C184$_5$ is the averaged gradient $g_{2j}$ output by the gradient averaging circuit (C176$_1$,C176$_2$). The averaged gradients $g_{2j}$ and $g_{2j-1}$ (C186$_1$,C186$_2$) are then used to update the coefficients of the equalizer filter C100 using circuitry C188 in the same manner as described with reference to FIG. 11A.

Figure 11D:
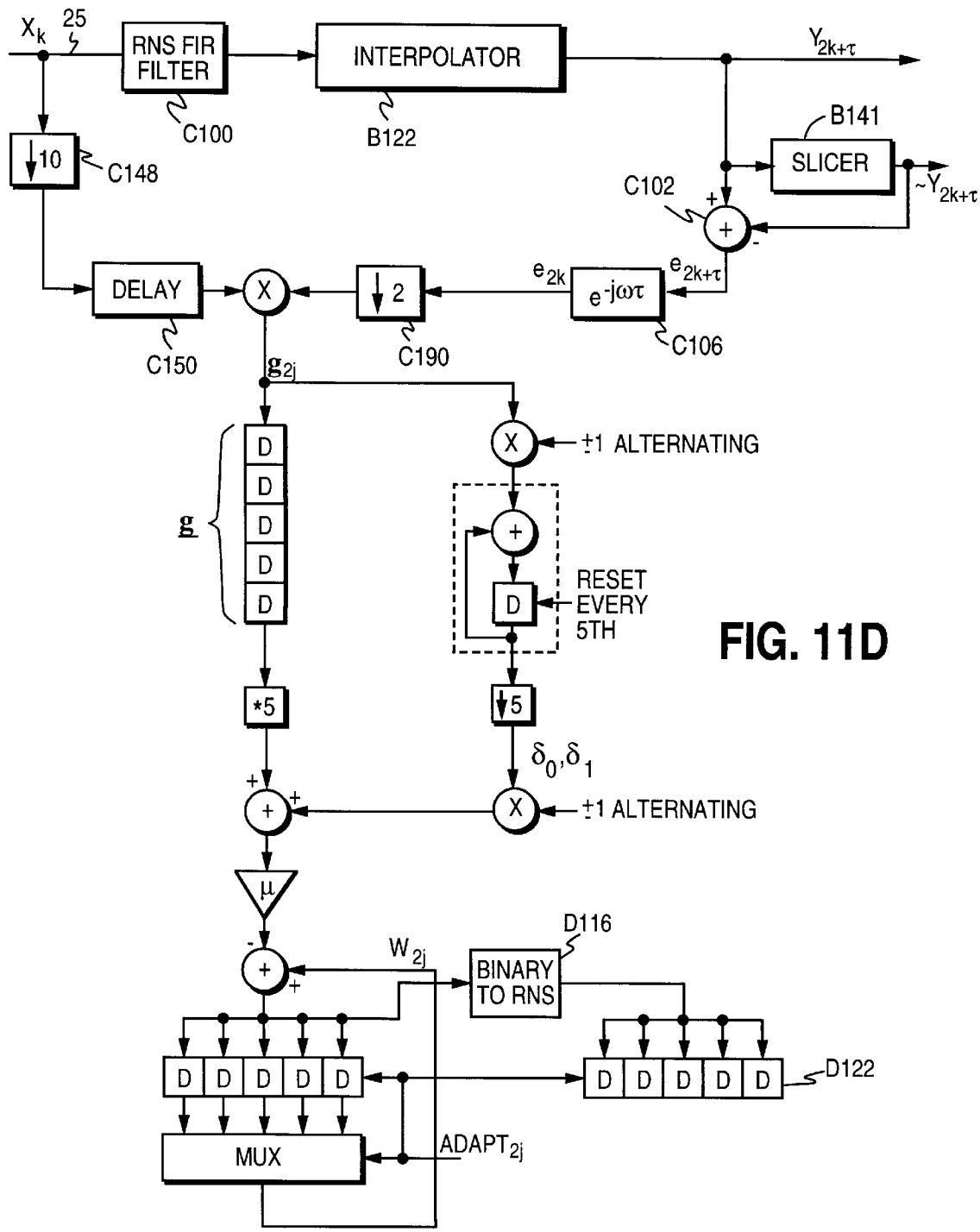
FIG. 11D shows yet another alternative embodiment for the reduced cost orthogonal projection operation of the present invention.

FIG. 11D illustrates yet another embodiment of the present invention which further reduces the cost and complexity, as compared to FIG. 11A, by updating the even and odd filter coefficients sequentially. That is, during the first N periods (where N is the number of filter coefficients) the circuit of FIG. 11D computes the coefficient update values of equation (28) for the even filter coefficients (W$_0$, W$_2$, W$_4$, ... ), and then during the next N sample periods it computes the update values for the odd filter coefficients (W$_1$, W$_3$, W$_5$, ... ). A decimation circuit C190 decimates the error value $e_k$ by two, and approximately half the circuitry as that of FIG. 11A is used to compute the update values. The decimate by two circuit C190 is actually syncopated; that is, it outputs the error values for k=0, k=2, k=4, k=6, k=8, and then outputs the error values for k=9, k=11, k=13, k=15, k=17 (assuming the adaptive filter C100 comprises ten filter taps). FIG. 11D also shows the RNS-to-binary converter D116 of FIG. 8B and 8C, and a register D122 for storing the RNS filter coefficients for use by the RNS FIR filter C100.

Mathematically, operation of the update circuit in FIG. 11D can be described by, $$\begin{bmatrix} W_{(k+1)0} \\ W_{(k+3)2} \\ W_{(k+5)4} \\ W_{(k+7)6} \\ W_{(k+9)8} \\ W_{(k+10)1} \\ W_{(k+12)3} \\ W_{(k+14)5} \\ W_{(k+16)7} \\ W_{(k+18)9} \end{bmatrix} = \begin{bmatrix} W_{(k+0)0} \\ W_{(k+2)2} \\ W_{(k+4)4} \\ W_{(k+6)6} \\ W_{(k+8)8} \\ W_{(k+9)1} \\ W_{(k+11)3} \\ W_{(k+13)5} \\ W_{(k+15)7} \\ W_{(k+17)9} \end{bmatrix} - \mu \cdot \begin{bmatrix} 5g_{(k+0)0} - \delta_{(k+0)0} \\ 5g_{(k+2)2} + \delta_{(k+2)0} \\ 5g_{(k+4)4} - \delta_{(k+4)0} \\ 5g_{(k+6)6} + \delta_{(k+6)0} \\ 5g_{(k+8)8} - \delta_{(k+8)0} \\ 5g_{(k+9)1} + \delta_{(k+9)1} \\ 5g_{(k+11)3} - \delta_{(k+11)1} \\ 5g_{(k+13)5} + \delta_{(k+13)1} \\ 5g_{(k+15)7} - \delta_{(k+15)1} \\ 5g_{(k+17)9} + \delta_{(k+17)1} \end{bmatrix}$$

assuming the adaptive filter C100 comprises 10 filter taps.

Obviously, the embodiment of FIG. 11D will decrease the performance of the adaptive filter C100 due to the decrease in convergence speed. However, the gradient averaging circuit of FIG. 11C can be used to improve the performance of the circuit in FIG. 11D, similar to the embodiment of FIG. 11B. Thus in the embodiments of FIG. 11A–11D, the performance versus cost and complexity varies—the preferred configuration is selected according to the requirements of the user.

Residue Number System

The FIR filter employed in the equalizer 26 of the conventional sampled amplitude read channel of FIG. 1 operates according to a conventional binary numbering system. In the present invention shown in FIG. 3, the LMS FIR filter in the adaptive equalizer C103 and the time varying FIR filter in interpolated timing recovery B100, as described above, are implemented according to a residue number system (RNS). RNS significantly increases the speed of multiplication, addition and subtraction because, in contrast to a binary numbering system, no carries between digits are necessary to perform the operations. Furthermore, the present invention employs "one-hot" encoding in the RNS design in order to minimize power dissipation.

In an RNS representation of a number X, the number is represented by a number of digits wherein each digit has its own limited range as follows:

$$X = x_{ma}, x_{mb}, \ldots, x_{mN}$$

where:

X=a natural number $x_{ma}, x_{mb}, \ldots x_{mN}$ are each a digit in the RNS representation of the natural number X wherein:

$x_{ma} = X \bmod(m_a)$=the remainder after X is divided by $m_a$. The remainder is therefore less than $m_a$.

$x_{mb} = X \bmod(m_b)$, etc., and $m_a, m_b \ldots m_N$ are the different moduli (integer numbers), each associated with a respective digit in the RNS representation of the natural number X.

If the moduli are relatively prime, that is, the smallest single number into which all will divide evenly is equal to the product of all the moduli, then the range of numbers that can be uniquely represented in any particular RNS form $X = x_{ma}, x_{mb}, \ldots, x_{mN}$ is $m_a * m_b * \ldots * m_N$. This excludes the possibility of repetition of a modulus, but not even numbers or a perfect square. For instance note that 3, 4 and 5 are relatively prime in that the smallest single number into which all will divide evenly is 60, even though 4 is both an even number and a perfect square.

As an example of the foregoing, consider the Residue Number System shown in Table D1. In this RNS, each integer is represented by three RNS digits $x_3$, $x_5$ and $x_7$, the subscript of each digit being the value of the associated modulus. Thus this is a 3, 5, 7 RNS, being able to distinguish 3*5*7=105 unique integers. As can be seen from Table D1, no RNS representation repeats in the range from 0 to 104, though the entire sequence begins to repeat again if one tries to extend the same to 105 and beyond.

TABLE D1

| Natural Number X | RNS digit $x_3$ | RNS digit $x_5$ | RNS digit $x_7$ |
|---|---|---|---|
| 105 | 0 | 0 | 0 |
| 104 | 2 | 4 | 6 |
| ... | ... | ... | ... |
| 15 | 0 | 0 | 1 |
| 14 | 2 | 4 | 0 |
| 13 | 1 | 3 | 6 |
| 12 | 0 | 2 | 5 |
| 11 | 2 | 1 | 4 |
| 10 | 1 | 0 | 3 |
| 9 | 0 | 4 | 2 |
| 8 | 2 | 3 | 1 |
| 7 | 1 | 2 | 0 |
| 6 | 0 | 1 | 6 |
| 5 | 2 | 0 | 5 |
| 4 | 1 | 4 | 4 |
| 3 | 0 | 3 | 3 |
| 2 | 2 | 2 | 2 |
| 1 | 1 | 1 | 1 |
| 0 | 0 | 0 | 0 |

As an example of how the RNS system works, consider the natural number 14. The $x_3$ digit is 14 mod(3)=the remainder 2, i.e. 14/3=4 remainder 2. The $x_5$ digit is 14 mod(5)=the remainder 4, i.e. 14/5=2 remainder 4. The $x_7$ digit is 14 mod(7)=the remainder 0 (14/7=2 remainder 0). It will be noted that each digit is determined without reference to any other digit in the RNS representation.

Also note that the same 3,5,7 RNS representation might be used to uniquely represent the numbers 105 to 209. However addition, subtraction and multiplication of any two numbers in the range of 105 to 209 all provide a result which is out of the range of 105 to 209, making this scheme rather useless for digital signal processing. Of particular interest for digital signal processing however, is the introduction of negative numbers by limiting the range of numbers representable in the RNS system chosen to an equal or substantially equal number of positive and negative numbers, as most signals processed will have or can be made to have a substantially zero average value. Such an assignment for a 3,5,7 RNS system is shown in Table D2. Again note that 105 numbers −52 to +52 are uniquely represented in the RNS, but the representations begin to repeat at 53 and −53. Note also that no separate sign is associated with positive or negative RNS numbers, but instead the sign is determined by the digits themselves once the RNS system and its range is selected. Finally, note that even the sign of the associated natural number represented in RNS form cannot be determined from any less than all the RNS digits in the RNS representation of the number.

TABLE D2

| Natural Number X | RNS digit $x_3$ | RNS digit $x_5$ | RNS digit $x_7$ |
|---|---|---|---|
| 53 | 2 | 3 | 4 |
| 52 | 1 | 2 | 3 |
| ... | ... | ... | ... |
| 15 | 0 | 0 | 1 |
| 14 | 2 | 4 | 0 |
| 13 | 1 | 3 | 6 |
| 12 | 0 | 2 | 5 |
| 11 | 2 | 1 | 4 |
| 10 | 1 | 0 | 3 |
| 9 | 0 | 4 | 2 |
| 8 | 2 | 3 | 1 |
| 7 | 1 | 2 | 0 |
| 6 | 0 | 1 | 6 |
| 5 | 2 | 0 | 5 |
| 4 | 1 | 4 | 4 |
| 3 | 0 | 3 | 3 |
| 2 | 2 | 2 | 2 |
| 1 | 1 | 1 | 1 |
| 0 | 0 | 0 | 0 |
| −1 | 2 | 4 | 6 |
| −2 | 1 | 3 | 5 |
| −3 | 0 | 2 | 4 |
| −4 | 2 | 1 | 3 |
| −5 | 1 | 0 | 2 |
| −6 | 0 | 4 | 1 |
| −7 | 2 | 3 | 0 |
| −8 | 1 | 2 | 6 |
| −9 | 0 | 1 | 5 |
| −10 | 2 | 0 | 4 |
| −11 | 1 | 4 | 3 |
| −12 | 0 | 3 | 2 |
| −13 | 2 | 2 | 1 |
| −14 | 1 | 1 | 0 |
| −15 | 0 | 0 | 6 |
| ... | ... | ... | ... |
| −52 | 2 | 3 | 4 |
| −53 | 1 | 2 | 3 |

For RNS addition, each respective pair of digits of the two RNS numbers are added, and the applicable modulo operation is performed on each respective sum.

```
Example    Natural number    RNS
              8               231
            + 4              +144
            ————             ————
              12              375
```

But 3 mod(3)=0 and 7 mod(5)=2. Therefore the sum 375 in the RNS system is 025, representing the natural number 12 (see Table D2).

For subtraction, the same procedure is followed, though the modulus may have to be added back to bring the "remainder" into the range of 0 to the respective modulus minus 1.

```
Example    natural number    RNS
              8                2 3 1
           minus 13            1 3 6
           ————               ————
              −5               1 0 −5
```

But adding the applicable modulus of 7 to −5 gives a "remainder" of 2. Therefore plus 13 subtracted from plus 8 in this RNS system is 102, representing the natural number −5 (see Table D2).

For addition involving a negative number, the same procedure is followed as in addition of positive numbers.

```
Example    Natural number    RNS
              8                2 3 1
           + 13                2 2 1
           ————               ————
              −5               4 5 2
```

But 4 mod(3) is 1 and 5 mod(5) is 0. Therefore −13 added to 8 in this RNS system is 102, again representing the natural number −5 (see Table D2).

Finally, in the case of multiplication, consider the following example:

```
Example    Natural number    RNS
              −3               0 2 4
              −4               2 1 3
             ————             ————
              12               0 2 12
```

But 12 mod(7) is 5. Therefore (−3)*(−4) in this RNS system is 025, again representing the natural number 12 (see Table D2).

It can be seen that addition, subtraction and multiplication of positive and negative numbers expressed in a RNS form work in the RNS system. The key observation to be made, though, is that the operations are performed on each RNS digit independently, without reference to results of the same operation on any other RNS digit. The high speed characteristic of RNS arithmetic is due to this "carry free" nature of the operations, whereas in conventional arithmetic, the results of multiplication, addition or subtraction of a particular digit cannot be finally determined until the results of the operation on less significant digits have been determined.

Division is also possible in an RNS system, with certain essential limitations. The principles of division in an RNS system may be illustrated as follows. In a single digit x of an RNS representation of a natural number X:

$$X = m*N + x$$

where: m = the modulus of the digit, a positive integer
N = an integer (which will be a negative integer for negative numbers)
x = the value of the RNS digit (the remainder, in the range of $0 \leq x \leq m-1$, after subtracting m*N from X)

For any individual RNS digit, only x, the value of the digit itself, is known. Knowledge of only a single digit does not give knowledge of X, or N for that digit.

The above equation for X may be written in various ways as follows:

$$X = m*N + x$$

$$X = m*(N-1) + (x+m)$$

$$X = m*(N-2) + (x+2*m)$$

$$X = m*(N-3) + (x+3*m) \ldots$$

$$X = m*(N-n) + (x+n*m) \ldots$$

where: n = is an arbitrary positive integer

The operation of division can occur on an RNS digit by RNS digit basis provided the following two conditions are met (the satisfaction of these two conditions will be commented on hereafter on a case by case basis):

1.) X is evenly divisible by the integer divisor d (remainder=0). Then X/d is clearly an integer number, and expressible in RNS form in the same RNS system as X.

2.) The divisor and the modulus of the RNS digit are relatively prime.

Using the above equations for X, X/d may be expressed in a conventional number system by any of the following equations:

$$X/d = m*N/d + x/d$$

$$X/d = m*(N-1)/d + (x+m)/d$$

$$X/d = m*(N-2)/d + (x+2*m)/d$$

$$X/d = m*(N-3)/d + (x+3*m)/d \ldots$$

$$X/d = m*(N-n)/d + (x+n*m)/d \ldots$$

If there is a value of n where $(x+n*m)/d$ is an integer, then because X/d is also an integer, $m*(N-n)/d$ is an integer. Therefore, $m*(N-n)$ must include a factor d. Since it is assumed that m is relatively prime with respect to d, $(N-n)$ must include the factor d, and so $(N-n)/d$ is also an integer.

Furthermore, if for one and only one value of n, $(x+n*m)/d$ is an integer in the range of 0 to m-1, then $X/d = m*(N-n)/d + (x+n*m)/d$ is in the form of the equation:

$$X/d = m*N_d + x_d$$

where: $N_d$ = the integer value of $(X/d)/m = (N-n)/d$ $x_d = (x+n*m)/d$ = the value of the RNS digit in the RNS representation of X/d.

If n and d are relatively prime, it is stated without proof that there will be one and only one value of n for which $(x+n*m)/d$ is an integer in the range of 0 to m-1.

By way of example, consider a digit of modulus 5 of an RNS representation of a number X evenly divisible by d. First consider 56 divided by 7=8. The modulus 5 RNS digit x of 56 is 1 and the modulus 5 RNS digit $x_d$ of 8 is 3. Therefore x=1 and $x_d$ should come out to be 3. Though not known from x, N=the integer value of 56/5=11. The possibilities for $x_d = (x+n*m)/d$ in the range of 0 to 4 for various values of n, and for $N_d = (N-n)/d$ Table D3 below.

TABLE D3

| n | (x + n*m) (x = 1) | (x + n*m)/d (d = 7) | $N_d$ (N − n)/d | $x_d$ (x + n*m)/d = an integer |
|---|---|---|---|---|
| 0 | 1 | 1/7 | 11/7 | |
| 1 | 6 | 6.7 | 10/7 | |
| 2 | 11 | 11/7 | 9/7 | |
| 3 | 16 | 16/7 | 8/7 | |
| 4 | 21 | 21/7 = 3 | 7/7 = 1 | 3 |

While the foregoing only illustrates the division of 56 by 7, the second and third columns of Table D3 are the same for any number X evenly divisible by 7 and having an RNS digit of modulus 5 equal to 1. Thus in any RNS system in which one of the RNS digits has a modulus of 5, when that RNS digit has a value of 1 in the RNS representation of a number X evenly divisible by 7, the corresponding digit in the RNS representation of the result of dividing X by 7 will always be 3. The same procedure may be used to find the respective value of the RNS digit of modulus 5 in X/7 when the corresponding RNS digit in X has any of the other values 0, 2, 3 and 4 ($x_d$=0, 1, 4 and 2, respectively).

This same technique, of course, can readily be further extended to division in general wherein the divisor and the modulus of the digit are relatively prime and it is known that X/d is an integer. It also works for negative numbers. For instance, consider −49 divided by 7. For −49, an RNS digit of modulus 5 is also 1. Therefore, as before, the RNS digit of modulus 5 in the RNS representation of the result will be 3, which is the RNS digit of modulus 5 in the RNS representation of −7.

$x_d$ can also be found directly by using RNS multiplication of x by a number called the multiplicative inverse of d, as follows: Since $(x+n*m)/d = x_d$:

$$x + n*m = x_d*d$$

Multiplying both sides of the above equation by some integer $I_{dm}$:

$$x*I_{dm} + n*m*I_{dm} = x_d*d*I_{dm}$$

Then taking mod(m) of both sides gives:

$$(x*I_{dm} + n*m*I_{dm}) \bmod(m) = (x_d*d*I_{dm}) \bmod(m)$$

The term $n*m*I_{dm}$ on the left of the above equation can be dropped since it is an integer multiple of the modulus m, and an additional mod(m) operation can be inserted on the right without changing the result. Thus:

$$x*I_{dm} \bmod(m) = [x_d*(d*I_{dm} \bmod(m))] \bmod(m)$$

If an integer $I_{dm}$ can be found such that $$d*I_{dm} \bmod(m) = 1$$

then $$x*I_{dm} \bmod(m) = x_d \bmod(m) = x_d$$

$I_{dm}$, then, is the multiplicative inverse of d in the modulus m. If d is relatively prime with respect to m the multiplicative inverse exists (without proof herein), hereinafter denoted $d_m^{-1}$.

To find the multiplicative inverse $d_m^{-1}$ of d for the modulus m, it is not necessary to search through all integers for the integer $d_m^{-1}$ such that:

$$d*d_m^{-1} \bmod(m) = 1$$

If $d_m^{-1}$ exists, then it is also true that $$[d*(d_m^{-1} \bmod(m))] \bmod(m) = 1$$

Given d mod(m) then, it is only necessary to search from 1 through m−1 to find the inverse of d in the modulus m (the inverse cannot be 0).

Note that if d mod(m)=0, then no multiplicative inverse will be found. Of course, if d mod(m)=0, then d and m are not relatively prime and one of the two conditions for division has not been satisfied.

Thus rather than dividing by a number, such as a number d, one can multiply by $d_m^{-1}$, the multiplicative inverse of d. To illustrate a multiplicative inverse, consider division by 13 for a modulo 5 digit of an RNS number. The digit may have values of 0, 1, 2, 3 or 4. Using the first approach to division described to divide by 13, the modulus 5 may be repeatedly added to the RNS digit value until the sum is evenly divisible by 13. In that regard, there will be only one such number evenly divisible by 13 to give a result of 0, 1, 2, 3 or 4, as shown in Table D4 below.

TABLE D4

| x Value of the modulo 5 digit | Add modulus 5 "n" times n = | x + n*m Value of the modulo 5 digit plus n*5 | $x_d$ Value of the modulo 5 digit divided by 13 |
| --- | --- | --- | --- |
| 0 | 0 | 0 | 0 |
| 1 | 5 | 26 | 2 |
| 2 | 10 | 52 | 4 |
| 3 | 2 | 13 | 1 |
| 4 | 7 | 39 | 3 |

However, multiplying the value of the modulo 5 digit times 2 gives an identical result. Thus for the modulo 5 digit, dividing by 13 is identical to multiplying by 2. Using the equation:

$$d_m^{-1} * d \mod(m) = 1$$

$$13_5^{-1} * 13 \mod(5) = 1$$

or again, $13_5^{-1} = 2$

While the operations of addition, subtraction and multiplication are carry free in an RNS system and hence simple and fast to execute, other operations that are simple and fast in a binary numbering system are cumbersome within an RNS system. For example, truncation in a binary system is simply the dropping of the least significant digits of the number to be truncated. In an RNS system, the digits do not have a relative significance, and therefore truncation is problematic.

Other operations that are difficult in an RNS number system include division, scaling (division by a fixed factor), sign detection, comparison, and dynamic range extension. As these are simple operations in binary, it is in principle possible to convert from an RNS number form to binary, perform the operation on the binary number, and then reconvert to an RNS number form if necessary (comparison and sign detection are results in themselves, and the RNS number or numbers on which they have operated may be preserved in RNS form for later use). However the Associated Mixed Radix (AMR) representation of a number can be found more naturally than the binary representation from the RNS representation.

Like a binary or decimal number, a mixed radix number is expressed by digits that have a relative significance. But unlike binary and decimal numbers, the weight of each digit is not a fixed multiple ("radix") of the weight of the immediately less significant digit.

The radix of a decimal number is 10. The value of the least significant digit ranges from 0 to 9. The next most significant digit, which also varies from 0 to 9, has a weight of 10. The next most significant digit has a weight of 100, 10 times larger than the weight of the previous digit, etc. The radix of a binary number is 2. The value of the least significant binary digit ranges from 0 to 1. The next most significant binary digit, which also varies from 0 to 1, has a weight of 2. The next most significant digit has a weight of 4, 2 times larger than the weight of the previous digit, etc.

The radix of a mixed radix number changes from digit to digit. Considering first only positive numbers, the value of the least significant digit ranges from 0 to p-1. The weight of the next most significant digit is "p". The value of this digit, though, ranges from 0 to q-1, where "q" in general is not equal to "p". The weight of the next digit is "q" times the weight of this digit, namely "p" times "q", and its value can range from 0 to yet a different maximum.

Of interest here is when the radices of a mixed radix representation of an integer X are equal to the moduli $m_1$, $m_2$, etc. of the RNS representation of the integer X (hence the "Associated" Mixed Radix representation). The value of the least significant digit ranges from 0 to $m_1-1$, where $m_1$ is one of the RNS moduli. (Note that in the following discussion, the notation style has changed. Subscripts no longer indicate the value of the modulus, but rather merely distinguish between RNS system digits.) The next AMR digit, which has a weight of $m_1$, ranges from 0 to $m_2-1$, etc. The natural number X, then, in AMR form can be expressed as $$X = a_1 + a_2 * m_1 + a_3 * (m_1 * m_2) + a_4 * (m_1 * m_2 * m_3) + \ldots$$

where $a_1$, $a_2$, etc. are the AMR digit values. Note that the range under the AMR representation is identical to the range of the corresponding RNS representation of a number X. For instance, assume four AMR digits $a_1$, $a_2$, $a_3$ and $a_4$. Then X can range from zero to:

$$X_{max} = (m_1-1) + (m_2-1)*m_1 + (m_3-1)(m_1*m_2) + (m_4-1)*(m_1*m_2*m_3) = m_1*m_2*m_3*m_4 - 1$$

The values for the AMR digits $a_1$, $a_2$, etc. can be obtained from the RNS representation of X using the following methodology.

Consider a natural number X having the RNS representation $x_1, x_2, \ldots, x_N$ in the moduli $m_1, m_2, \ldots, m_N$. Again X can be expressed as:

$$X = a_1 + a_2*m_1 + a_3*m_1*m_2 + \ldots + a_N*m_1*m_2* \ldots *m_{N-1}$$

where $a_1$, $a_2$, etc. are functions of $x_1$, $x_2$, etc.

By taking modulo $m_1$ of each side of the above equation:

$$X \mod(m_1) = (a_1 + a_2*m_1 + \ldots a_N*m_1* \ldots *m_{N-1}) \mod(m_1)$$

The left side of the above equation is simply equal to $x_1$. Note that $m_1$ is a factor in every term on the right side of the equation except the first, and therefore all terms except the first can be dropped. Therefore:

$$x_1 = a_1 \mod(m_1) = a_1$$

Now subtract $a_1$ from X using RNS subtraction and divide the result by $m_1$ using RNS division to obtain the result X' in RNS form.

$$X' = (X-a_1)/m_1 = a_2 + a_3*m_2 + \ldots + a_N*m_2* \ldots *m_{N-1}$$

Note that subtracting $a_1$ from X drives the value of the $x_1$ digit of the RNS representation of X to zero, meaning that the result $X-a_1$ is evenly divisible by $m_1$, so that X' is an integer representable in RNS form. Also note that the divisor $m_1$ is relatively prime to all of the moduli except itself. Therefore, the two conditions for valid RNS division have been satisfied for all RNS digits except the first. Fortunately, the inability to legitimately divide the first digit is of no consequence, as the possible range of the result is diminished so as to be uniquely expressible by the remaining digits.

Now taking $\mod(m_2)$ of X':

$$X' \mod(m_2) = (a_2 + a_3*m_2 + \ldots + a_N*m_2* \ldots *m_{N-1}) \mod(m_2)$$

Consequently:

$$x_2' = a_2 \mod(m_2) = a_2$$

where $x_2'$ is the value of the second RNS digit after the subtraction of $a_1$ and the division by $m_1$.

Repeating the process as required:

$a_1 = x_1, a_2 = x_2', a_3 = x_3''$, etc.

As an example of the foregoing, consider the natural number 41 in the 3,5,7 RNS system of Table D1. The natural number 41 is 216 in RNS. Thus:

$X = 216$ RNS $x_1 = a_1 = 2$ $X - a_1 = X - 2 = 044$ RNS $X' = (X - a_1)/3 = 36$ RNS $(3_5^{-1} = 2, 3_7^{-1} = 5)$ $x_2' = a_2 = 3$ $X' - 3 = 03$ RNS $X'' = (X'3)/5 = 2$ RNS $= x_3'' = a_3(5_7^{-1} = 3)$

Thus $a_1 = 2$, $a_2 = 3$ and $a_3 = 2$.
As a check:

$X = a_1 + a_2 * m_1 + a_3 * m_1 * m_2$ $X = 2 + 3*3 + 2*3*5 = 2 + 9 + 30 = 41$

Now consider the Associated Mixed Radix representation of positive and negative numbers in the 3,5,7 RNS system of Table D2, wherein the numbers X range from −52 to +52. Again the AMR representation of a number X is:

$X = a_1 + a_2 * m_1 + a_3 * m_1 * m_2$

The moduli $m_1$, $m_2$ and $m_3$ are necessarily positive, but the values of $a_1$, $a_2$ and $a_3$ are not so limited, though each is limited in range to the range of the respective one of $m_1$, $m_2$ and $m_3$. Thus if:

$-1 \leq a_1 \leq +1$ $-2 \leq a_2 \leq +2$ $-3 \leq a_3 \leq +3$

Then X will range from $-1 + (-2*3) + (-3*3*5) = -52$ to $+1 + (+2*3) + (+3*3*5) = +52$, as in Table D2.

As an example of the foregoing, again consider the natural number 41 in the 3,5,7 RNS system of Table D2. The natural number 41 is 216 in RNS. Thus:

$X = 216$ RNS $x_1 = a_1 \bmod(3) = 2$

Given that $x_1 = a_1 \bmod(3) = 2$ and $-1 \leq a_1 \leq +1$, $a_1$ must be $-1$.

$X - a_1 = X - (-1) = 216$ RNS + 111 RNS = 020 RNS $X' = (X - a_1)/3 = 40$ RNS $x_2' = 4 = a_2 \bmod(5)$ $a_2 = -1$ (since $-2 \leq a_2 \leq +2$)

$X' - a_2 = X' - (-1) = 40$ RNS + 11 RNS = 01 RNS $X'' = (X' - a_2)/5 = 3$ RNS $x_3'' = 3 = a_3 \bmod(7) = a_3$ Thus $a_1 = -1$, $a_2 = -1$ and $a_3 = 3$.

As a check:

$X = a_1 + a_2 * m_1 + a_3 * m_1 * m_2$ $X = -1 + (-1*3) + 3*3*5 = -1 + (-3) + 45 = 41$

In the preceding example including a range of negative numbers, all the moduli were odd (i.e., 3, 5 and 7), and the numbers representable in AMR form ranged from −52 to +52. For another system where the moduli are 2, 5, and 11, a range inclusive of positive and negative numbers could instead be from −55 to +54. More generally, the total range representable in AMR form is equal to $M = m1*m2* \ldots$, the product of the moduli. If only positive numbers ranging from 0 are considered, then $0 <= X <= M-1$. If inclusive of negative numbers also, there are two possibilities of particular interest. If any one of the moduli is an even number, M will be an even number. Otherwise, M will be an odd number. Two possibilities of range inclusive of both positive and negative numbers can therefore be identified:

Pos/Neg, M even: $-M/2 <= X <= M/2 - 1$

POS/Neg, M odd: $-(M-1)/2 <= X <= (M-1)/2$

The determination of the range of the possible values of the individual AMR digits depends on which of the two possibilities apply. If all moduli are odd, then M is odd and the total range is symmetrical about zero. It is therefore necessary for all the AMR digits to also have ranges symmetric about zero. For all AMR digits "a" associated with moduli "m", then:

For all AMR digits (M odd): $-(m-1)/2 <= a <= (m-1)/2$ as exemplified above in the 3, 5, 7 system.

If one of the moduli is even and M is therefore even, the range inclusive of both positive and negative numbers is not symmetric about zero and the determination of the range of AMR digit values is more complicated. First, note that there can be only one even modulus. Otherwise, the moduli in the RNS system would not be relatively prime (all even moduli would have a common factor of two). The range of AMR digit values depends on the location, in terms of significance, of the digit associated with the even modulus:

AMR digit associated with the even modulus: $-m/2 <= a <= m/2 - 1$

AMR digits associated with odd moduli more significant than the digit associated with the even modulus: $-(m-1)/2 <= a <= (m-1)/2$ AMR digits associated with odd moduli less significant than the digit associated with the even modulus: $0 <= a <= m - 1$ To understand this arrangement, note that while the total range with M even is asymmetrical about zero, it is only slightly so, and therefore the most significant digits that can have symmetric ranges need to have such. The even digit needs to have an asymmetric range, and it should be in favor of the negative values but only slightly so. Finally, if the even digit is not the least significant digit, even its slightly asymmetric range will give excessive asymmetry towards negative values in the total range, and the less significant odd digits need to acquire only positive values to compensate.

For example, the 2, 5, 11 RNS system briefly mentioned above could, again, represent the natural numbers from −55 to +54. If the AMR representation is such that the AMR digits, from the most significant to the least significant, are associated with the 11, 2, and 5 moduli respectively, then the digits should have the following ranges:

$-5 <= a_3 <= +5$ $-1<=a_2<=0$ $0<=a_1<=+4$

As a check, the minimum natural number X representable in AMR form is $X_{min}=0+(-1)*5+(-5)*5*2=0-5-50=-55$ and the maximum is $X_{max}=4+0*5+5*5*2=4+0+50=+54$ An AMR representation of a number has various uses, such as to create a new RNS digit for an expanded RNS representation of the number. To create the new RNS digit $x_{N+1}$ having modulus $m_{N+1}$:

$X=a_1+a_2*m_1+a_3*m_1*m_2+\ldots+a_N*m_1*m_2*\ldots*m_{N-1}$ $x_{N+1}=X \bmod(m_{N+1})=(a_1+\ldots+a_N*m_1*\ldots*m_{N-1}) \bmod(m_{N+1})$ $x_{N+1}=((a_1) \bmod(m_{N+1})+(a_2*m_1) \bmod(m_{N+1})+\ldots) \bmod(m_{N+1})$ Again as an example, consider the generation of a new RNS digit of modulus 11 for the natural number 41 expressed as the 3,5,7 RNS number 216, first in the all positive RNS representations of Table D1. It has already been determined that $a_1=2$, $a_2=3$ and $a_3=2$. In this case:

$x_{N+1}=((a_1) \bmod(m_{N+1})+(a_2*m_1) \bmod(m_{N+1})+(a_3*m_1*m_2) \bmod(m_{N+1})) \bmod(m_{N+1})$ $x_{N+1}=(2 \bmod(11)+(3*3) \bmod(11)+(2*3*5) \bmod(11)) \bmod(11)$ $x_{N+1}=((2)+(9)+(30 \bmod(11))) \bmod(11)$ $x_{N+1}=(2+9+8) \bmod(11)=19 \bmod(11)=8$ Obviously this is correct, in that 41 mod(11) is 8. Thus the natural number 41, expressed in a 3,5,7 RNS as 216 RNS, is expressed in a 3,5,7,11 RNS as 2168 RNS. While for the natural number 41 the additional RNS digit is redundant, the range of the natural numbers expressible in the new four digit 3,5,7,11 RNS is eleven times that expressible in the three digit 3,5,7 RNS. Note that it was not necessary to determine the actual value of X=41. $x_N+1$ was determined solely by the RNS and AMR digits. The foregoing is called "Base Extension".

Now consider the generation of a new RNS digit of modulus 11 for the natural number 41 expressed in the 3,5,7 positive and negative number RNS representations of Table D2. It has already been determined that in the positive and negative number range system, $a_1=-1$, $a_2=-1$ and $a_3=3$. In this case:

$x_{N+1}=((a_1) \bmod(m_{N+1})+(a_2*m_1) \bmod(m_{N+1})+(a_3*m_1*m_2) \bmod(m_{N+1})) \bmod(m_{N+1})$ $x_{N+1}=((-1) \bmod(11)+(-1*3) \bmod(11)+(3*3*5) \bmod(11)) \bmod(11)$ Thus:

$x_{N+1}=((10)+(8)+(45) \bmod(11)) \bmod(11)$ $x_{N+1}=(10+8+1) \bmod (11)=19 \bmod(11)=8$ In electronic circuits, various encoding schemes are well known in the representation of digit values. In conventional binary encoding, each digit can be represented by a single signal, or a single "line". A line with a high voltage represents a binary "1". A line with a "low" voltage represents a binary "0". In binary coded decimal, each decimal digit is represented by four lines, and the various voltage levels on the lines determine the value of the decimal digit. Commonly used methods and apparatus for the processing of digital signals use one of these two representations of real numbers, most commonly the binary encoding. Decoding of a digit to a 1 of N form is also common, but not for digital processing, but rather for device addressing and for control purposes.

In accordance with the present invention, RNS representations of numbers (signals, coefficients, etc.) are combined with a "one-hot" encoding scheme, wherein each possible value of a digit has an associated single line. When the digit takes on a particular value, the line associated with that value becomes high while all other lines are low. The term "one-hot" refers to the characteristic that at any given time one and only one line of a digit is high in this scheme. By way of example, if a 3,5,7 RNS were used, 3 lines would be used to represent the first digit, 5 lines would be used to represent the second digit and 7 lines would be used to represent the third digit. Since the digits in this RNS range from 0 to 2, 0 to 4, and 0 to 6, respectively, it is most convenient to similarly number the digit lines for each digit as 0 through 2, 0 through 4, and 0 through 6, respectively. Thus using the range of −52 to +52, the real number −13, represented by 221 RNS would be represented by the 3+5+7=15 lines, three of which would have a high voltage or state, with the others being low. The lines whose states represent the digits are numbered from zero, as follows in Table D5.

TABLE D5

NATURAL NUMBER —13 ONE-HOT RNS REPRESENTATION

| Line | Digit | Digit line | State |
|---|---|---|---|
| 0 | $x_3$ | 0 | low |
| 1 |  | 1 | low |
| 2 |  | 2 | high |
| 3 | $x_5$ | 0 | low |
| 4 |  | 1 | low |
| 5 |  | 2 | high |
| 6 |  | 3 | low |
| 7 |  | 4 | low |
| 8 | $x_7$ | 0 | low |
| 9 |  | 1 | high |
| 10 |  | 2 | low |
| 11 |  | 3 | low |
| 12 |  | 4 | low |
| 13 |  | 5 | low |
| 14 |  | 6 | low |

In the description to follow, unless indicated otherwise, a 3,5,7 RNS will generally be used in the exemplary description of the invention, it being recognized that larger moduli and/or a greater number of moduli will frequently be used in real systems for greater accuracy and/or to accommodate the results of operations prior to the scaling and/or truncation of the results of the operations. As will be obvious to one skilled in the art, form the following description, and as more specifically described later, the methods and circuits of the present invention are readily expandable as required for such purposes.

Figures 12A, 12B, 13:
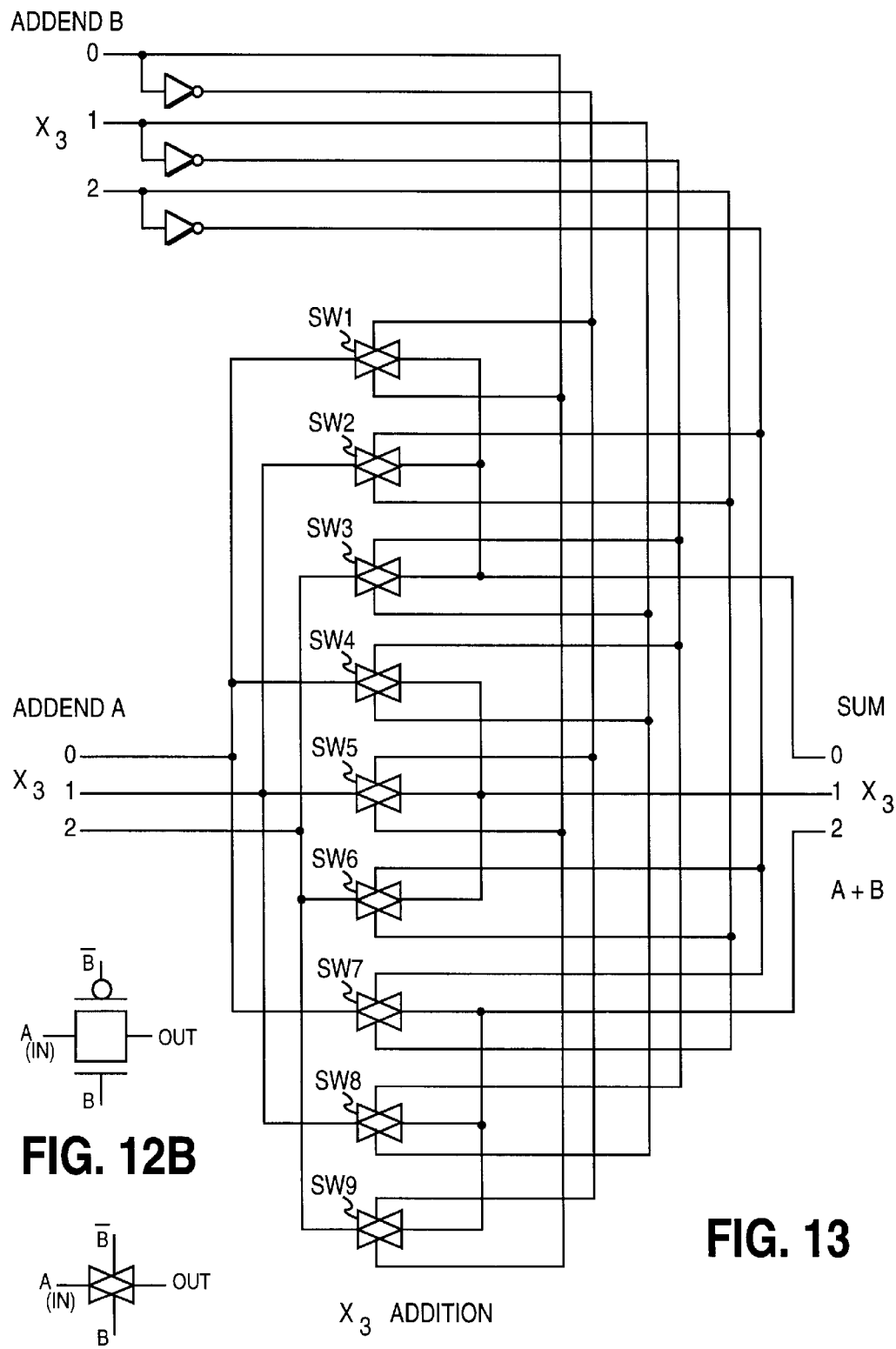
FIG. 12A illustrates a bilateral switch symbol used to simplify certain circuit diagrams to be described.
FIG. 12B presents the actual MOS circuit for the switch symbol of FIG. 12A.
FIG. 13 is an exemplary circuit diagram for addition of the modulo 3 digits of two numbers in a one-hot RNS system.

Also, in the circuits to be described herein, a bilateral switch symbol is used to simplify the circuit diagrams. This symbol is shown in FIG. 12A, with the actual MOS circuit of the bilateral switch being shown in FIG. 12B. The MOS circuit is comprised of n-channel and p-channel devices connected in parallel and controlled by switching signals B and $\overline{B}$. respectively, $\overline{B}$ being the inverse of the signal B. When B is high, the output OUT of the switch is connected to A. Otherwise the output is electrically floating, regardless of the state of A.

First consider addition in the system of the present invention. For the $x_3$ digits of two numbers being added, there are only three combinations of digits that can be added to obtain a particular result. For instance, a result of 0 can only be obtained by adding 0+0, 1+2 or 2+1, a result of 1 can only be obtained by adding 0+1, 1+0 or 2+2, and a result of 2 can only be obtained by adding 1+1, 0+2 or 2+0. A circuit for accomplishing addition for the $x_3$ digits of two numbers being added is shown in FIG. 13. Here the 0, 1 and 2 lines of the A addend are provided as the A input of the switches (see FIGS. 12A and 12B). The signals on the B addend lines are inverted by the inverters shown so that both the signals on the B addend lines and their inverse are available, as required by the switches used in the preferred embodiment. The switches themselves are logically divided into three (the modulus of the digit being added) groups of three (again the modulus of the digit being added) switches. The output of the first three switches SW1, SW2 and SW3 determines whether the state of the 0 line of the SUM is high or low, the output of the second three switches SW4, SW5 and SW6 determines whether the state of the 1 line of the SUM is high or low and the output of the third three switches SW7, SW8 and SW9 determines whether the state of the 2 line of the sum is high or low.

To illustrate the operation of the circuit of FIG. 13, consider two examples. First consider the sum of the real numbers 4 (144 RNS) as addend A and 8 (231 RNS) as addend B, giving a sum of 12 (025 RNS). Since the circuit of FIG. 13 is only adding the first digits of the two RNS numbers, the addend A input is one and the addend B input is two, i.e. the voltage on the number 1 line of the addend A and the voltage on the number 2 line of addend B are both high, and the signals on the rest of the lines of addend A and B are low. With the voltage on the number 2 line of addend B high, switches SW2, SW6 and SW7 are on, and the rest of the switches SW1, SW3, SW4, SW5, SW8 and SW9 are off. With switch SW2 on, the voltage on line 1 of addend A (high) is coupled to line 0 of the SUM. With switch SW6 on, the voltage on line 2 of addend A (low) is coupled to line 1 of the SUM. with switch SW7 on, the voltage on line 0 of addend A (low) is coupled to line 2 of the SUM. Thus of lines 0,1,2 of $x_3$ of the SUM, line 0 and only line 0 is high, as it should be for a sum of 12 (025 RNS).

Now consider the same sum, but by reversing the addends, taking the real number 4 (144 RNS) as addend B and 8 (231 RNS) as addend A, again giving a sum of 12. Again since the circuit of FIG. 13 is only adding the first digits of the two RNS numbers, the addend A input is two and the addend B input is one, i.e. the voltage on the number 2 line of the addend A and the voltage on the number 1 line of addend B are both high, and the signals on the rest of the lines of addend A and B are low. With the voltage on the number 1 line of addend B high, switches SW3, SW4 and SW8 are on, and the rest of the switches SW1, SW2, SW5, SW6, SW7 and SW9 are off. With switch SW3 on, the voltage on line 2 of addend A (high) is coupled to line 0 of the SUM. With switch SW4 on, the voltage on line 0 of addend A (low) is coupled to line 1 of the SUM. With switch SW8 on, the voltage on line 1 of addend A (low) is coupled to line 2 of the SUM. Thus again, of lines 0,1,2 of $x_3$ of the SUM, line 0 and only line 0 is high, as it should be for a sum of 12 (025 RNS).

The same form of circuits for the addition of the $x_5$ and $x_7$ digits of two RNS numbers will be obvious from the foregoing. For instance, for the addition of the $x_5$ digits, 25 switches logically arranged in 5 groups of 5 would be used, as there would be 5 output lines to be determined, and each may be driven high by 5 combinations of addend inputs, as shown in Table D6 below.

TABLE D6

| $x_5$ addends | $x_5$ SUM (output) lines | | | | |
|---|---|---|---|---|---|
| A,B lines high | 0 | 1 | 2 | 3 | 4 |
| 0,0 | high | low | low | low | low |
| 1,4 | | | | | |
| 2,3 | | | | | |
| 3,2 | | | | | |
| 4,1 | | | | | |
| 0,1 | low | high | low | low | low |
| 1,0 | | | | | |
| 2,4 | | | | | |
| 3,3 | | | | | |
| 4,2 | | | | | |
| 0,2 | low | low | high | low | low |
| 1,1 | | | | | |
| 2,0 | | | | | |
| 3,4 | | | | | |
| 4,3 | | | | | |
| 0,3 | low | low | low | high | low |
| 1,2 | | | | | |
| 2,1 | | | | | |
| 3,0 | | | | | |
| 4,4 | | | | | |
| 0,4 | low | low | low | low | high |
| 1,3 | | | | | |
| 2,2 | | | | | |
| 3,1 | | | | | |
| 4,0 | | | | | |

Similarly, for the addition of the $x_7$ digits, 49 switches logically arranged in 7 groups of 7 would be used, as there would be 7 output lines to be determined, and each may be driven high by 7 combinations of addend inputs.

Figure 14:
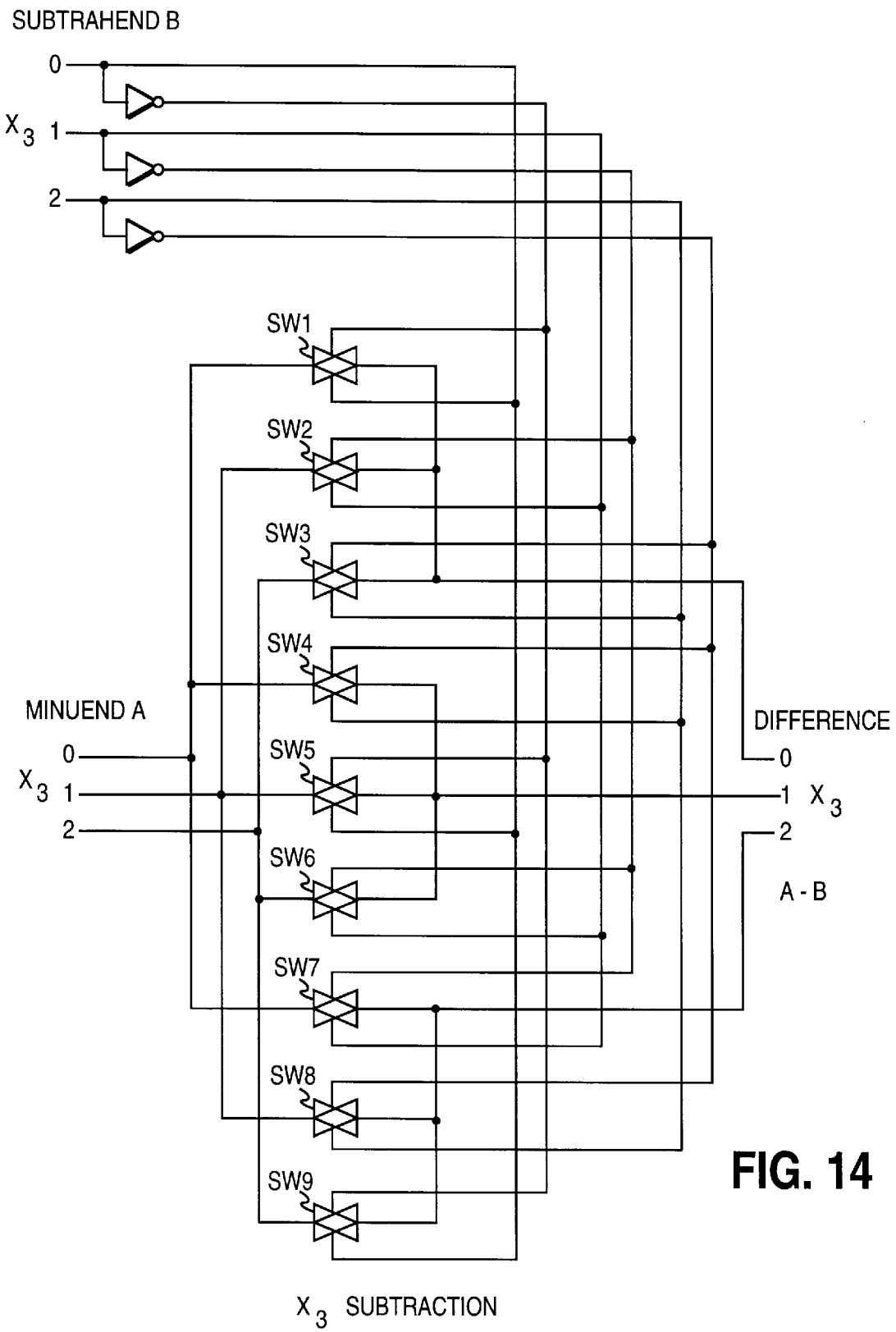
FIG. 14 is an exemplary circuit diagram for subtraction of the modulo 3 digits of two numbers in a one-hot RNS system.

Now consider subtraction in the system of the present invention. For the $x_3$ digits of two numbers being subtracted, there are again only three combinations of digits that can be subtracted to obtain a particular result. For instance, a result of 0 can only be obtained by 0–0, 1–1 or 2–2, a result of 1 can only be obtained by subtracting 1–0, 2–1 or 0–2, and a result of 2 can only be obtained by subtracting 2–0, 0–1 or 1–2. A circuit for accomplishing subtraction for the $x_3$ digits of two numbers is shown in FIG. 14. Here the 0, 1 and 2 lines of the A minuend are provided as the A input of the switches (see FIGS. 12A and 12B). Again, the signals on the B subtrahend lines are inverted by the inverters shown so that both the signals on the B subtrahend lines and their inverse are available, as required by the switches used in the preferred embodiment. The circuit components are identical to the circuit for addition, though the component interconnections are different. Again the switches themselves are logically divided into three groups (the modulus of the digit being added) of three switches (again the modulus of the digit being added). The output of the first three switches determines whether the state of the number 0 line of the DIFFERENCE is high or low, the output of the second three switches determines whether the state of the number 1 line of the DIFFERENCE is high or low and the output of the third three switches determines whether the state of the number 2 line of the DIFFERENCE is high or low.

Figure 15:
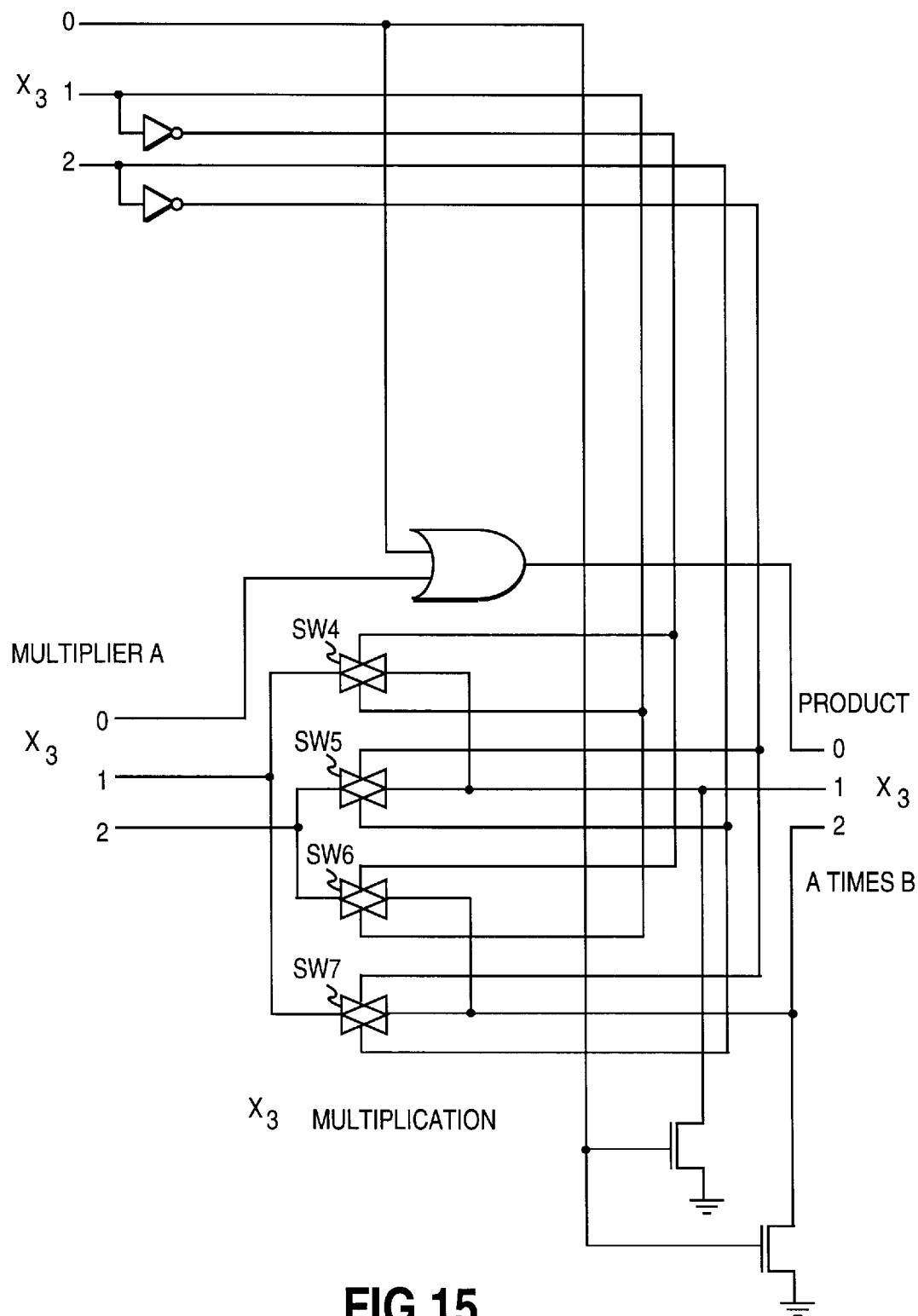
FIG. 15 is an exemplary circuit diagram for multiplication of the modulo 3 digits of two numbers in a one-hot RNS system.

Multiplication is similar for non-zero digits if the modulus is a prime number (the case where the modulus is not prime will be discussed below), but a zero digit (zero line high) in either the multiplier or the multiplicand dictates a zero (zero line high) in the result. Thus for the $x_3$ digit again, 1 times 1=1, 2 times 1=2, 1 times 2=2 and 2 times 2=4 mod(3)=1. These four conditions can be accounted for by the proper connection of switches as in the case of addition and subtraction, as shown by the four switch connections in FIG. 15. However if either the multiplier or the multiplicand is zero, the product must be zero (0 line high). This is provided by the OR gate in FIG. 15 which drives the 0 line in the product high whenever either the 0 line in the multiplier A or the 0 line in the multiplicand B is high. If however the 0 line in the multiplicand B is high, none of the switches SW1, SW2, SW3 and SW4 will be on. Consequently the number 1 line and the number 2 line in the product will be electrically floating. To positively pull these lines low when line number 0 in the multiplicand B is high, a pair of n-channel devices driven by line number 0 in the multiplicand B are provided, turning on to pull lines 1 and 2 low when line 0 of the multiplicand is high.

Now consider multiplication of RNS digits when the modulus of the digit is not a prime number. This means that the modulus may be expressed as the product of at least two other integers not equal to 1. Consider for instance the multiplication of two RNS digits of modulus 6, each of which therefore can have a value of 0, 1, 2, 3, 4 or 5. As before, 0 times any other digit value is 0. But now 2*3 and 3*2 are also both zero in RNS multiplication, as are 3*4 and 4*3. Thus not only must the presence of 0 in either (or both) one-hot RNS inputs be detected and in response the 0 one-hot line driven high and any resulting floating lines driven low as in FIG. 15, but in addition the same must be done when the inputs are 2 and 3, 3 and 2, 3 and 4 and 4 and 3. This may be done by 1) ANDing the 2 one-hot line of multiplier A and the one-hot 3 line of the multiplicand B, 2) ANDing the 3 one-hot line of multiplier A and the 2 one-hot line of the multiplicand B, 3) ANDing the 3 one-hot line of multiplier A and the 4 one-hot line of the multiplicand B, 4) ANDing the 4 one-hot line of multiplier A and the 3 one-hot line of the multiplicand B, and 5) ORing the result of the four ANDing operations, the 0 one-hot line of the multiplier A and the 0 one-hot line of the multiplicand B. Now if the result of the ORing operation is positive, the 0 line of the result should again be driven high and any other lines that would be electrically floating should be driven low, as with n-channel transistors like the two n-channel transistors in FIG. 15. Because of this and other similar complications, it is preferable to avoid the use of nonprime moduli.

Figure 16:
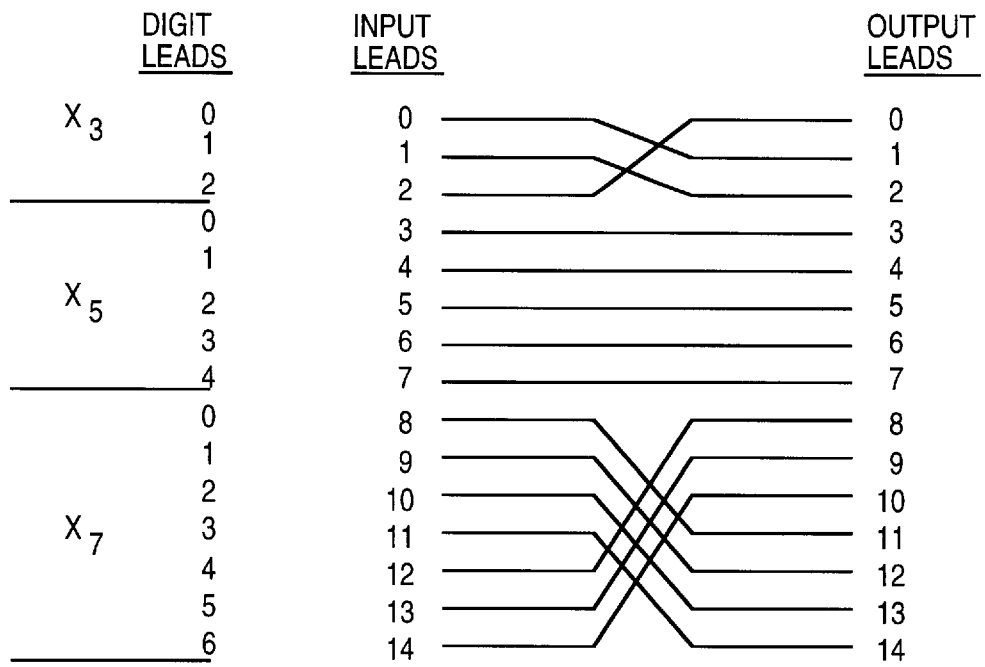
FIG. 16 is an exemplary circuit diagram for addition of the RNS equivalent (103) of the natural number 10 (a constant) to an arbitrary one-hot RNS input in a 3,5,7 one-hot RNS system.

Before considering conversion from and to natural numbers and other operations on RNS numbers, consider addition, subtraction and multiplication wherein one of the two numbers involved in the addition, subtraction or multiplication is a fixed number. Multiplication by a fixed coefficient is particularly common in the processing of digital signals, for filtering, signal detection and/or demodulation and many other functions. Obviously the fixed input can be applied as either the A input or the B input of the addition, subtraction and multiplication circuits of FIGS. 13, 14 and 15. However, assume the fixed number is applied as the B input of these circuits. This permanently sets the switches in the circuits, so that the switches can be eliminated in favor of hardwiring (in integrated circuit form) the connections that otherwise would have been made by the switches. As an example consider the addition, subtraction and multiplication by the natural number 10 (103 RNS in the exemplary RNS system). FIG. 16 shows the addition of the RNS equivalent (103) of the natural number 10 to an arbitrary one-hot RNS input. Adding 1 to any value of the $x_3$ digit will obviously increase the value by 1. Thus the number 0 line of the input is directly connected to the number 1 line of the output and the number 1 line of the input is directly connected to the number 2 line of the output. The sum of (2+1)mod(3)=0, so the number 2 line of the input is connected to the number 0 line of the output. The $x_7$ connections are determined the same way, advancing, with wrap around, 3 instead of 1 in the interconnection of the lines. Because the $x_5$ digit is 0, no change between the input and the output occurs. Therefore they are directly connected. The net effect, however, is that the sum resulting from the addition of a constant is, in a general sense, really only a renumbering (and probably a rerouting) of the input lines.

Figure 17:
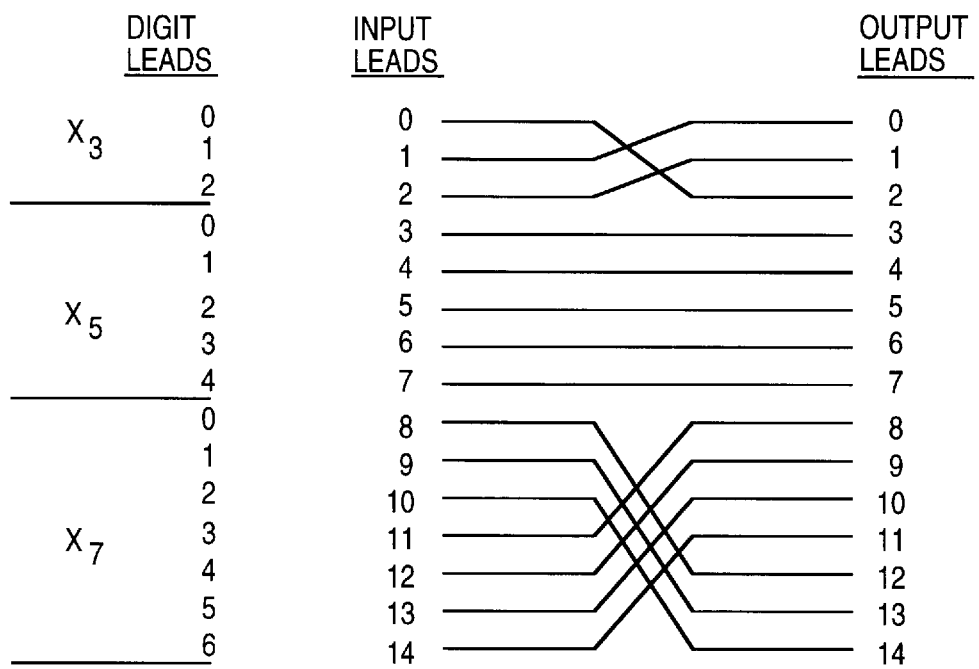
FIG. 17 is an exemplary circuit diagram for subtraction of the RNS equivalent (103) of the natural number 10 (a constant) from an arbitrary one-hot RNS input in a 3,5,7 one-hot RNS system.

Subtraction of the RNS equivalent (103) of the natural number 10 from an arbitrary one-hot RNS input is very similar (but not with identical circuit interconnections), as shown in FIG. 17. Here again, the difference resulting from the subtraction of a constant is, in a general sense, really only a renumbering of the input lines. In fact it is the same as the addition circuit if the input and the output of the addition circuit are reversed. This, however, is no surprise, as X+10−10=X. It illustrates another point about the present invention, however. That is, that operations that involve successive operations with constants can be concatenated into a single "renumbering". This will be illustrated after considering the multiplying by a constant and the change in sign of a number (multiplying by −1), as disclosed below.

Figure 18:
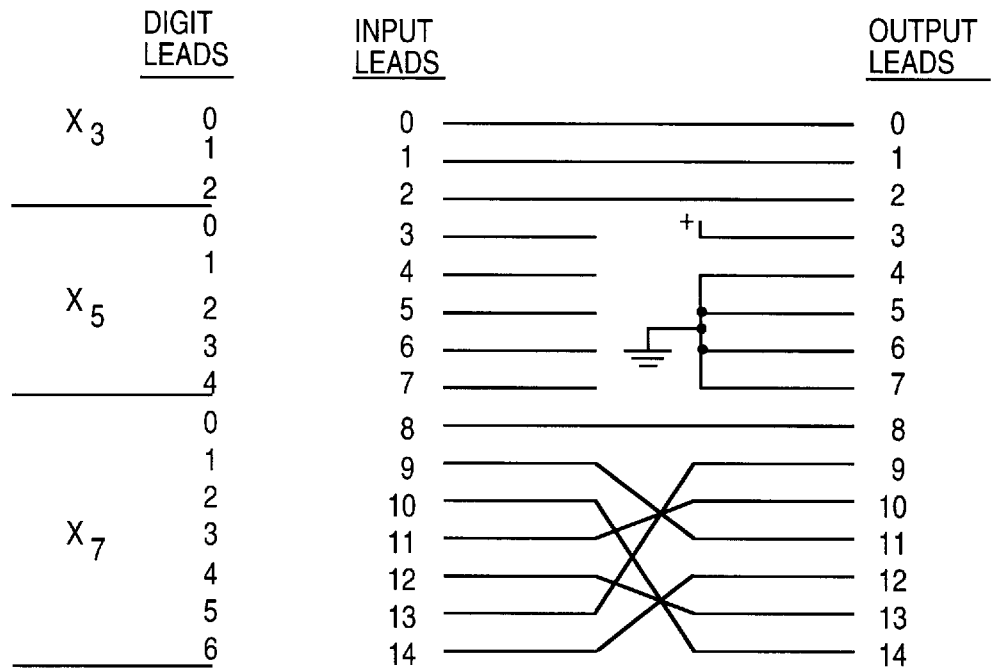
FIG. 18 is an exemplary circuit diagram for multiplying by 10 in a 3,5,7 one-hot RNS system.
Figure 19:
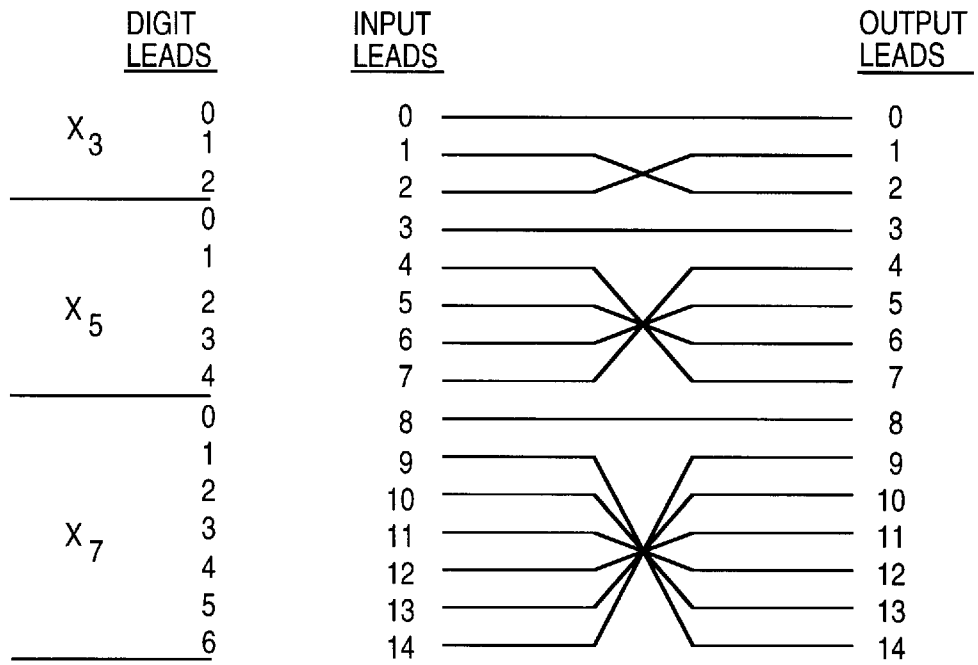
FIG. 19 is an exemplary circuit diagram for changing sign (multiply by −1) in a 3,5,7 one-hot RNS system.

A circuit for multiplying by 10 is shown in FIG. 18. Note that any natural number multiplied by 10 will be divisible by 5, so that the zero line of the $x_5$ digit is always high, independent of the input. Similarly, a circuit for multiplying by −1 is shown in FIG. 19. Here 0 times anything is 0, and −1 times any RNS digit of mod(m)=m− (the original RNS digit).

Regarding concatenation, consider the operations of subtracting 10 from an input, multiplying the result by 10 and then changing the sign of the result by multiplying by −1. This is shown in step by step sequence in Table D7 below.

TABLE D7

| | | Column | | |
|---|---|---|---|---|
| 1 Input lines for input signal "X" | 2 X-10 (FIG. 17) | 3 Con- nection | 4 Multiply (X-10) by 10 (FIG. 18) | 5 Multiply by −1 (FIG. 19) |
| 0 | 2 | Yes | 2 | 1 |
| 1 | 0 | Yes | 0 | 0 |
| 2 | 1 | Yes | 1 | 2 |
| 3 | 3 | No | 3 high | 3 high |
| 4 | 4 | No | 4 low | 7 low |
| 5 | 5 | No | 5 low | 6 low |
| 6 | 6 | No | 6 low | 5 low |
| 7 | 7 | No | 7 low | 4 low |
| 8 | 12 | Yes | 13 | 10 |
| 9 | 13 | Yes | 9 | 14 |
| 10 | 14 | Yes | 12 | 11 |
| 11 | 8 | Yes | 8 | 8 |
| 12 | 9 | Yes | 11 | 12 |
| 13 | 10 | Yes | 14 | 9 |
| 14 | 11 | Yes | 10 | 13 |

The first two columns of Table D7 represent the mapping of the input to the output of FIG. 17 for subtracting the natural number 10. The third column indicates whether the lines of the second column are connected to the output of the multiplier circuit of FIG. 18. The fourth column relative to the second column shows the mapping of the input to the output of FIG. 18 for Multiplying by the natural number 10. Finally, the fifth column relative to the fourth column represents the mapping of the input o the output of FIG. 19 to change the sign of the result of the previous operations by multiplying by −1. But the combinations of operations may be represented by a single circuit: a single "renumbering" of the input and output leads, taken directly from Table D7, as follows in Table D8.

TABLE D8

| | Table D7 Column | |
|---|---|---|
| | | 5 |
| | | (X-10) (10) (−1) |
| | | X-10 |
| | | (FIG. 17) |
| | | multiply result by 10 |
| 1 | 3 | (FIG. 18) |
| Input lines for | Con- | change sign of result |
| input signal "X" | nection | (FIG. 19) |
| 0 | Yes | 1 |
| 1 | Yes | 0 |
| 2 | Yes | 2 |
| 3 | No | 3 high |
| 4 | No | 7 low |
| 5 | No | 6 low |
| 6 | No | 5 low |
| 7 | No | 4 low |
| 8 | Yes | 10 |
| 9 | Yes | 14 |
| 10 | Yes | 11 |
| 11 | Yes | 8 |
| 12 | Yes | 12 |
| 13 | Yes | 9 |
| 14 | Yes | 13 |

Figure 20:
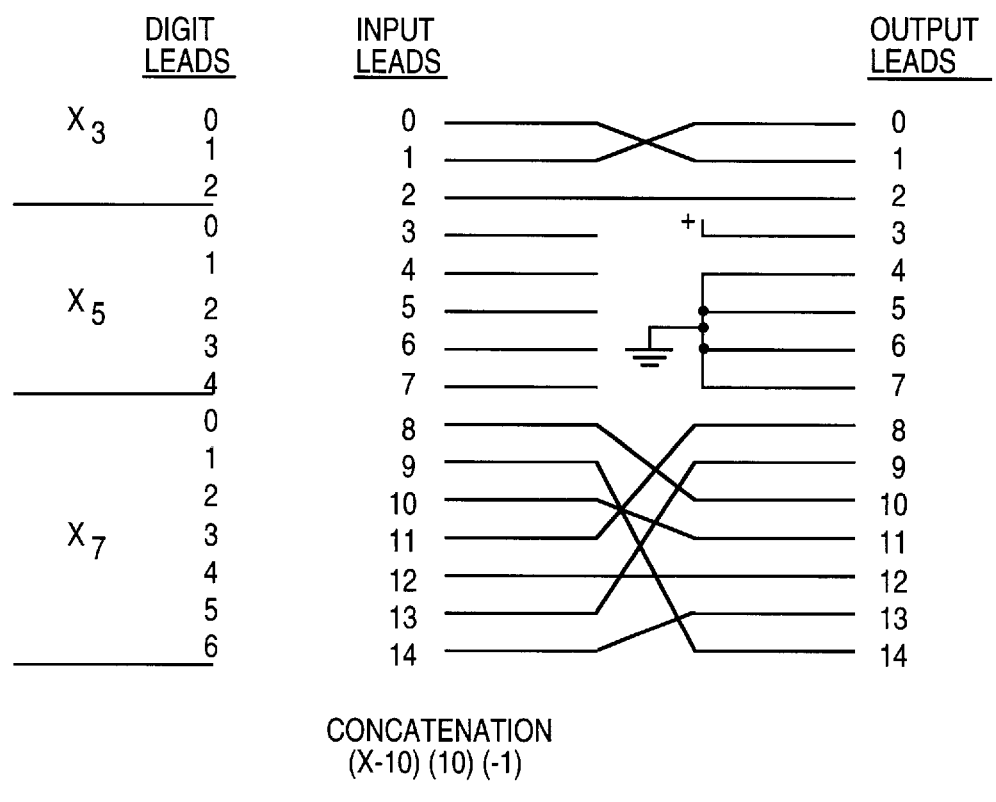
FIG. 20 is an exemplary circuit diagram for concatenation of certain operations in a one-hot RNS system.

The foregoing is shown in circuit form in FIG. 20. As an example, consider an input of natural number 14 (240 RNS). (14 minus 10)*10*(−1) is −(4*10)=−40. The RNS representation of the natural number −40 in the 3,5,7 RNS representation is −40 mod(3), −40 mod(7)=202 RNS. The input natural number 14 (240 RNS) results in the 3 digit line 2 high, the 5 digit line 4 high and the 7 digit line 0 high, with the rest of the lines being low. This corresponds to input leads 2, 7 and 8 being high, with the rest being low. Input lead 2 high happens to make the output lead 2 high. Input lead 8 high makes the output lead 10 high, and the fixed coupling of output leads 3 through 7 makes output lead 3 high regardless of which one of input leads 3 through 7 is high. Output leads 2, 3 and 10 high correspond to digit leads 2, 0 and 2 being high, representing the RNS number 202, shown above to represent the natural number −40 as expected.

Figure 32:
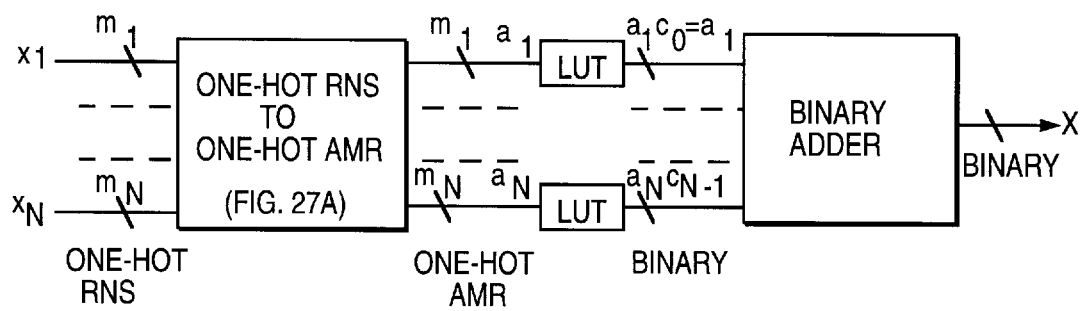
FIG. 32 is a block diagram for an exemplary circuit for the conversion of a number X expressed in one-hot RNS form to a binary representation of the number X.

Now consider the conversion of a binary number to an RNS number, again in the 3,5,7 RNS system, now having the natural number range of 0 to 104. If a 7 bit binary number is used, then care must be exercised to not exceed the total range of 105 of the RNS number by the 7 bit binary number which has a total range of 128. If only a 6 bit number is to be converted, then the range limitation is imposed in the binary domain, not the RNS domain. For specificity in the example, assume a 6 bit binary number. The least significant bit adds 0 or 1, the next least significant bit adds 0 or 2, the next least significant bit adds 0 or 4, etc. Thus each binary bit can be added in accordance with its weight modulo (the respective modulus). A circuit for doing this is shown in block diagram form in FIG. 32, and in more detail for the $x_3$ and $x_5$ digits in FIG. 33. In the circuit of FIG. 32, the boxes with the "R" therein are fixed multiplier circuits, which are nothing but a renaming (and rerouting) of the "b" inputs thereto. Note that all "b" signals in one-hot form have only 2 lines that can be high; the 1 line and the 0 line. These two can be readily generated from a traditional binary encoding scheme by routing the respective $b_n$ line to the number 1 one-hot line and its inverse $\overline{b_n}$ to the number 0 one-hot line. The other one-hot lines are effectively tied low. The circles with the + therein in FIG. 32 and the boxes marked "ADD" in FIG. 33 are adder circuits in accordance with the adder of FIG. 13.

Figure 33:
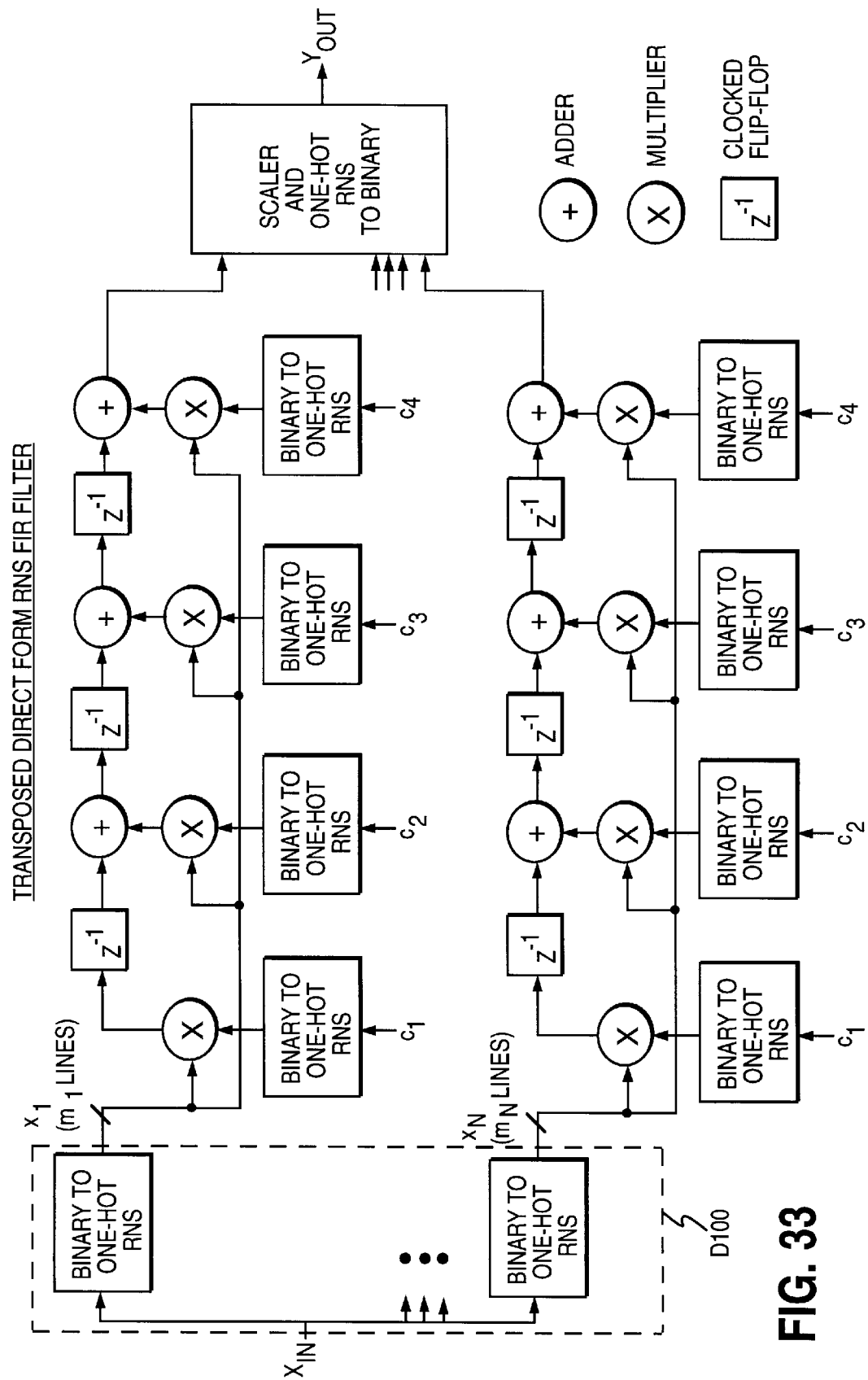
FIG. 33 illustrates a 4-tap finite impulse response (FIR) filter implemented in a transposed direct form with binary input and binary output and with a one-hot RNS interior.

Referring to FIG. 32 and particularly to FIG. 33, in the adder string for forming the three $x_3$ digit one-hot lines of the binary to RNS converter, the b0 input to the respective adder is connected to the number 1 line of the $x_3$ digit input to the adder and its inverse $\overline{b_0}$ forms the number 0 line of the adder. The number 2 input line to this input of the adder is tied low, as the $b_0$ input to the adder can only represent a 0 or a 1, depending on whether $b_0$ is low or high, respectively. The b1 input to the respective adder is connected to the number 2 line of the $x_3$ digit input to the adder and its inverse $\overline{b_1}$ forms the number 0 line of the adder. The number 1 input line to the adder is tied low, as the $b_1$ input to the adder can only represent a 0 or a 2, depending on whether $b_1$ is low or high, respectively. The $b_2$ input to the next adder is connected to the number 1 line (4 mod(3)=1) of the $x_3$ digit input to the respective adder and its inverse $\overline{b_2}$ forms the number 0 line of the adder. The number 2 input line to the adder is tied low, as the input to this adder can only represent a 0 or a 4, depending on whether $b_2$ is low or high, respectively, etc.

Referring again to FIGS. 21 and 22, note that for the conversion of the number from a six binary bit representation to a 3,5,7 RNS representation, three chains of five adders each are shown, the first to add $b_0$ and $b_1$, the second to add $b_2$ to the sum, etc. This will have a ripple-through time delay, and waste some power because of the possibility of multiple changes of state during the ripple-through. An alternate implementation shown in FIG. 23 would be to use in each adder group, one adder to add $b_0$ and $b_1$, a second adder to add $b_2$ and $b_3$ at the same time, and a third adder to add $b_4$ and $b_5$ at the same time. Then a two adder chain could be used to add $(b_0+b_1)$ to $(b_2+b_3)$ and then to add the result to $(b_4+b_5)$. While this requires the same number of adders, the adder chaining is reduced from a string of five adders to a string of three adders, reducing the ripple-through time and potentially the number of ripple-through state changes.

Figure 24:
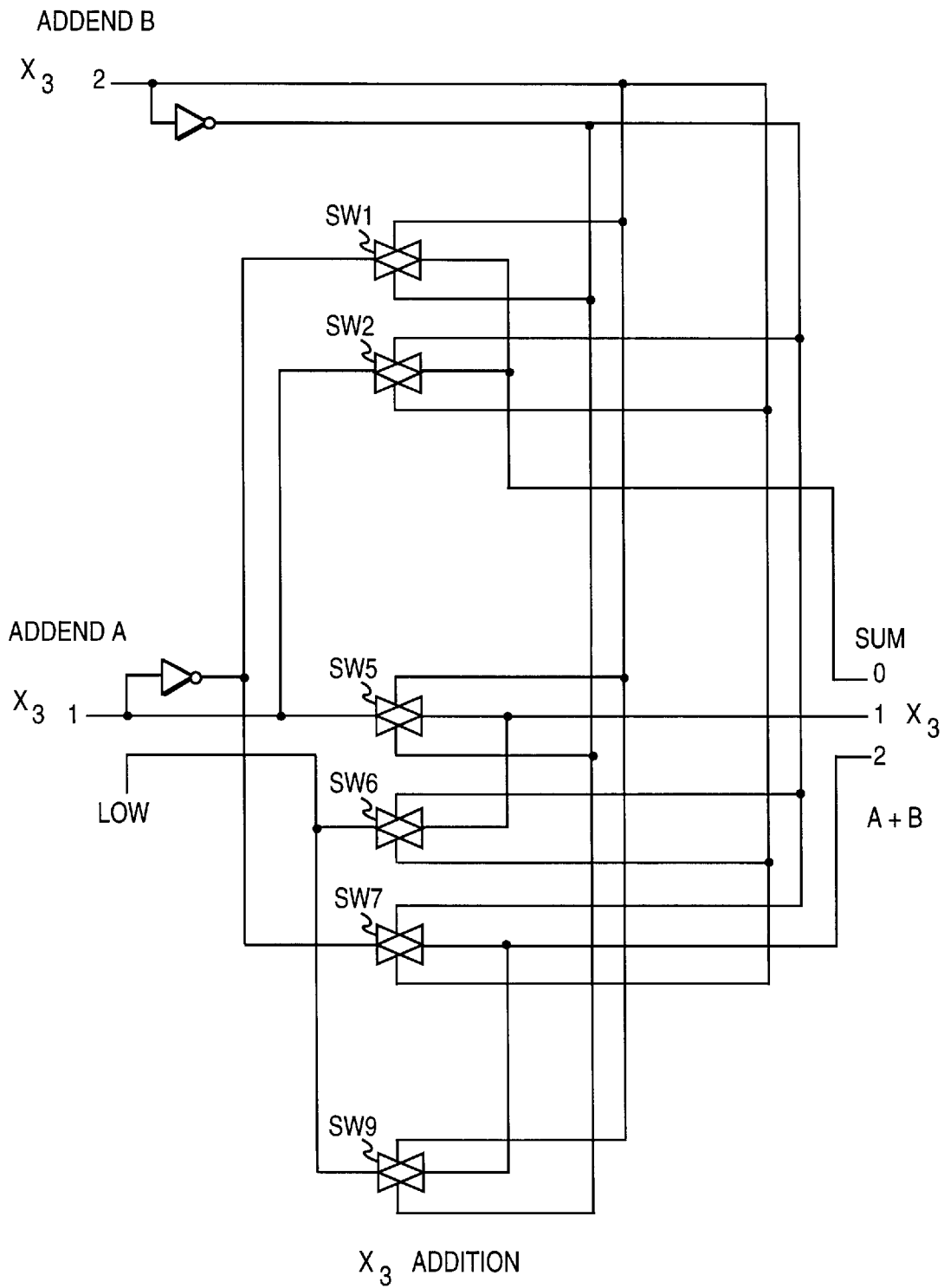
FIG. 24 is a circuit diagram illustrating available circuit simplifications, in this case an adder simplification, when the state of specific one-hot RNS input lines is predetermined.

In certain calculations in accordance with the present invention one-hot system, simplification of the generalized circuits may be achieved. By way of example, in the case of addition, subtraction, and multiplication involving a constant, applying the constant as the "B" input of the generalized circuits of FIGS. 13, 14 and 15 permanently sets the switches so that the switches can be eliminated in favor of no connections at all for the lines in which the switches would always be open and a hardwired line for the lines in which the switches would always be closed. This then reduces to transistorless addition, subtraction and multiplication functions in the form of simple renumbering of the lines. As a further example, consider the first adder in the binary to RNS converter of FIG. 33 for the $x_3$ RNS digit—the adder at the upper left of FIG. 33. Referring to FIG. 13 for the generalized $x_3$ adder, the number 1 line of the B addend is always low (see the adder at the upper left of FIG. 33). This means that switches SW3, SW4 and SW8 are always off, so that the switches and the lines thereto can be eliminated, as shown in FIG. 24. Also since the B addend input is a single binary bit representing 0 or 2, only the number 2 line and its inverse are needed, as the number 0 line is the inverse of the number 2 line and the number 2 line is the inverse of the number 0 line. Similarly, since the A addend input is also a single binary bit representing 0 or 1, only the number 1 line and its inverse are needed. This too is shown in FIG. 24.

Figure 21:
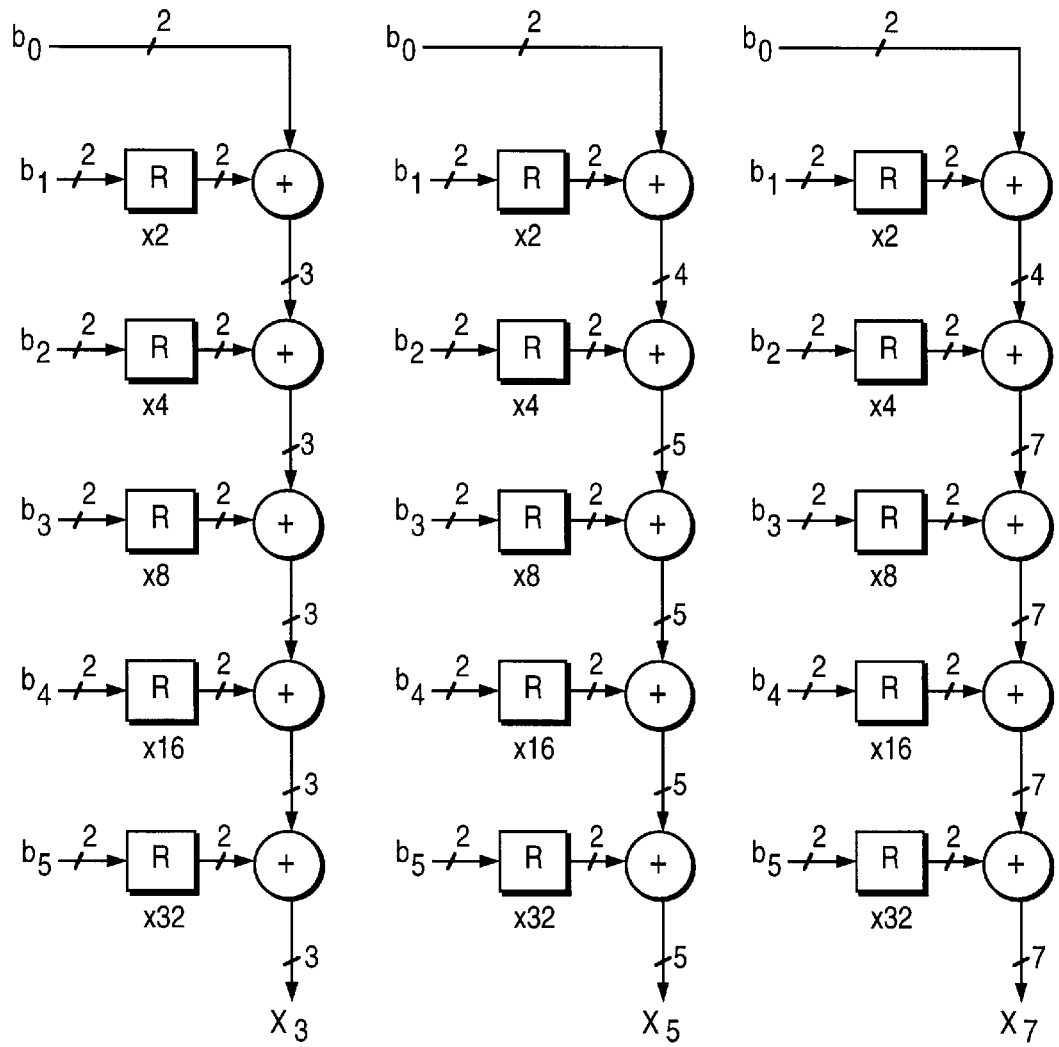
FIG. 21 is a block diagram for a circuit for the conversion of an unsigned binary number to a 3,5,7 one-hot RNS system representation.
Figure 22:
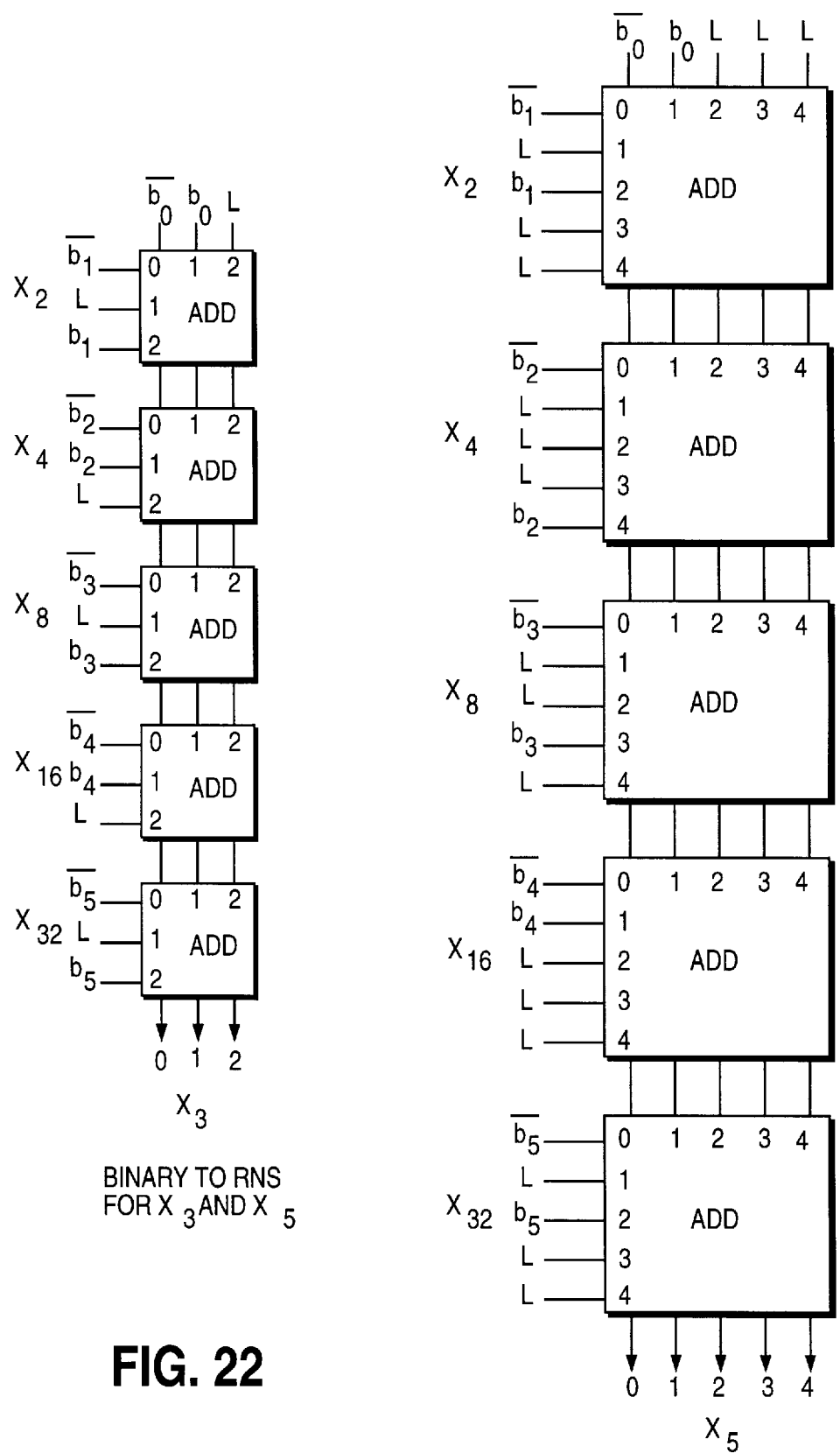
FIG. 22 is a circuit diagram for the conversion of an unsigned binary number to the modulo 3 and modulo 5 digits of a one-hot RNS system.
Figure 23:
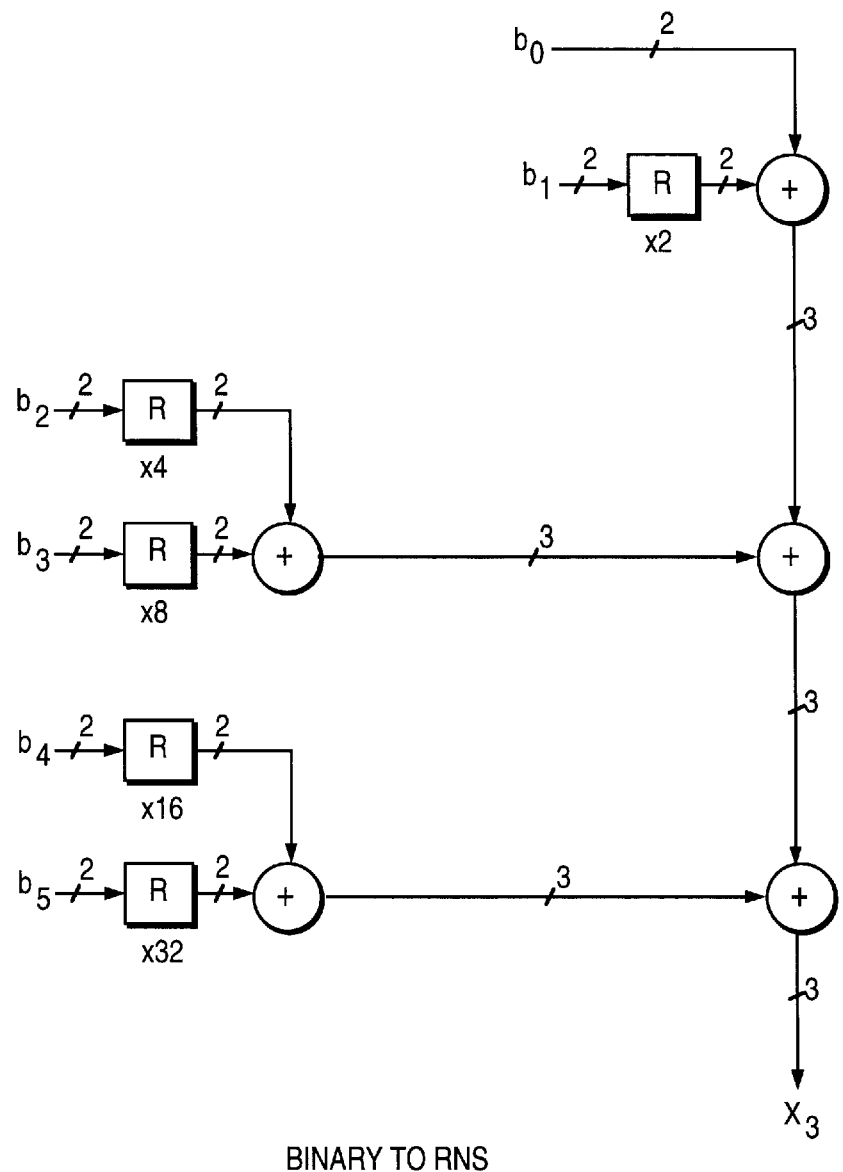
FIG. 23 is an alternate circuit diagram for the conversion of an unsigned binary number to the modulo 3 digit of a one-hot RNS system.
Figure 25:
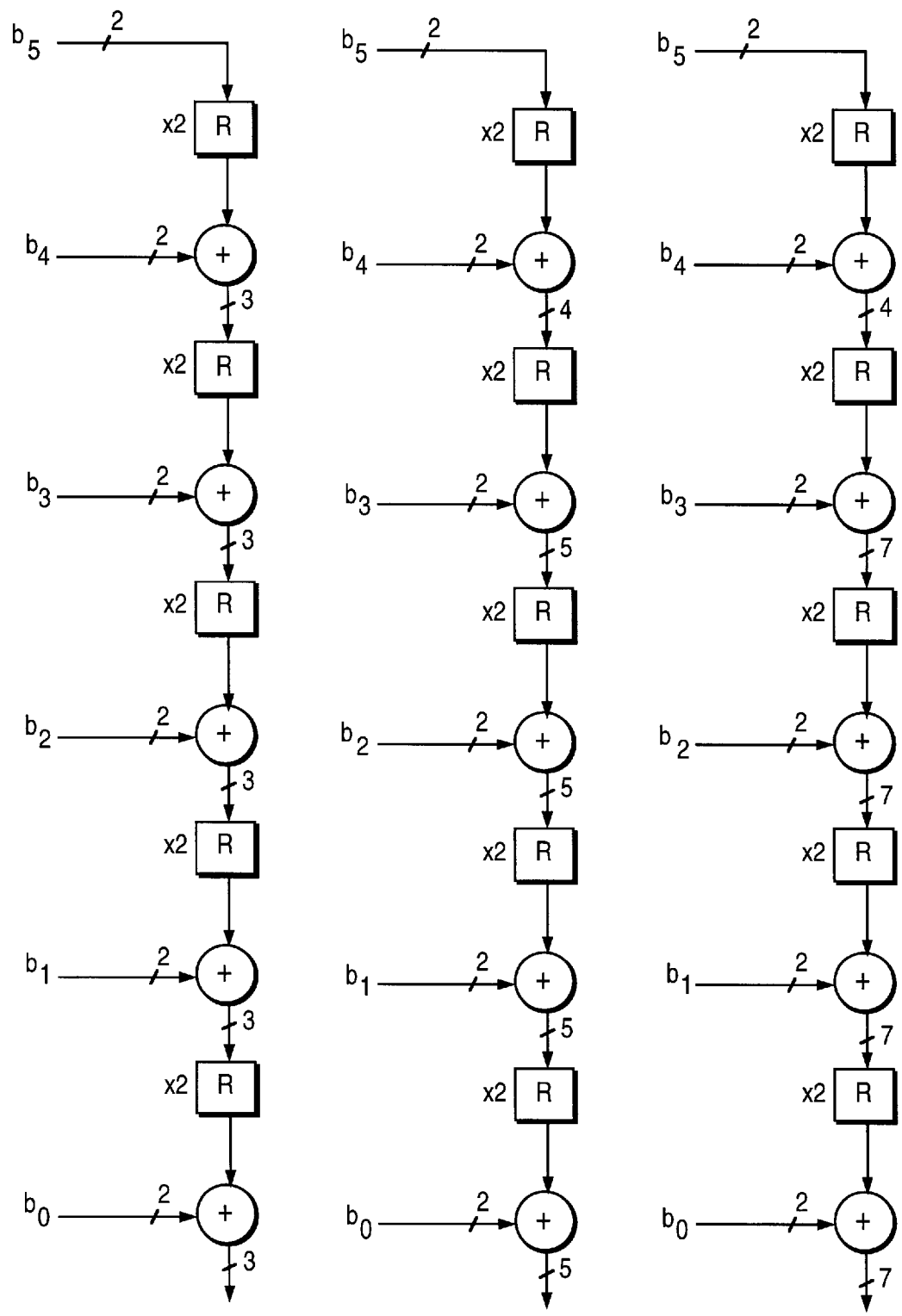
FIG. 25 is a block diagram for a circuit for the conversion of an unsigned binary number to a 3,5,7 one-hot RNS representation using a most significant bit first type circuit.

FIGS. 21 and 22 are basically a least significant bit first type circuit for binary to RNS conversion. FIG. 25 illustrates a most significant bit first circuit in block diagram form for binary to RNS conversion in accordance with the present invention. In this circuit, the value of each sum is multiplied by 2 before the value of the next most significant bit is added, etc. While the result is the same as for the circuits of FIGS. 21 and 22, the circuit of FIG. 25 may have a circuit layout advantage because of the replication of the fixed multipliers.

The foregoing conversion from binary to one-hot RNS representation was done without consideration of the possibility of negative numbers, and of how negative numbers might be represented in binary form. Typically the binary representations of the numbers to be converted to one-hot RNS representations in systems using the present invention will be in two's complement form. In this form, the most significant bit is the sign bit, 0 if positive and 1 if negative. If 0, then the remaining bits represent the magnitude of the number X in binary form. If the most significant bit is 1, then the remaining bits, after being inverted and then 1 being added thereto, represent the magnitude of the negative number X in binary form. Equivalently, if the most significant bit is 1, then the remaining bits give the magnitude above $-(2^{N-1})$.

Figure 26:
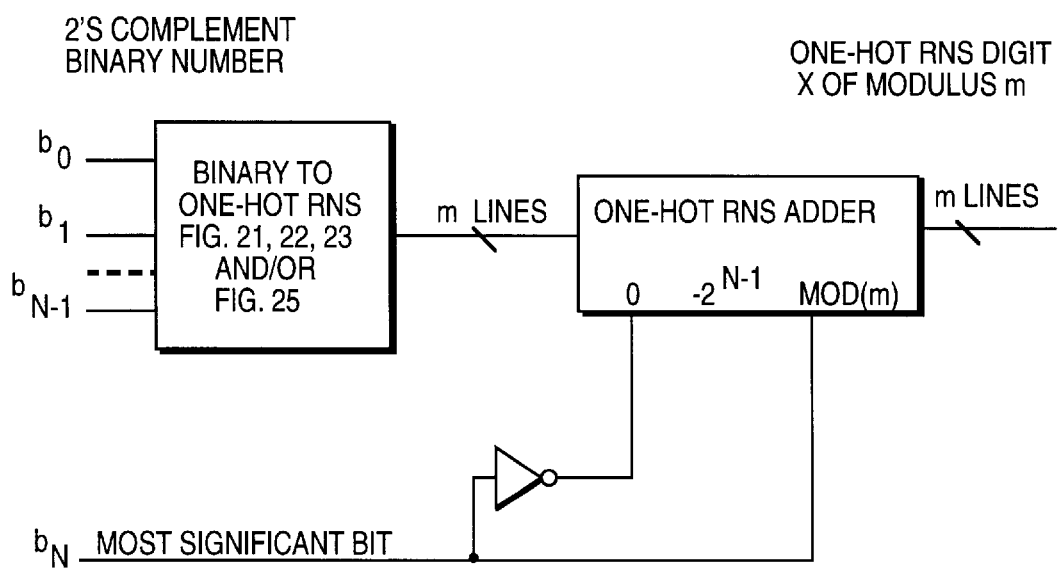
FIG. 26 is a block diagram for the conversion of a two's complement binary number to a one-hot RNS representation of that number.

The conversion of two's complement binary numbers representing positive numbers to one-hot RNS representation (most significant bit=0) can be achieved as shown in FIG. 32 and 11, or FIG. 25. A circuit for converting a two's complement binary representation of a number X, which includes negative numbers, to a one-hot RNS representation of the number X is shown in FIG. 26. This figure illustrates a direct implementation of the approach that if the most significant bit is 0, then the remaining bits represent the magnitude of the number X in binary form, but if the most significant bit is 1, then $-(2^{N-1})$ is added, so that the other bits give the magnitude above $-(2^{N-1})$.

As previously mentioned, some operations are difficult in an RNS system. The Associated Mixed Radix (AMR) conversion discussed in the prior art can be helpful in such operations. For instance, in an RNS system wherein positive and negative numbers are represented, the AMR representation may be used for the detection of the sign of a number X. In particular, consider the AMR digits $a_1, a_2, \ldots a_{N-1}, a_N$ in the AMR representation of a number X wherein $m_N=2$. The equation for X becomes:

$$X = a_1 + a_2 * m_1 + a_3 * (m_1 * m_2) + \ldots + a_{N-1} * (m_1 * m_2 * \ldots * m_{N-2}) + a_N * (m_1 * m_2 * \ldots * m_{N-2} * m_{N-1})$$

wherein: $a_N = 0$ or $-1$, and $a_1$ through $a_{N-1}$ are zero or positive numbers only.

If $a_N = 0$, then X is in the range of 0 to $((m_1 * m_2 * \ldots * m_{N-2} * m_{N-1}) - 1)$.

If $a_N = -1$, then X is in the range of $-(m_1 * m_2 * \ldots * m_{N-2} * m_{N-1})$ to $-1$.

The sign of X is indicated by the value of $a_N$, $a_N=0$ being plus and $a_N=-1$ being negative. (X=0 is considered positive, and if to be detected, can be detected by ANDing the zero lines of all one-hot RNS digits.) Consequently one can determine the sign of a number X expressed in a positive and negative RNS representation as follows:

1. A one-hot RNS digit of modulus 2 should be included in the initial one-hot representation of the number or numbers being processed.
2. Order the RNS digits so that the digit of modulus 2 is the last RNS digit and so is associated with the most significant AMR digit $a_N$.
3. Convert the RNS representation of the number X to the equivalent AMR representation of X, and
4. Determine the value of $a_N$ for determination of the sign of X, 0 for plus and $-1$ for negative. (A digit of even modulus above 2 can also be used instead of a digit of modulus 2, in which case the sign of X is positive if $a_N$ is 0 or positive, and the sign of X is negative if $a_N$ is negative.)

Figure 27A:
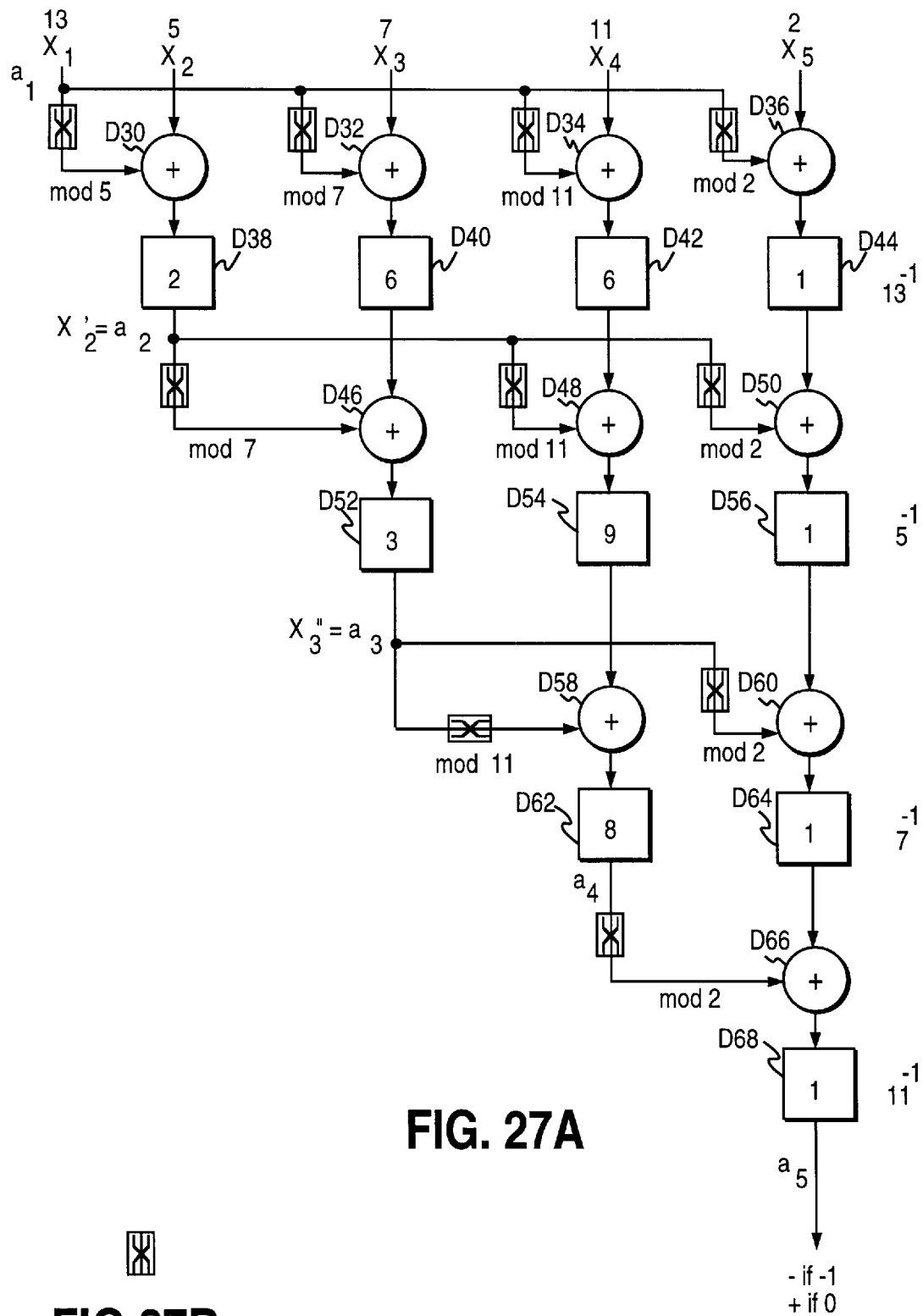
FIG. 27A is a block diagram for determining the sign of a number X expressed in a 13,5,7,11,2 one-hot RNS form.

A circuit for establishing the AMR representation (in one-hot form) and for determining the sign of X in an exemplary one-hot RNS system having an RNS digit of modulus 2 is shown in FIG. 27A. For this circuit, a total of 10 adder/subtractors are involved. The first row of subtraction circuits D30, D32, D34 and D36 forms $x-a_1$, where $a_1$ is the first AMR digit, associated with mod (13) and equal to $x_1$ of the RNS number. In the one-hot system, the $x_1$ input is a 13 line input ($x_1$ lines 0 through 12), the $x_2$ input is a 5 line input ($x_2$ lines 0 through 4), the $x_3$ input is a 7 line input ($x_3$ lines 0 through 6), the $X_4$ input is a 11 line input ($X_4$ lines 0 through 10), and the $x_5$ input is a 2 line input ($x_5$ lines 0 and 1). Since the subtraction circuits D30, D32, D34 and D36 are modulo 5, modulo 7, modulo 11 and modulo 2 subtraction circuits, though $a_1$ can range from 0 to 12, $a_1$ modulo 5, $a_1$ modulo 7, $a_1$ modulo 11 and $a_1$ modulo 2 must be determined. This is a remapping of lines as in Table D9 below.

TABLE D9

| | | $a_1$ mod( ) | | |
|---|---|---|---|---|
| $a_1$ line high | $x_2$ line high | $x_3$ line high | $x_4$ line high | $x_5$ line high |
| 0 | 0 | 0 | 0 | 0 |
| 1 | 1 | 1 | 1 | 1 |
| 2 | 2 | 2 | 2 | 0 |
| 3 | 3 | 3 | 3 | 1 |
| 4 | 4 | 4 | 4 | 0 |
| 5 | 0 | 5 | 5 | 1 |
| 6 | 1 | 6 | 6 | 0 |
| 7 | 2 | 0 | 7 | 1 |
| 8 | 3 | 1 | 8 | 0 |
| 9 | 4 | 2 | 9 | 1 |
| 10 | 0 | 3 | 10 | 0 |
| 11 | 1 | 4 | 0 | 1 |
| 12 | 2 | 5 | 1 | 0 |

Figure 27B:
FIG. 27B is a diagram of a symbol used in FIG. 27A to indicate a change in modulus (number of lines) of a value.
Figure 28:
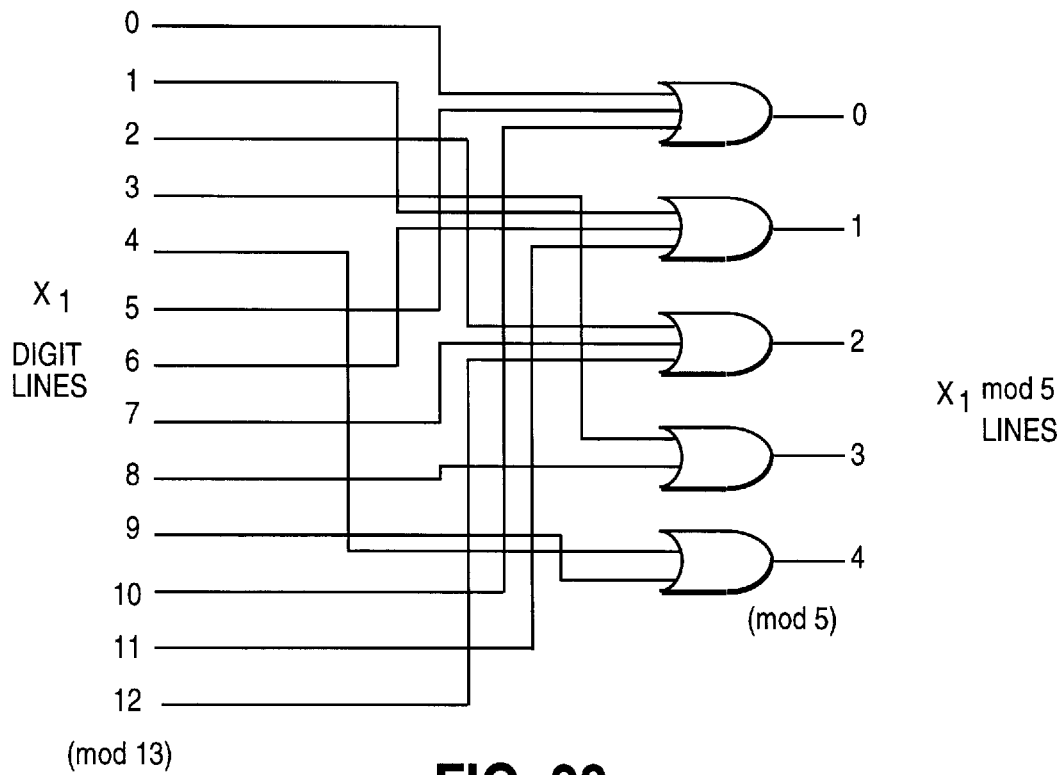
FIG. 28 is a circuit diagram for changing modulus from 13 to 5 for the subtracter D30 of FIG. 27A.
Figure 29:
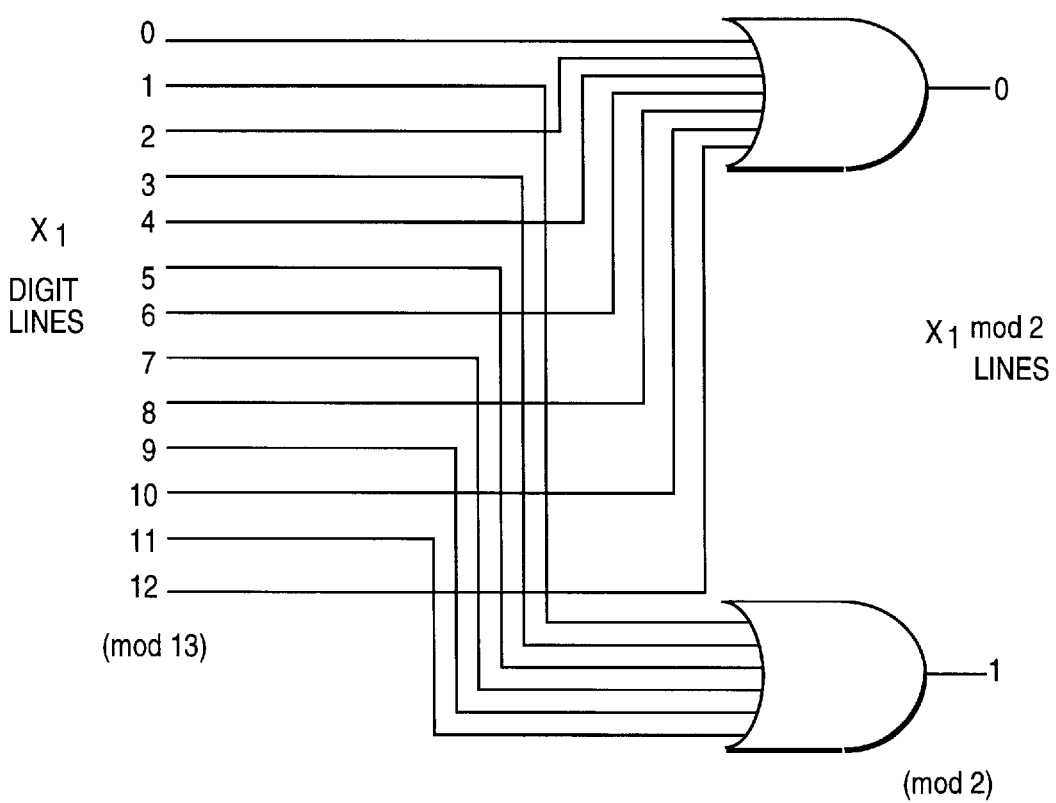
FIG. 29 is a circuit diagram for changing modulus from 13 to 2 for one set of two inputs to subtracter D36 of FIG. 27A.

A specific circuit for determining the five inputs for the subtractor 30 of FIG. 27A is shown in FIG. 28, and for the two inputs of subtractor D36 in FIG. 29. Similar detailed circuits for the inputs for the other adder/subtractors using OR gates or equivalent are easily derived from Table D9. Circuits of this general type for converting a one-hot RNS signal of one modulus to a one-hot RNS signal of a smaller modulus in FIG. 27A are indicated by the symbol shown in FIG. 27B. The output of the subtractors D30, D32, D34 and D36 are $X-a_1$, in one-hot RNS form. Note that subtraction of the value of the $x_1$ digit from the RNS number reduces the value of this RNS digit to zero. This means that the value of the resultant RNS number is now divisible by 13. The $x_1$ digit is dropped in the following division because, as discussed in the prior art section, its value after the division cannot be known.

Figure 30A:
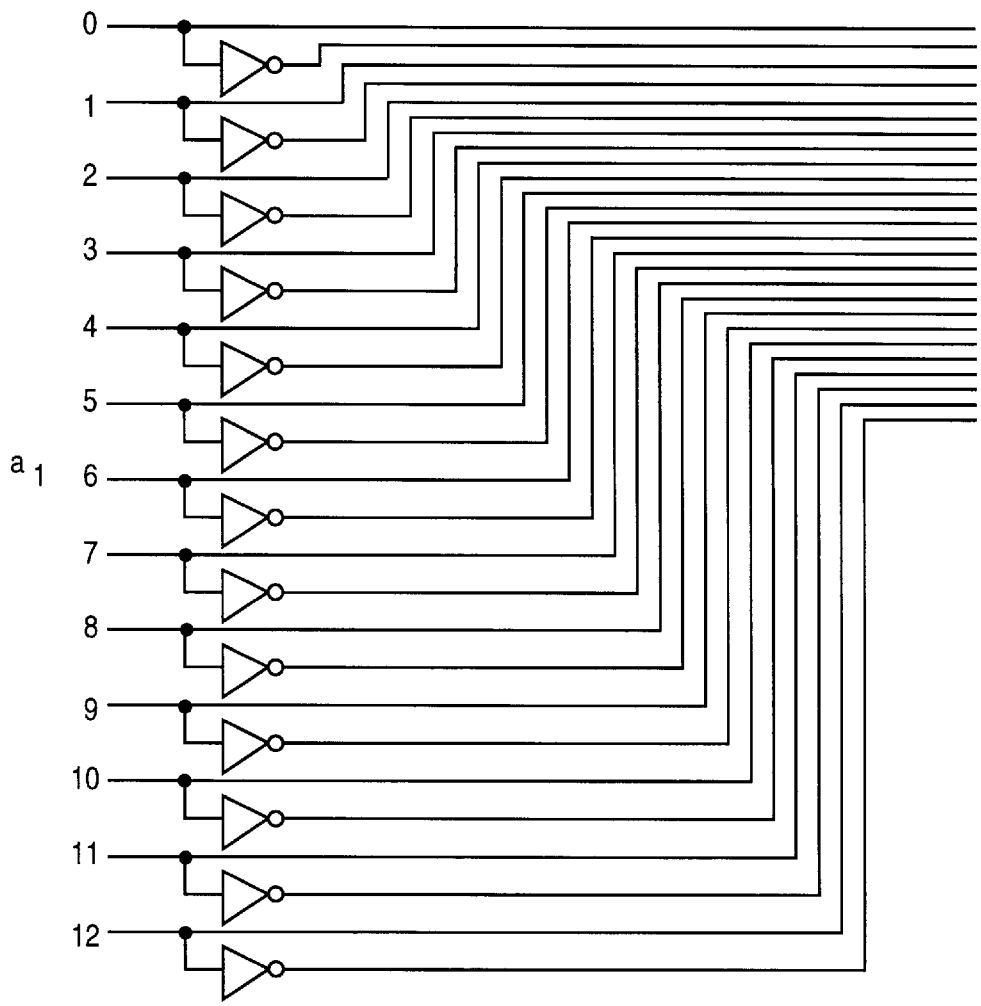
FIGS. 30A and 30B illustrate the concatenation of the circuit of FIG. 28 and subtracter D30 of FIG. 27A for line 0, and FIGS. 30A and 30C for line 1, of x2−a1 mod(5).
Figure 30B:
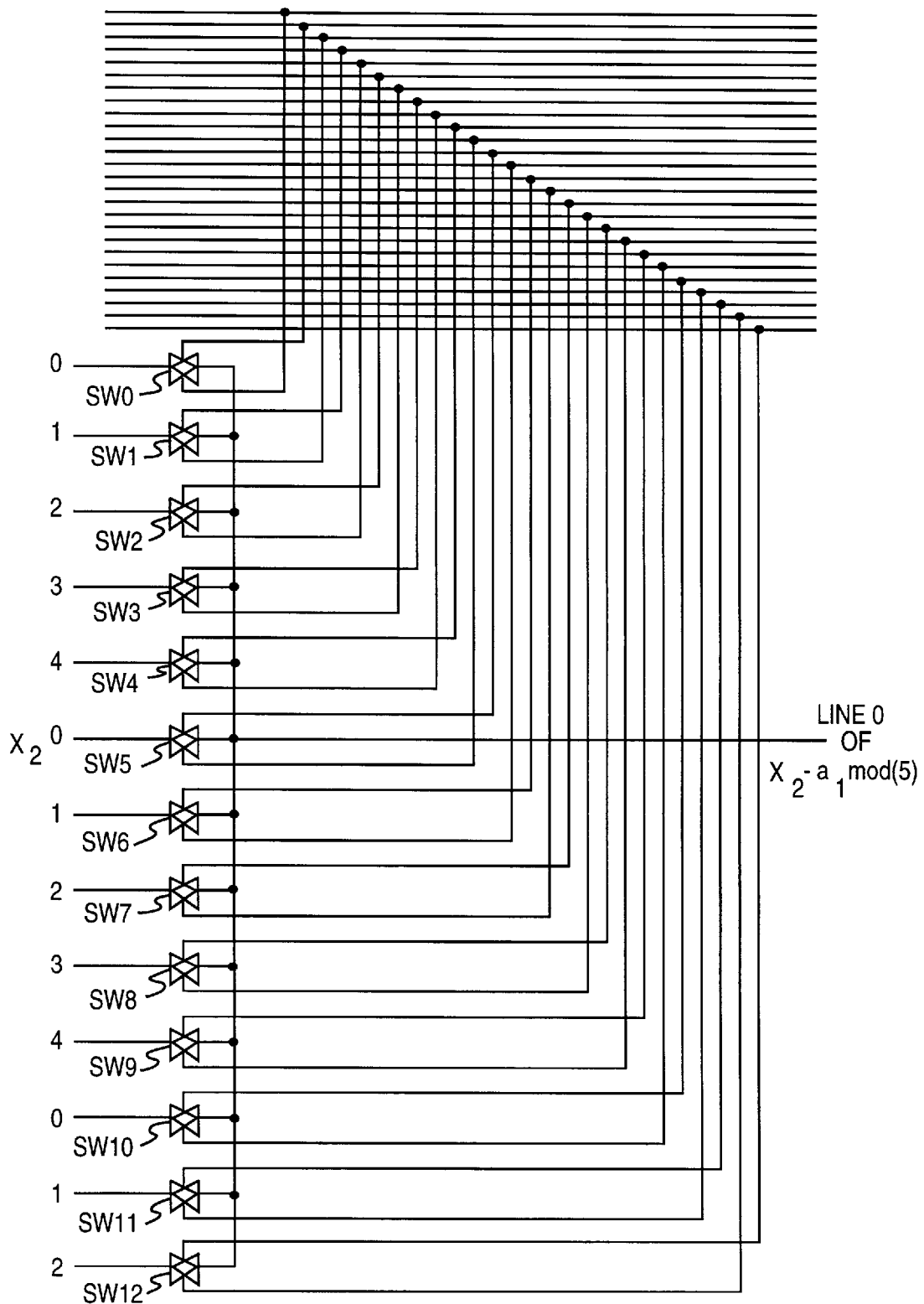
Figure 30C:
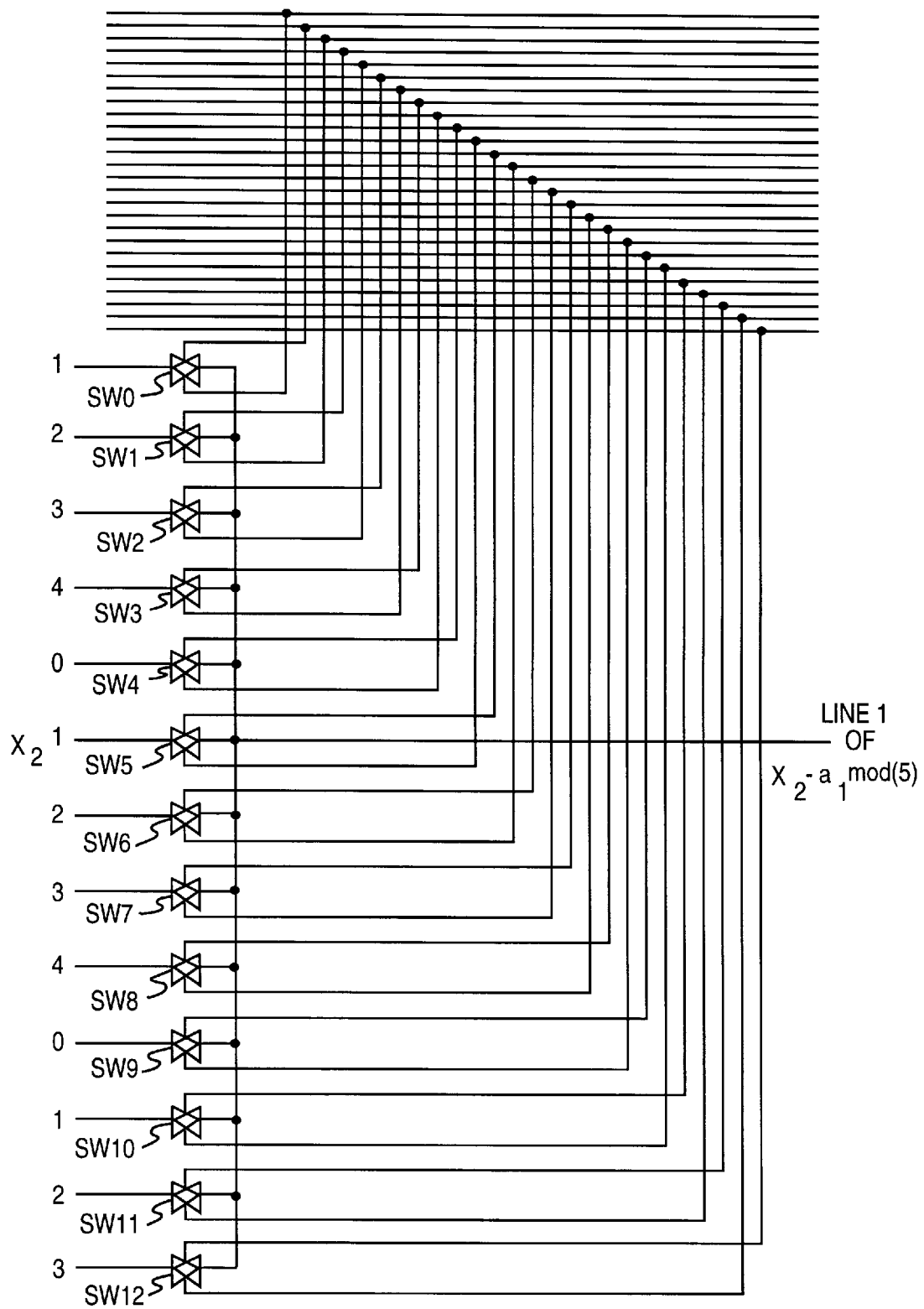

The circuits of FIGS. 28 and 29 achieve the desired modulus conversion, but inject a switching (gating) delay, as do the subtractors which immediately follow the change in modulus. One of these two delays may be eliminated by combining these two functions. For instance, the circuit of FIG. 28 can be combined with the subtractor as shown in FIGS. 30A and 30B for output line 0 and FIGS. 30A and 30C for output line 1 of $x_2-a_1$ mod(5). Here all 13 lines of the mod(13) signal are used as the input to the subtractor D30, with the output of the 13 switches being combined to provide the mod(5) result.

To find $X'=(X-a_1)/m_1$, one needs to divide by $m_1$, or alternatively, to multiply by the multiplicative inverse of $m_1$. The multiplicative inverses used in FIG. 27A are listed in Table D10 below.

TABLE D10

| | Modulus of digit | | | |
|---|---|---|---|---|
| | 5 | 7 | 11 | 2 |
| $13^{-1}$ | 2 | 6 | 6 | 1 |
| $5^{-1}$ | | 3 | 9 | 1 |
| $7^{-1}$ | | | 8 | 1 |
| $11^{-1}$ | | | | 1 |

Multiplication by a constant, including multiplicative inverses, is as previously shown, merely a renaming (typically a rerouting also) of the lines. This is indicated by the multiplication (renaming or rerouting) circuits D38, D40, D42 and D44 (as well as the other multiplication circuits represented by the square boxes) of FIG. 27A. Now that X' is known, $a_2=x_2'$.

To find $X''=(X'-a_2)/m_2$, the next row of subtractors D46, D48 and D50 subtract the value of $a_2$ from the remaining three RNS the $x_2$ digit has a modulus smaller than the moduli the next two digits, $a_2$ can be subtracted directly from the next two digits by an RNS subtractor by tying any additional lines required to ground (low) as shown in Table D11 below. Circuits of this general type for converting a one-hot RNS signal of one modulus to a one-hot RNS signal of a larger modulus in FIG. 27A are also indicated by the symbol shown in FIG. 27B.

TABLE D11

| line numbers | $a_2$ lines | $x_3$ lines | $x_4$ lines | $x_5$ lines |
|---|---|---|---|---|
| 0 | 0 | 0 | 0 | 0 |
| 1 | 1 | 1 | 1 | 1 |
| 2 | 2 | 2 | 2 | 0 |
| 3 | 3 | 3 | 3 | 1 |
| 4 | 4 | 4 | 4 | 0 |
| 5 | | low | low | |
| 6 | | low | low | |
| 7 | | | low | |
| 8 | | | low | |
| 9 | | | low | |
| 10 | | | low | |

Not again, a number of lines of one input to the subtractors are always low. If these inputs are used as the B inputs to the subtractors (see FIG. 14), the subtractor circuits can be substantially simplified because the corresponding switches of the subtractors are always off, allowing the elimination of all such switches and all lines to and from such switches.

The output of the subtractors D46, D48 and D50 are an $x_3$, $x_4$, $x_5$ RNS presentation of the natural number X as rounded down as necessary and divided by 13 and as further rounded down as necessary to be further divisible by the natural number 5. Again the subtraction of the value of $a_2$ from the remaining one-hot RNS digits has reduced the value of the $x_2$ RNS digit to zero. The $X_2$ digit is again dropped. The division by 5 is now accomplished by multiplying by the multiplicative inverses of 5, or $5^{-1}$ by the renaming of lines in multipliers D52, D54 and D56.

$a_4$ may be found by subtracting $a_3$ from the other two RNS digits and then multiplying by $7^{-1}$ as follows. Since the modulus of $a_3$ (7) is smaller than the modulus of the $a_4$ (11), the 7 lines of $a_3$ may be applied to adder/subtractor D58 directly while the last input lines of the $a_3$ input of adder/subtractor D58 are held low. For the corresponding input to adder/subtractor D60, the one-hot lines for $a_3$, 0 through 6, may first be ORed in a manner similar to that shown in FIG. 29 to bring the 7 lines to a mod(2) signal (2 lines), or logically equivalent, additional switches could be added to the adder/subtractor. The result of the subtraction is then multiplied by the multiplicative inverses $7^{-1}$ by multipliers D62 and D64 to provide $a_4$ which, when converted to modulo 2, subtracted from the output of multiplier D64 by adder/subtractor D66 and multiplied by the multiplicative inverse $11^{-1}$ by multiplier D68, provides $a_5$. Note, however, that $x_5$ ranges from 0 to 1, whereas $a_5$ ranges from $-1$ to 0. Thus, the one-hot 0 line of as is interpreted as the one-hot zero line, whereas the second $a_5$ line is really the $-1$ one-hot line of $a_5$.

The circuit of FIG. 27A as well as other circuits realized in accordance with the present invention may provide an undesired delay because of the series of operations occurring, acceptable at low clock rates, but limiting if high clock rates are required. Accordingly, in this and other circuits, it may be desirable to provide one or more levels of pipelining to allow operation at much higher clock rates.

Now consider the problem of scaling in the RNS one-hot system of the present invention. Scaling involves the division of a number X by a constant, and in the preferred embodiment of the present invention, is based on the application of AMR representations of the numbers involved. As described above, the determination of the AMR digits of an AMR representation of a number from its one-hot RNS representation uses the division, in one-hot RNS form, of various terms by the respective moduli ($X'=(X-a_1)/m_1$, $X''=(X'-a_2)/m_2$, etc.), division in the one-hot RNS system of the present invention having been previously described.

There are two possible scaling factors: either the factor is equal to one of the moduli (or the product of two or more moduli) in the RNS system, or it's not. If it is not equal to a modulus (or the product of two or more moduli), there is no way of knowing ahead of time how much to round the RNS number to make it divisible by the scaling factor. Thus, a modulus (or two or more moduli) must be created equal to the scaling factor to determine the rounding factor. As an example, if it is desired to scale down (divide) by 4, first find the value of the natural number modulo 4 (a new RNS digit) and subtract the remainder (the value of the new digit) 0, 1, 2, or 3 from each RNS digit to get the respective natural number to an integer multiple of 4.

If the scaling factor is equal to an existing modulus, then the rounding factor is known. Once rounded, the value of the RNS digit equal to the rounding factor becomes zero. This digit will disappear after the division. Even though the value of the RNS digit equal to the rounding factor becomes zero and effectively disappears, division can proceed on the other moduli and the answer will be correct and unique, since although the dynamic range has been reduced by the scaling factor, the dynamic range of the scaled number has been reduced by the same amount and fits in the new RNS range. Now recreating the modulus that disappeared can restore the original dynamic range.

In either case the key to the division problem is to create another RNS digit from the existing (or remaining) RNS digits, either; (1) before division if the divisor is not equal to a preexisting modulus or a product of two or more moduli to be able to round the natural number up or down to assure that the divisor divides evenly into the dividend, or (2), after division if the divisor is equal to a preexisting modulus or a product of two or more moduli to recreate the modulus or moduli lost in the division. This is done using a method called "Base Extension" previously described in the prior art section, not now unique in itself, but unique when used in conjunction with the one-hot RNS system of the present invention.

Figure 31:
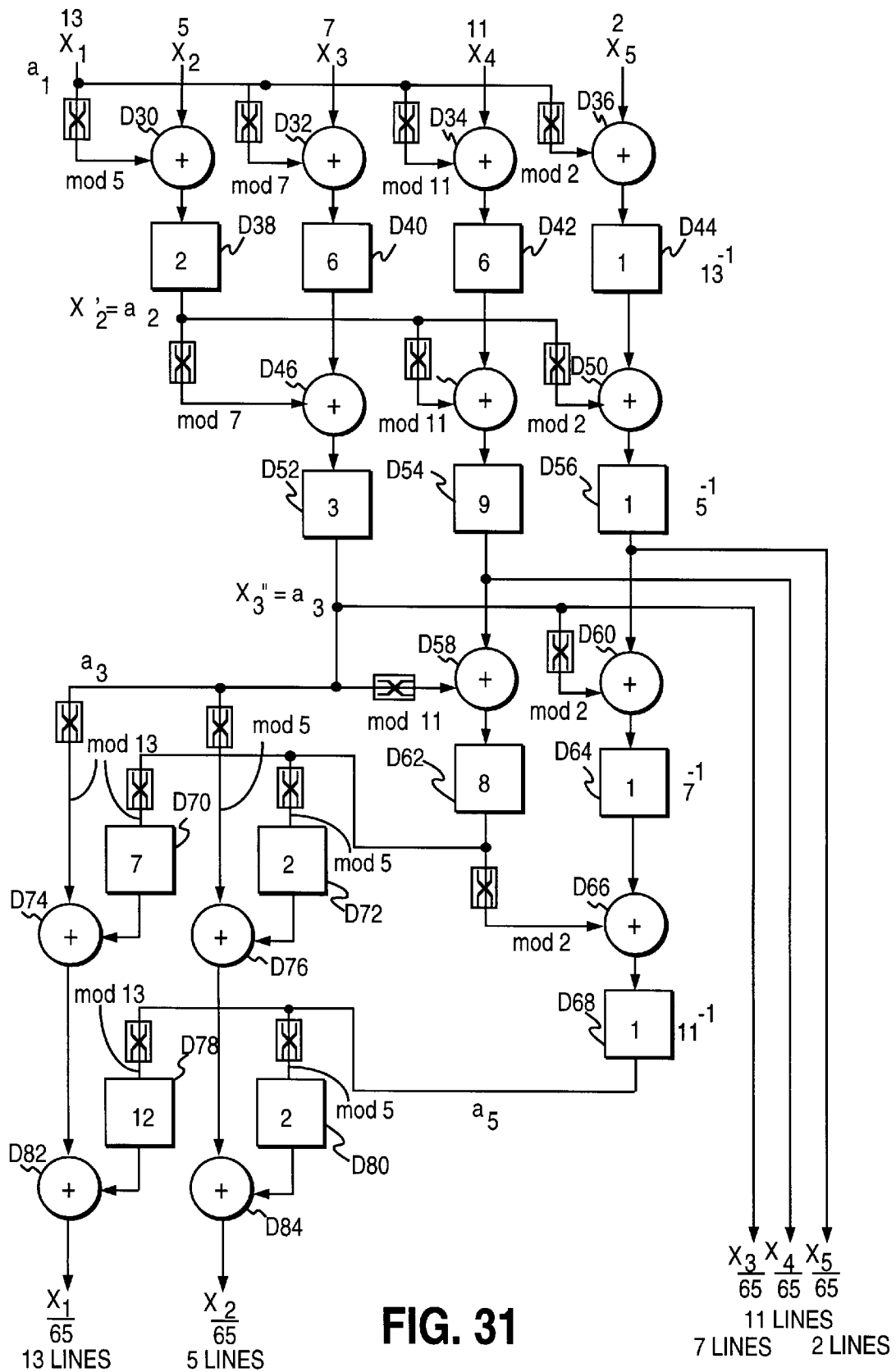
FIG. 31 is a block diagram for a scaler and for the recreation of the RNS digits lost in the scaling in a one-hot RNS system.

FIG. 31 presents a circuit in block diagram form for a scaler in a 13,5,7,11,2 RNS system, where the scale factor is 5*13=65. The circuit of FIG. 31 eliminates the moduli 5 and 13 digits, and also recreates these digits to reestablish the full range of the 13,5,7,11,2 RNS system. The remaining three RNS digits of the result are available as the outputs of multipliers D52, D54 and D56. The circuit of FIG. 31 is similar to the circuit of FIG. 27A, and is used to find $a_1$ through $a_5$ of the AMR representation of the number.

Now having $a_3$, $a_4$ and $a_5$, the foregoing equations are used to recreate $x_1/65$ and $X_2/65$ lost in the scaling:

$$x_1/65 = ((a_3) \bmod(13) + (a_4*7) \bmod(13) + (a_5*7*11) \bmod(13)) \bmod(13)$$

$$x_2/65 = ((a_3) \bmod(5) + (a_4*7) \bmod(5) + (a_5*7*11) \bmod(5)) \bmod(5)$$

$a_3 \bmod(13)$ in one-hot form is provided as one input to adder/subtractor D74, the other input of adder/subtractor D74 being $a_4 \bmod(13)$ multiplied by 7. $a_4$ may have one-hot RNS values ranging from 0 to 10, which when multiplied by 7, gives values ranging from 0 to 70 mod(13) as the respective input to adder/subtractor D74. The remaining one-hot lines for the input to adder/subtractor D74 are tied low. For the respective input to adder/subtractor D76, note that $(a_4*7) \bmod(5) = (a_4*5) \bmod(5) + (a_4*2) \bmod(5) = (a_4*2) \bmod(5)$. Thus $a_4$ is multiplied by 2 by multiplier D72. Also the conversion of $a_4$ from a mod(11) one-hot RNS signal to a mod(5) one-hot RNS signal may be done using a circuit similar to those shown in FIGS. 28 and 29.

To complete the recreation of the RNS digits lost in dividing by 65, the outputs of adder/subtractors D74 and D76, representing $(a_3) \bmod(13) + (a_4*7) \bmod(13)$ and $(a_3) \bmod(5) + (a_4*7) \bmod(5)$, are coupled to one input of adder/subtractors D82 and D84 respectively, with the second inputs to the adder/subtractors being $(a_5*7*11) \bmod(13)$ and $(a_5*7*11) \bmod(5)$. Care must be taken to properly interpret $a_5$, depending on the range of X. In the first interpretation (positive range of X only), $a_5$ can have values of 0 or +1. Here $a_5 \bmod(5)$ and $a_5 \bmod(13)$ are both equal to $a_5$, or 0 or +1 respectively. In the second interpretation, wherein X has both positive and negative values, $a_5$ can have values of 0 and −1. Now $a_5 \bmod(5)$ and $a_5 \bmod(13)$ is 0 if $a_5$ is 0, but if $a_5$ is −1, then $a_5 \bmod(5)$ is 4 and $a_5 \bmod(13)$ is 12. Thus the renaming of the 2 one-hot RNS lines for $a_5$ prior to inputting the same to multipliers D78 and D80 is different for the cases where X has a positive range only and where X has a positive and negative range.

Finally, for the value to multiply by in multipliers D78 and D80, note that $(a_5*7*11) \bmod(13) = (a_5*77) \bmod(13) = (a_5*65) \bmod(13) + (a_5*12) \bmod(13) = (a_5*12) \bmod(13)$, and $(a_5*7*11) \bmod(5) = (a_5*77) \bmod(5) = (a_5*75) \bmod(5) + (a_5*2) \bmod(5) = (a_5*2) \bmod(5)$. Thus the output of adder/subtractors D82 and D84, already modulo 13 and 5 respectively, are $x_1/65$ and $x_2/65$.

Having now described various basic operations in the present invention one-hot RNS system, it will be apparent that other operations may be executed using combinations of the operations described. For instance, the absolute value of X in one-hot RNS form may be found by first determining if X is positive or negative as already described, and if negative, multiplying X by −1, again in one-hot RNS form. Similarly, to compare two numbers X and Y in one-hot RNS form, the two numbers X and Y may be subtracted in one-hot RNS form and then the sign of the difference (X−Y) may be determined as previously described, and/or a zero result detected by detection of all "0" lines of the one-hot RNS representation of the result being high.

To convert from the one-hot RNS system of the present invention to binary, the one-hot RNS representation of a number X is used to determine, still in a one-hot system, the values of $a_n$ in the AMR representation of X:

$$X = a_1 + a_2*m_1 + a_3*(m_1*m_2) + \ldots + a_{N-1}*(m_1*m_2* \ldots *m_{N-2}) + a_N*(m_1*m_2* \ldots *m_{N-2}*m_{N-1})$$

While the various values of an are variables, the moduli are all predetermined (known). Thus the equation for x becomes:

$$X = a_1 + a_2*c_1 + a_3*c_2 + \ldots + a_{N-1}*c_{N-2} + a_N*c_{N-1}$$

where: $c_1$, $c_2$, etc. are predetermined (known) constants

The determination of the various values of an in one-hot form from a one-hot RNS representation of a number has already been described with respect to FIG. 27A. Given the various values of $a_n$ in one-hot form, note that they are equivalent to fully decoded values of binary representations of $a_n$. As such, a very convenient way of finally converting to binary is to use each value of $a_n$ in one-hot form as a decoded address to enter an associated lookup table (LUT) on chip (which may be a ROM), each programmed to output $a_n*c_{n-1}$ in binary form when addressed with $a_n$. These outputs are added together with a standard binary adder. This is illustrated in FIG. 32.

With respect to FIG. 32 and the related equations, note that the number of entries (addresses) needed for each lookup table (LUT) depends on the associated value of the modulus in the one-hot RNS representation of X, but in any event each lookup table will be relatively small. Also note that $c_0 = 1$ will be the lowest or smallest constant, whereas $c_{N-1}$ will be the largest. While the maximum possible values of each of the variables $a_1$ through $a_N$ will depend on the respective moduli in the one-hot RNS system, $a_N*c_{N-1}$ will be much larger than $a_1$, so that the Lookup table output for $a_N*c_{N-1}$ will be much wider (more bits) than for $a_1$. Still, the width of the required output for the widest lookup table output will be quite reasonable, as is the required width of the binary adder (or cascaded adders), so that full width lookup tables and binary adder is preferred for speed, even though the output of the binary adder may then be read out in other than full parallel form, such as bit or byte serial form. By way of example, in the 13,5,7,11,2 RNS system used with respect to the explanation of FIG. 27A, the total range of the system is 13*5*7*11*2=10,010 decimal. In binary form, this only requires an adder 13 bits wide plus a carry bit. Assuming an all positive range, the Nth lookup table would need to accommodate, in binary form, an output of 13*5*7*11=5005, which would require a binary output width of 13 bits, though only require two entries, 0 and +5005 in binary form (1001110001101). Assuming a positive and negative range, then the Nth lookup table would need to accommodate 0 and −5005 in 14 bit two's complement binary form (10110001110011).

When converting from RNS to binary, the resulting resolution may be excessive, in which case the conversion may be truncated. To this end, when expressing X in the AMR representation form:

$$X = a_1 + \ldots + a_n*c_{n-1} + \ldots + a_N*c_{N-1},$$

only the terms from some value of n>1 in the AMR representation of X need be included in the conversion to the binary representation of X.

As described above, the adaptive equalizer C103 and interpolated timing recovery B100 of FIG. 3 comprise an RNS FIR filter for filtering the RNS sample values. The RNS FIR filter in the adaptive equalizer C103 is preferably implemented according to a transposed direct form as shown in FIG. 33 which illustrates a 4-tap RNS FIR filter with binary input and binary output, but with a one-hot RNS interior. The various elements of the diagram are labeled at the lower right of the figure. While each RNS digit processing leg is comprised of the same elements (binary to one-hot RNS converters for the filter input and coefficients, multipliers, and adders), the corresponding detailed one-hot RNS circuits are not identical, in that each leg is for a different one-hot RNS digit, and thus is of a different modulus (different numbers of one-hot lines). The equation for the response of the filter of FIG. 33 is:

$$Y_{out}=(c_4+c_3*Z^{-1}+c_2*Z^{-2}+c_1*Z^{-3})X_{in}$$

FIG. 33 shows that the output of the example RNS FIR filter is converted back to binary form. However, in the sampled amplitude read channel of the present invention, the RNS format at the output of the adaptive equalizer C103 is retained for further processing by the RNS FIR filter in interpolated timing recovery B100 as shown in FIG. 3.

Figure 34:
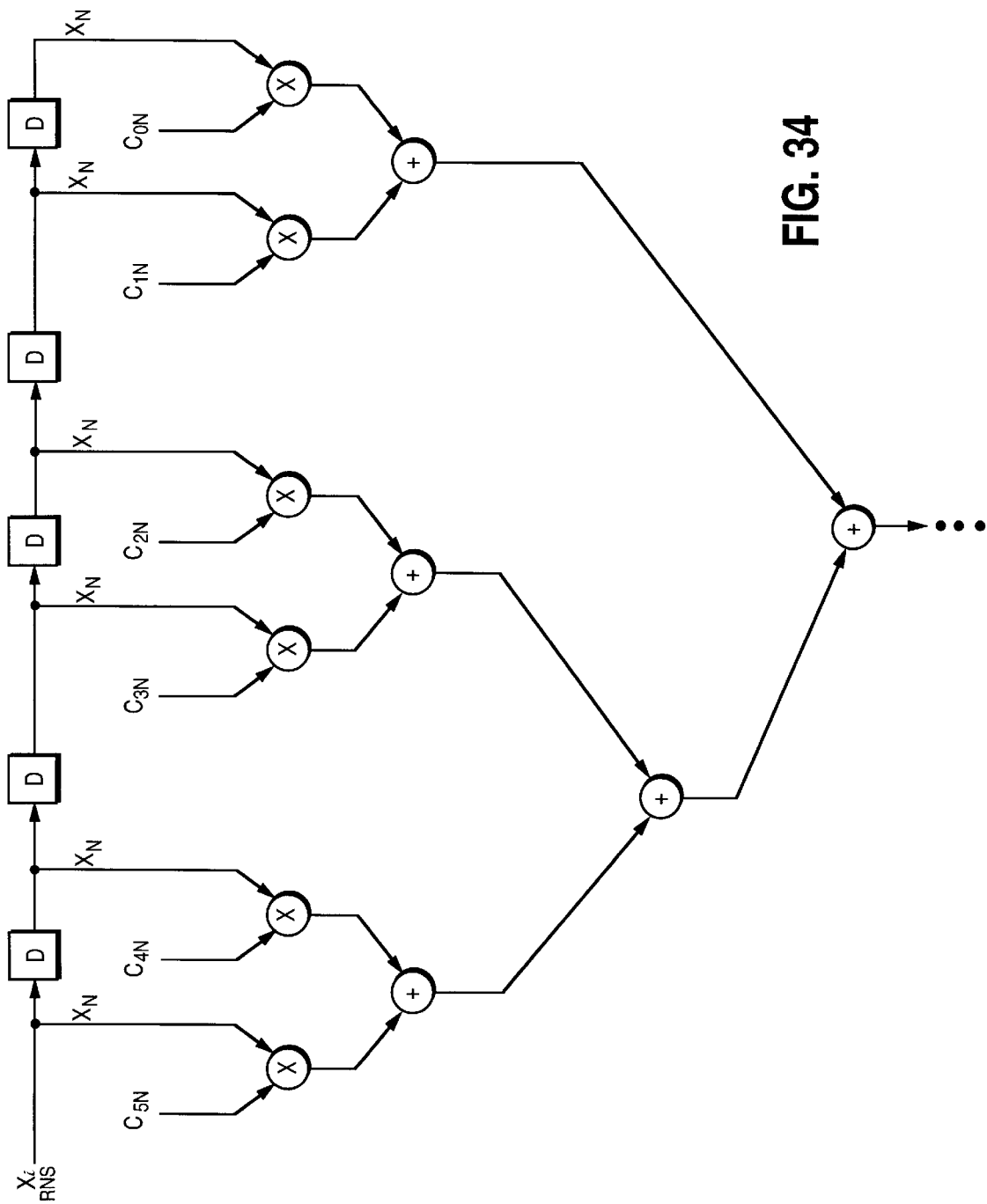
FIG. 34 shows part of an adder tree used to implement an RNS FIR filter in a direct form.

Because the interpolated timing recovery RNS FIR filter is time varying (i.e., the coefficients vary depending on the value of the interpolation interval $\tau$), this FIR filter is preferably implemented in a direct form as shown in FIG. 6 or a factored direct form as shown in FIG. 7. Similar to the FIR filter of FIG. 33, the multipliers and adders operate on the individual digits of the RNS sample values and RNS filter coefficients as shown in FIG. 34. Also shown in FIG. 34, the multiple input adders (e.g., adder B254 of FIG. 6) are implemented using an adder tree. In contrast to the adaptive equalizer C103, the coefficients of the timing recovery RNS filter can be stored directly in an RNS representation (e.g., in the RNS coefficient register file B252 of FIG. 6) rather than convert the coefficients from binary to RNS. Note that the factored direct form of the FIR filter as shown in FIG. 7 has the disadvantage in that the RNS numbers must be rescaled after each multiply operation (i.e., it requires a scaler circuit at the output of each multiplier).

Implementing the FIR filters in RNS provides minimum power dissipation due to the very limited number of signal transitions for a given computation, and the absence of multiple transitions associated with "ripple-through" in binary adders when performing addition, subtraction and multiplication operations. Note that line drivers may be required or desirable at one or more locations along a particular line, and/or some level of pipelining may be preferable to break up line capacitances and other sources of delay, and thereby allow higher clock speeds if needed.

A draw back of one-hot RNS systems is inefficiency in terms of chip area, but the simplicity of the operational blocks under such a scheme results in small loading of the lines, in some cases no loading at all, which in turn minimizes power dissipation and maximizes speed. Also, while the preferred embodiments of the present invention use a multidigit RNS number system in a one-hot physical representation of each digit, it should be recognized that a one-cold system could alternatively be used, or for that matter, each line of each digit could have its own state definitions. However, the one-hot arrangement described herein is preferred as a logical state assignment.

Although the interpolated timing recovery and adaptive equalizer of the present invention have been disclosed in relation to a d=0 PR4 read channel, the principles disclosed herein are equally applicable to other types of sampled amplitude read channels including d=1 EPR4 or EEPR4 read channels. In a d=1 read channel, for example, the slicer B141 of FIG. B4A is replaced by a pulse detector as described in U.S. Pat. No. 5,329,554 entitled "Digital Pulse Detector."

Furthermore, the particular constraint frequency of 1/4Ts used in the disclosed embodiment is not intended to be limiting. Other constraint frequencies could be used without departing from the scope of the present invention. For example, a 3T preamble could be used in which case the constraint frequency would be 1/6Ts (if constraining to the preamble frequency).

Still further, those skilled in the art will appreciate the many obvious modifications that are possible to the adaptive equations disclosed herein. For example, a shift in the time base would change the FIR filter's magnitude and phase response at the constraint frequency which would result in different $V_1$ and $V_2$ matrices. Also, the modified LMS algorithm, $$W_{k+1}W_k-\mu \cdot Pv_1v_2^{\perp} \cdot (X_k e_k)$$

could be implemented after rearranging terms, $$W_{k+1}=W_k-\mu \cdot e_k \cdot (Pv_1v_2^{\perp} \cdot e_k)$$

or $$W_{k+1}=W_k-\mu \cdot X_k \cdot (Pv_1v_2^{\perp} \cdot e_k).$$

These, and like modifcations, are within the scope of the present invention.

The objects of the invention have been fully realized through the embodiments disclosed herein. Those skilled in the art will appreciate that the various aspects of the invention can be achieved through different embodiments without departing from the essential function. The particular embodiments disclosed are illustrative and not meant to limit the scope of the invention as appropriately construed by the following claims.

We claim:

1. A sampled amplitude read channel for reading data from a sequence of discrete time sample values generated by sampling an analog read signal from a read head positioned over a storage medium, comprising:

(a) a sampling device for sampling the analog read signal to generate the discrete time sample values;

(b) an adaptive equalizer comprising a residue number system (RNS) FIR filter, responsive to the discrete time sample values, for generating equalized sample values according to a target response, the adaptive equalizer comprising:

(i) a coefficient input for receiving a plurality of RNS coefficients;

(ii) a RNS-to-binary converter for converting the RNS coefficients to binary coefficients;

(iii) a coefficient adaptor, responsive to the binary coefficients, for computing updated binary coefficients; and (iv) a binary-to-RNS converter for converting the updated binary coefficients to updated RNS coefficients;

the adaptive equalizer thereby generates the equalized sample values;

(c) timing recovery, responsive to the equalized sample values, for generating synchronous sample values; and (d) a discrete time sequence detector for detecting the data from the synchronous sample values.

2. The sampled amplitude read channel as recited in claim 1, further comprising:

(a) a binary-to-RNS converter for converting the discrete time sample values from a binary representation into a residue number system representation; and (b) a RNS-to-binary converter for converting the equalized sample values from a residue number system representation into a binary representation.

3. The sampled amplitude read channel as recited in claim 1, wherein the residue number system (RNS) FIR filter comprises "one-hot" encoding circuitry.

4. The sampled amplitude read channel as recited in claim 1, wherein the timing recovery comprises an RNS interpolation FIR filter.

5. The sampled amplitude read channel as recited in claim 4, wherein the RNS interpolation FIR filter comprises "one-hot" encoding circuitry.

6. A sampled amplitude read channel for reading data from a sequence of discrete time sample values generated by sampling an analog read signal from a read head positioned over a storage medium, comprising:

(a) a sampling device for sampling the analog read signal to generate the discrete time sample values;

(b) an adaptive equalizer comprising a first residue number system (RNS) FIR filter, responsive to the discrete time sample values, for generating equalized sample values according to a target response, the adaptive equalizer comprising a coefficient input for receiving plurality of RNS coefficients;

(c) interpolated timing recovery comprising a second RNS FIR filter for generating synchronous RNS sample values;

(d) a coefficient adaptor comprising:
  (i) a RNS-to-binary converter for converting the synchronous RNS sample values to synchronous binary sample values, and for converting the RNS coefficients to binary coefficients;
  (ii) a coefficient updater, responsive to the synchronous binary sample values and the binary coefficients, for computing updated binary coefficients; and
  (iii) a binary-to-RNS converter for converting the updated binary coefficients to updated RNS coefficients; and (e) a discrete time sequence detector for detecting the data from the synchronous binary sample values.

7. The sampled amplitude read channel as recited in claim 6, further comprising
a binary-to-RNS converter for converting the discrete time sample values from a binary representation into a residue number system representation.

8. The sampled amplitude read channel as recited in claim 6, wherein the first residue number system (RNS) FIR filter comprises "one-hot" encoding circuitry.

9. The sampled amplitude read channel as recited in claim 6, wherein the second RNS FIR filter comprises "one-hot" encoding circuitry.

10. A sampled amplitude read channel for reading data from a sequence of discrete time sample values generated by sampling an analog read signal from a read head positioned over a storage medium, comprising:

(a) a residue number system (RNS) equalization filter, responsive to the discrete time sample values, for generating equalized RNS sample values according to a target response;

(b) an RNS scaler for scaling the equalized RNS sample values by a predetermined scaler value to thereby generate scaled RNS sample values;

(c) an RNS-to-binary converter for converting the scaled RNS sample values to binary sample values; and (d) a discrete time sequence detector for detecting the data from the binary sample values.

11. The sampled amplitude read channel as recited in claim 10, wherein the RNS equalization filter comprises "one-hot" encoding circuitry.

12. The sampled amplitude read channel as recited in claim 10, further comprising timing recovery circuitry for generating synchronous sample values.

13. The sampled amplitude read channel as recited in claim 12, wherein the timing recovery circuitry comprises an RNS interpolation filter comprising "one-hot" encoding circuitry.

14. A sampled amplitude read channel for reading data from a sequence of discrete time sample values generated by sampling an analog read signal from a read head positioned over a storage medium, comprising:

(a) a binary-to-residue number system (RNS) converter for converting the discrete time sample values into RNS sample values, (b) an RNS equalizer, responsive to the RNS sample values, for generating equalized RNS sample values according to a target response;

(c) a first RNS scaler for scaling the equalized RNS sample values by a predetermined scaler value to thereby generate first scaled RNS sample values;

(d) an interpolated timing recovery circuit comprising an RNS interpolation filter for generating synchronous RNS sample values in response to the first scaled RNS sample values;

(e) a second RNS scaler for scaling the synchronous RNS sample values by a predetermined scaler value to thereby generate second scaled RNS sample values;

(f) an RNS-to-binary converter for converting the second scaled RNS sample values into binary sample values; and (g) a discrete time sequence detector for detecting the data from the binary sample values.

15. The sampled amplitude read channel as recited in claim 14, wherein the RNS interpolation filter comprises "one-hot" encoding circuitry.

16. The sampled amplitude read channel as recited in claim 14, wherein the RNS equalizer comprises "one-hot" encoding circuitry.

* * * * *